United States Patent
Tamagawa et al.

(10) Patent No.: US 9,627,110 B2
(45) Date of Patent: Apr. 18, 2017

(54) CHIP RESISTOR

(71) Applicants: Hiroshi Tamagawa, Kyoto (JP); Yasuhiro Kondo, Kyoto (JP)

(72) Inventors: Hiroshi Tamagawa, Kyoto (JP); Yasuhiro Kondo, Kyoto (JP)

(73) Assignee: ROHM CO., LTD., Kyoto (JP)

(*) Notice: Subject to any disclaimer, the term of this patent is extended or adjusted under 35 U.S.C. 154(b) by 139 days.

(21) Appl. No.: 14/369,599

(22) PCT Filed: Sep. 28, 2012

(86) PCT No.: PCT/JP2012/075027
§ 371 (c)(1),
(2) Date: Jun. 27, 2014

(87) PCT Pub. No.: WO2013/099379
PCT Pub. Date: Jul. 4, 2013

(65) Prior Publication Data
US 2014/0361865 A1   Dec. 11, 2014

(30) Foreign Application Priority Data

Dec. 28, 2011 (JP) ................. 2011-289283
Dec. 28, 2011 (JP) ................. 2011-289284
Sep. 24, 2012 (JP) ................. 2012-209936

(51) Int. Cl.
*H01C 10/50*   (2006.01)
*H01C 17/00*   (2006.01)
(Continued)

(52) U.S. Cl.
CPC ........... *H01C 10/50* (2013.01); *H01C 17/006* (2013.01); *H01C 17/23* (2013.01); *H01L 27/016* (2013.01);
(Continued)

(58) Field of Classification Search
CPC ...... H01C 10/50; H01C 17/006; H01C 17/23; H01L 27/016; H01L 28/24; H01L 27/0207
(Continued)

(56) References Cited

U.S. PATENT DOCUMENTS 5,352,923 A * 10/1994 Boyd .................. H01L 28/20
257/379
6,007,755 A   12/1999 Hoshii et al.
(Continued)

FOREIGN PATENT DOCUMENTS

CN   1140317 A   1/1997
CN   1409329 A   4/2003
(Continued)

*Primary Examiner* — Kyung Lee
(74) *Attorney, Agent, or Firm* — Rabin & Berdo, P.C.

(57) ABSTRACT

[Problem] There is demand for chip resistors that are compact and that have high resistivity. [Solution] A chip resistor (100) has a substrate (11), a first connection electrode (12) and a second connection electrode (13) that are formed on the substrate (11), and a resistor network that is formed on the substrate (11) and that has ends one of which is connected to the first connection electrode (12) and the other one of which is connected to the second connection electrode (13). The resistor network is provided with a resistive circuit. The resistive circuit has a resistive element film line (103) that is provided along inner wall surfaces of trenches (101). The resistive element film line (103) extending along the inner wall surfaces of the trenches (101) is long and has a high resistivity as a unit resistive element. [Effect] The resistivity of the chip resistor (100) as a whole can be increased.

16 Claims, 38 Drawing Sheets

(51) Int. Cl.
  *H01C 17/23* (2006.01)
  *H05K 3/34* (2006.01)
  *H01L 27/01* (2006.01)
  *H01L 49/02* (2006.01)
  *H01L 27/02* (2006.01)

(52) U.S. Cl.
  CPC ............ H01L 28/24 (2013.01); H05K 3/3442 (2013.01); *H01L 27/0207* (2013.01); *H05K 2201/10212* (2013.01); *Y02P 70/613* (2015.11)

(58) Field of Classification Search
  USPC ........................................................ 338/200
  See application file for complete search history.

(56) References Cited

U.S. PATENT DOCUMENTS

| | | | |
|---|---|---|---|
| 6,480,092 B1 | 11/2002 | Hoshii et al. | |
| 8,110,862 B2* | 2/2012 | Cheng | H01L 27/0682 257/301 |
| 8,232,146 B2* | 7/2012 | Kitajima | H01L 28/20 257/529 |
| 8,284,017 B2* | 10/2012 | Hakey | G06F 17/5045 257/327 |
| 2003/0062984 A1 | 4/2003 | Ito et al. | |
| 2007/0046421 A1* | 3/2007 | Gogineni | H01C 7/006 338/309 |
| 2008/0185678 A1* | 8/2008 | Kitajima | H01L 28/20 257/529 |
| 2009/0231087 A1* | 9/2009 | Hakey | H01C 3/12 338/311 |
| 2014/0111301 A1* | 4/2014 | Williams | H01L 28/24 338/308 |

FOREIGN PATENT DOCUMENTS

| | | |
|---|---|---|
| JP | S48-70896 A | 9/1973 |
| JP | H01-164001 A | 6/1989 |
| JP | H03-181103 A | 8/1991 |
| JP | H04-10601 A | 1/1992 |
| JP | H08-195479 A | 7/1996 |
| JP | H10-135016 A | 5/1998 |
| JP | 2001-076912 A | 3/2001 |
| JP | 2005-303051 A | 10/2005 |
| JP | 2009-231359 A | 10/2009 |

* cited by examiner

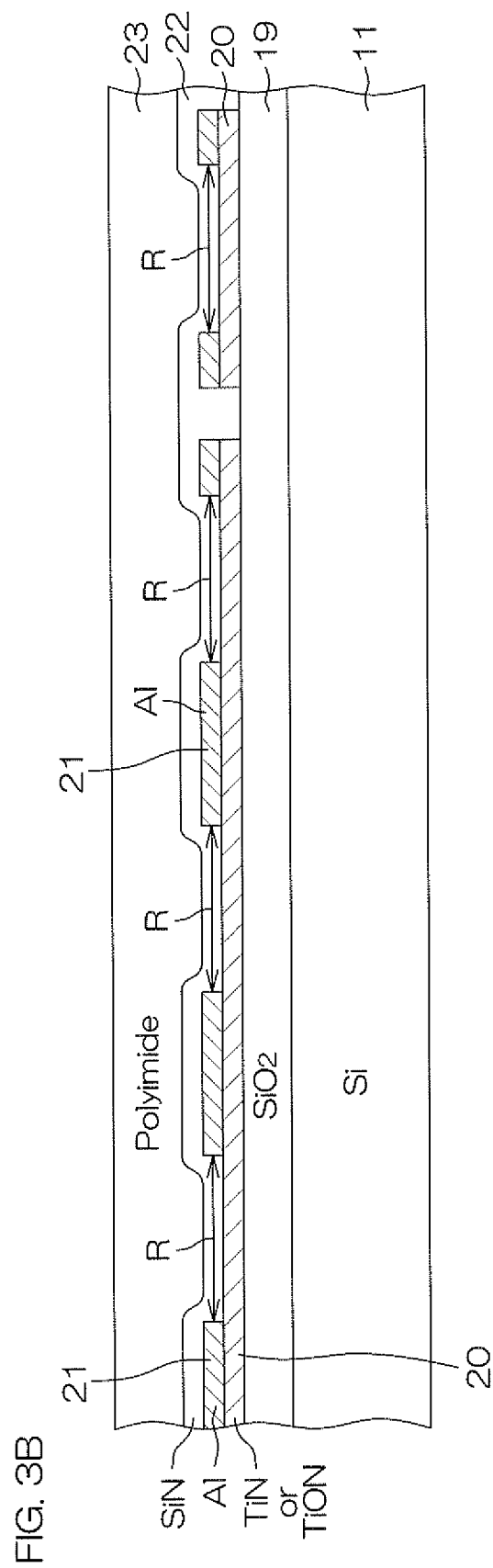

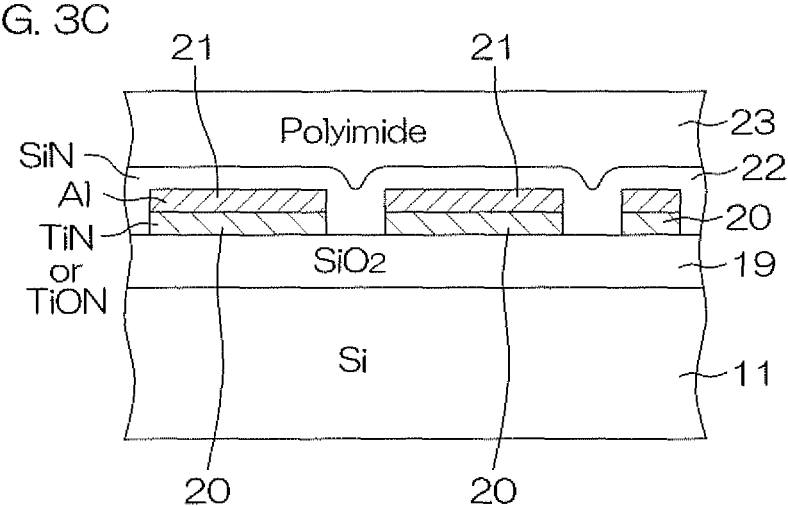

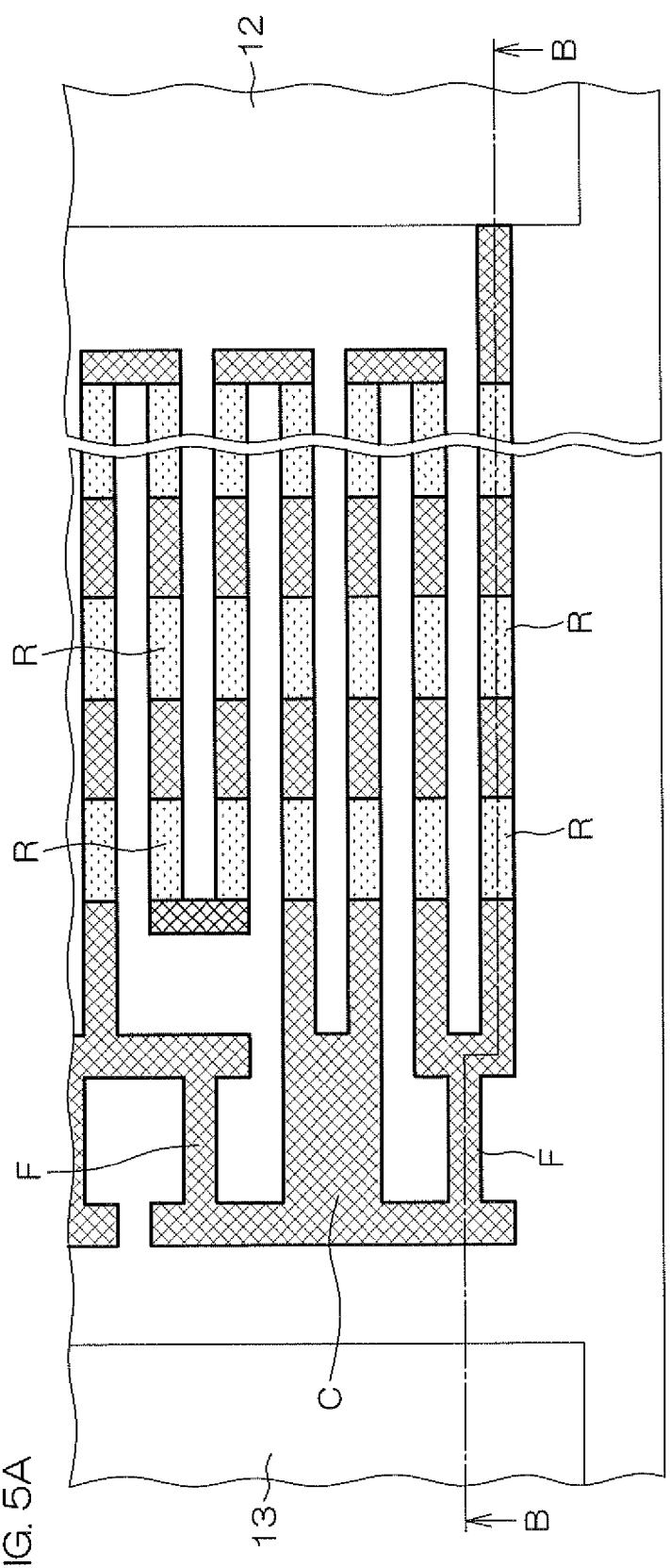
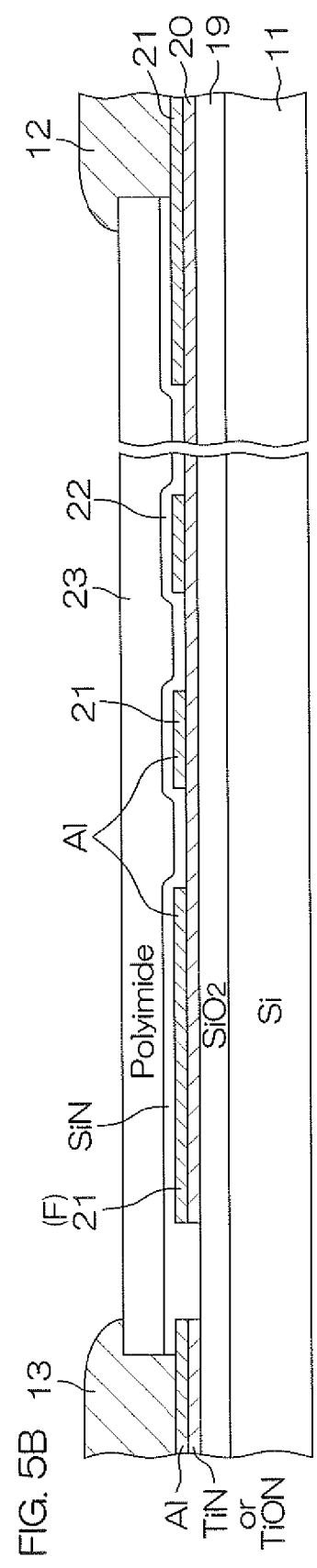
FIG. 5A
FIG. 5B

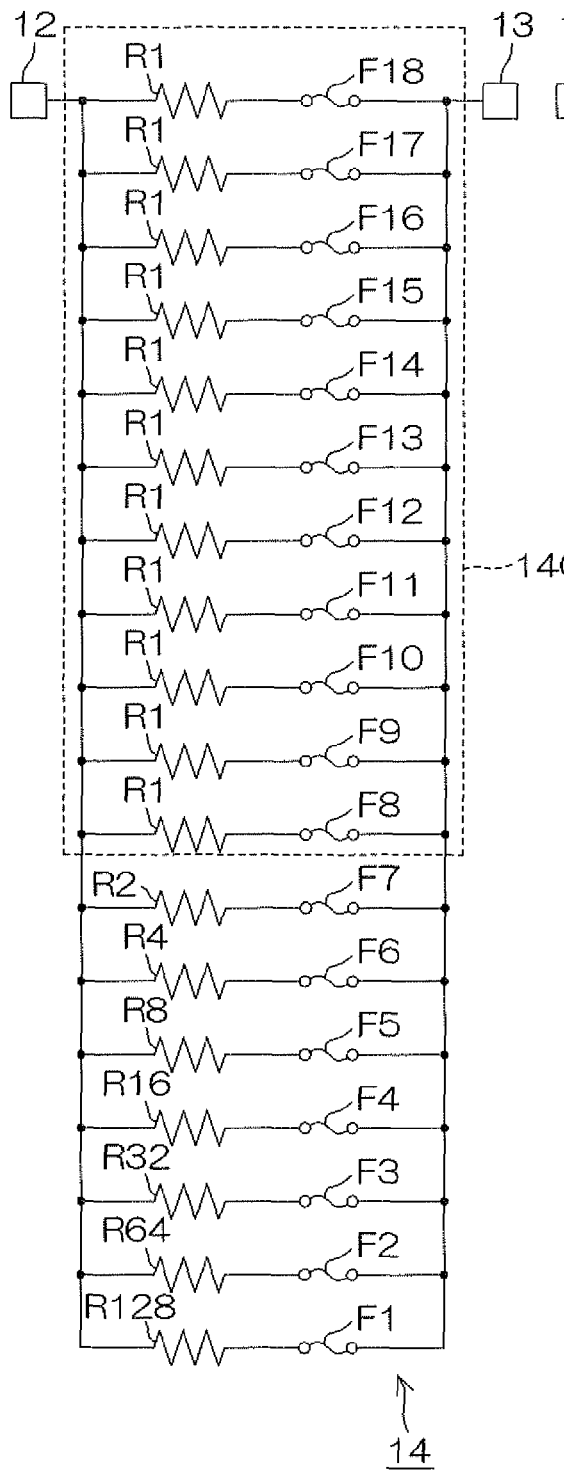
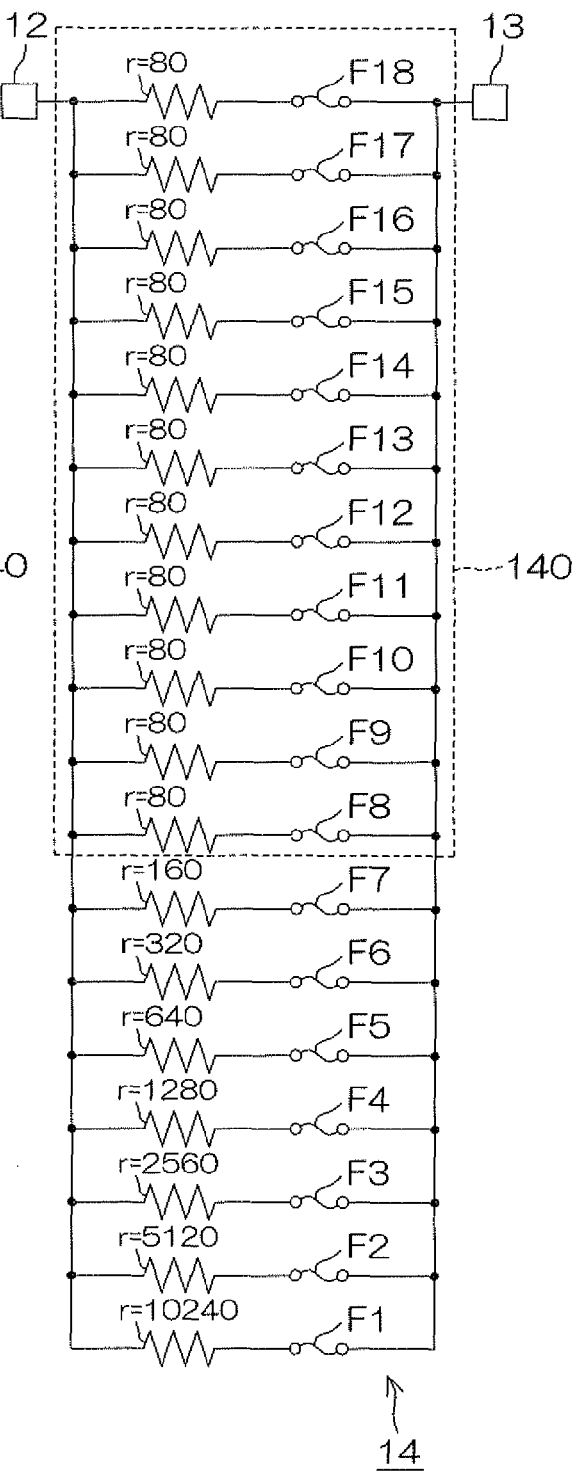
FIG. 11A
FIG. 11B

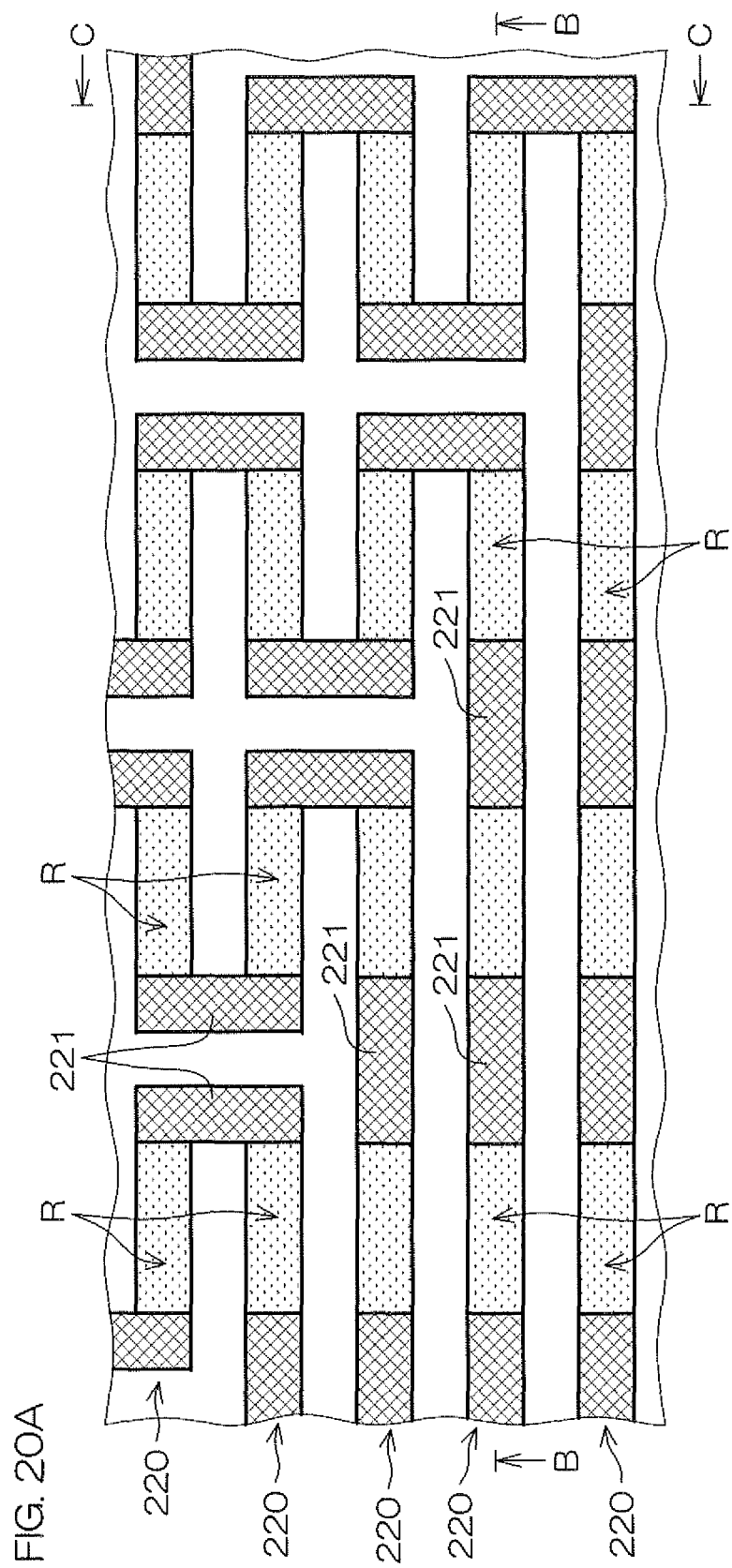

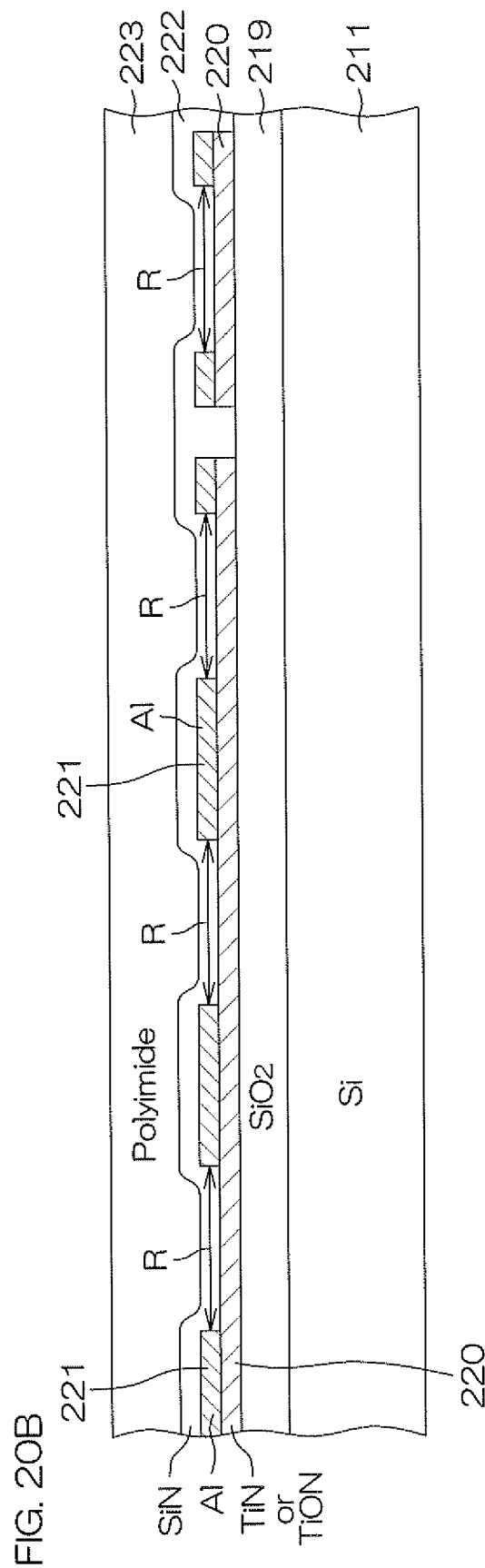

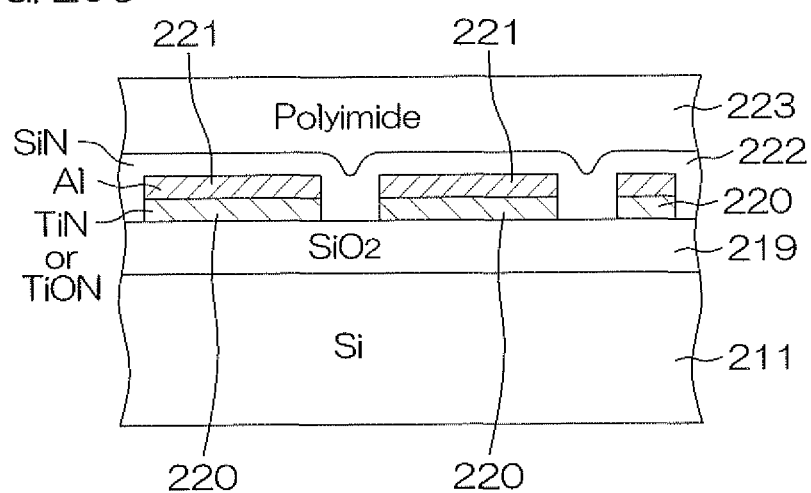

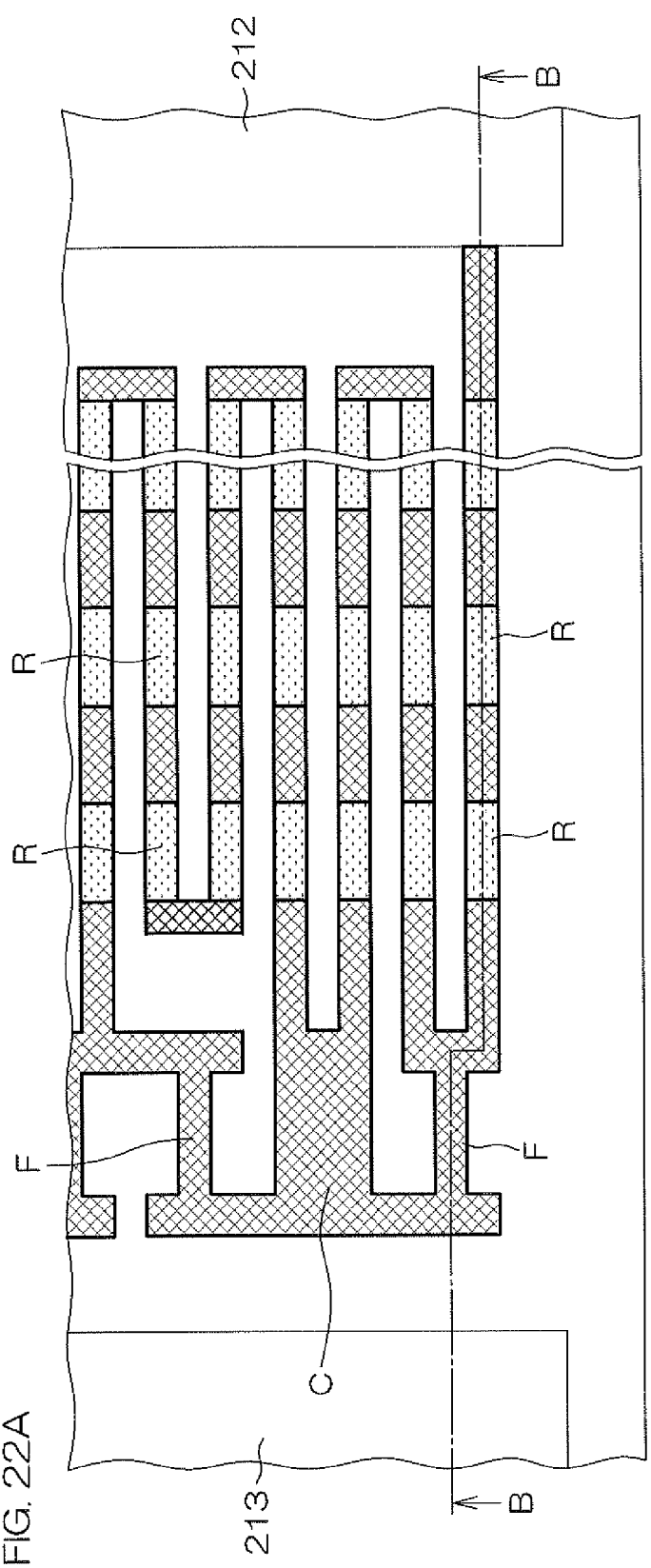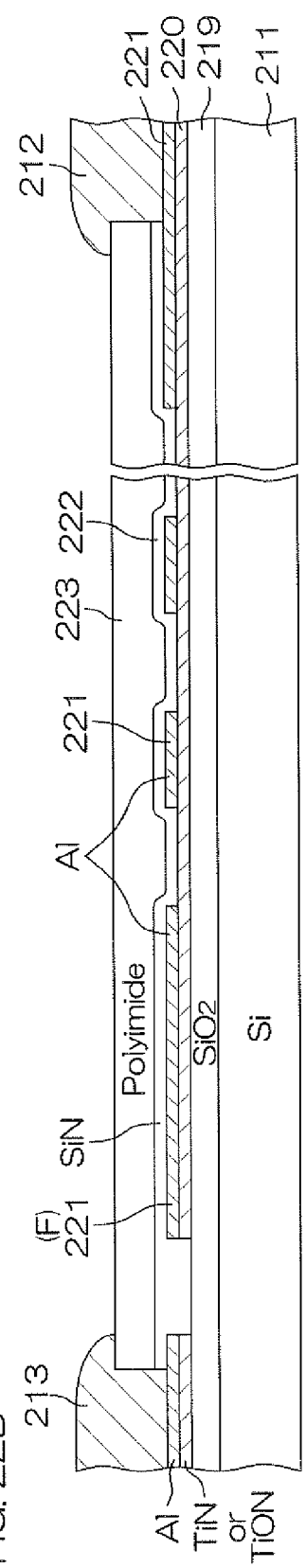
FIG. 22A
FIG. 22B

CHIP RESISTOR

TECHNICAL FIELD

The present invention relates to a chip resistor as a discrete component.

BACKGROUND ART

Heretofore, a chip resistor has been arranged to include an insulating substrate, such as a ceramic substrate, a resistance film formed by screen-printing a material paste onto its surface, and an electrode connected to the resistance film. Additionally, laser trimming in which a trimming groove is formed while irradiating the resistance film with a laser beam has been performed in order to allow a resistance value of the chip resistor to coincide with a target value (see Patent Literature 1).

CITATION LIST

Patent Literature

PTL 1: Japanese Unexamined Patent Publication No. 2001-76912

SUMMARY OF INVENTION

Technical Problem

The conventional chip resistor is adjusted by laser trimming so that a resistance value coincides with a target value, and therefore cannot meet a wide range of resistance values. Additionally, the chip resistor has been reduced in size year by year, and therefore it has been difficult for the chip resistor to have a high resistance value because restrictions are imposed on the arrangement area of the resistance film even if a high-resistance chip resistor is intended to be developed. The present invention has been made in consideration of these circumstances, and it is a main object of the present invention to provide a small-sized, high-resistance chip resistor.

Solution to Problem

The invention recited in claim 1 is a chip resistor comprising a substrate having a circuit forming surface, a first connection electrode and a second connection electrode that are formed on the substrate, and a resistor network that is formed on the substrate and that has ends one of which is connected to the first connection electrode and an opposite one of which is connected to the second connection electrode, wherein a trench dug down to a predetermined depth from a circuit forming surface of the substrate is formed at the circuit forming surface, and wherein the resistor network includes a resistive circuit that has a resistive element film disposed along an inner wall surface of the trench in such a manner as to traverse the trench.

The invention recited in claim 2 is the chip resistor according to claim 1, wherein the resistor network includes a plurality of resistive circuits, and further includes a fuse film that is fusible to electrically incorporate an arbitrary resistive circuit into the resistor network or that is fusible to electrically separate the arbitrary resistive circuit from the resistor network.

The invention recited in claim 3 is the chip resistor according to claim 1 or claim 2, wherein the resistive element film includes a line-shaped resistive element film line that has a constant width and that extends linearly.

The invention recited in claim 4 is the chip resistor according to any one of claim 1 to claim 3 further comprising the resistive element film extending from an inner surface of the trench to the circuit forming surface outside the trench and a wiring film that is formed contiguously with a part formed at the circuit forming surface in the resistive element film.

The invention recited in claim 5 is the chip resistor according to claim 3, wherein the trench extends in a predetermined direction when the circuit forming surface is viewed planarly, and the resistive element film includes a plurality of resistive element film lines arrayed in parallel that are disposed along the inner wall surface of the trench in such a manner as to traverse the trench and that extend in a direction perpendicular to a length direction in which the trench extends.

The invention recited in claim 6 is the chip resistor according to any one of claim 1 to claim 5, wherein the resistive element film is made of TiN or TiON or TiSiON.

The invention recited in claim 7 is a chip resistor comprising a substrate having a circuit forming surface, a first connection electrode and a second connection electrode that are formed on the substrate, and a resistor network that is formed on the substrate and that has ends one of which is connected to the first connection electrode and an opposite one of which is connected to the second connection electrode, the resistor network including a resistive circuit that is formed on the circuit forming surface of the substrate and that has a line-shaped resistive element film line extending linearly with a constant width.

The invention recited in claim 8 is the chip resistor according to claim 7, wherein the resistor network includes a plurality of resistive circuits, and further includes a fuse film that is fusible to electrically incorporate an arbitrary resistive circuit into the resistor network or that is fusible to electrically separate the arbitrary resistive circuit from the resistor network.

The invention recited in claim 9 is the chip resistor according to claim 7 or claim 8 further comprising a conductor film laid on the resistive element film line with a fixed interval in a line direction, wherein a part of the resistive element film line having the fixed interval on which the conductor film is not laid, forms a single unit resistive element.

The invention recited in claim 10 is the chip resistor according to claim 9, wherein the conductor film laid on the resistive element film line and the fuse film include a metal film made of same material formed at a same layer.

The invention recited in claim 11 is the chip resistor according to any one of claim 8 to claim 10, wherein the resistive circuit includes a plurality of unit resistive elements connected in series.

The invention recited in claim 12 is the chip resistor according to any one of claim 1 to claim 11, wherein the resistive element film line is made of TiN or TiON or TiSiON.

Effects of the Invention

According to the invention recited in claim 1, a trench is formed at the circuit forming surface of the substrate, and a resistive circuit is provided that has a resistive element film extending along the inner wall surface of the trench. Therefore, the length of the resistive element film provided in the resistive circuit can be increased, and the resistance value can be raised. Additionally, the circuit forming surface is not required to be expanded in order to achieve an increase in resistivity, and therefore it is possible to provide a chip resistor both that can be made compact and that can be increased in resistivity.

According to the invention recited in claim 2, an arbitrary resistive circuit can be electrically incorporated into the resistor network, or can be electrically separated from the resistor network by fusing the fuse film. Therefore, the resistance value of the resistor network can be adjusted, and the resistance value of the chip resistor can be allowed to coincide with a plurality of types of required resistance values without changing a basic design. As a result, it is possible to provide a chip resistor that has the same basic design and whose resistance value is a required resistance value. It is also to cope with even a case where the required resistance value is high.

According to the invention recited in claim 3, the resistive circuit can be increased in resistivity by use of the resistive element film line.

According to the invention recited in claim 4, the resistive element films extending inside the trench can be made as unit resistive elements, respectively. Additionally, the resistive element films extending inside the trench can be easily connected to fuse films or to the first or second connection electrode.

According to the invention recited in claim 5, it is possible to provide a chip resistor increased in resistivity.

According to the invention recited in claim 6, it is possible to provide a chip resistor in which a resistive element film can be excellently formed.

According to the invention recited in claim 7, it is possible to provide a chip resistor whose resistance value can be accurately set and whose resistivity can be increased.

According to the invention recited in claim 8, it is possible to provide a high-resistance chip resistor whose resistance value is easily adjusted.

According to the invention recited in claim 9, it is possible to provide a chip resistor whose resistance value can be accurately set by connecting the unit resistive elements in series.

According to the invention recited in claim 10, a plurality of types of metal films (conductor films) can be easily manufactured and can be easily formed at a time through a comparatively small number of process steps.

According to the invention recited in claim 11, it is possible to provide a high-resistance chip resistor whose resistance value is easily adjusted.

According to the invention recited in claim 12, it is possible to provide a chip resistor in which a resistive element film can be excellently formed.

BRIEF DESCRIPTION OF DRAWINGS

FIG. 3B is a cross-sectional view along line B-B of FIG. 3A.

FIG. 3C is a cross-sectional view along line C-C of FIG. 3A.

FIG. 5A is a partially-enlarged plan view of a region including fuse films F, enlarging a part of the plan view of the chip resistor of FIG. 2, and FIG. 5B is a view showing a cross-sectional structure along line B-B of FIG. 5A.

FIG. 11A and FIG. 11B are electric circuit diagrams showing a modification of an electric circuit shown in FIG. 10.

FIG. 20A is a plan view in which a part of the resistor network 214 of FIG. 19 is enlarged.

FIG. 20B is a cross-sectional view along line B-B of FIG. 20A.

FIG. 20C is a cross-sectional view along line C-C of FIG. 20A.

FIG. 22A is a partially-enlarged plan view of a region including fuse films F, enlarging a part of the plan view of the chip resistor of FIG. 19, and FIG. 22B is a view showing a cross-sectional structure along line B-B of FIG. 22A.

DESCRIPTION OF EMBODIMENTS

Embodiments of first and second inventions will be hereinafter described in detail with reference to the accompanying drawings.

[1] With Regard to First Invention

Figure 1A:
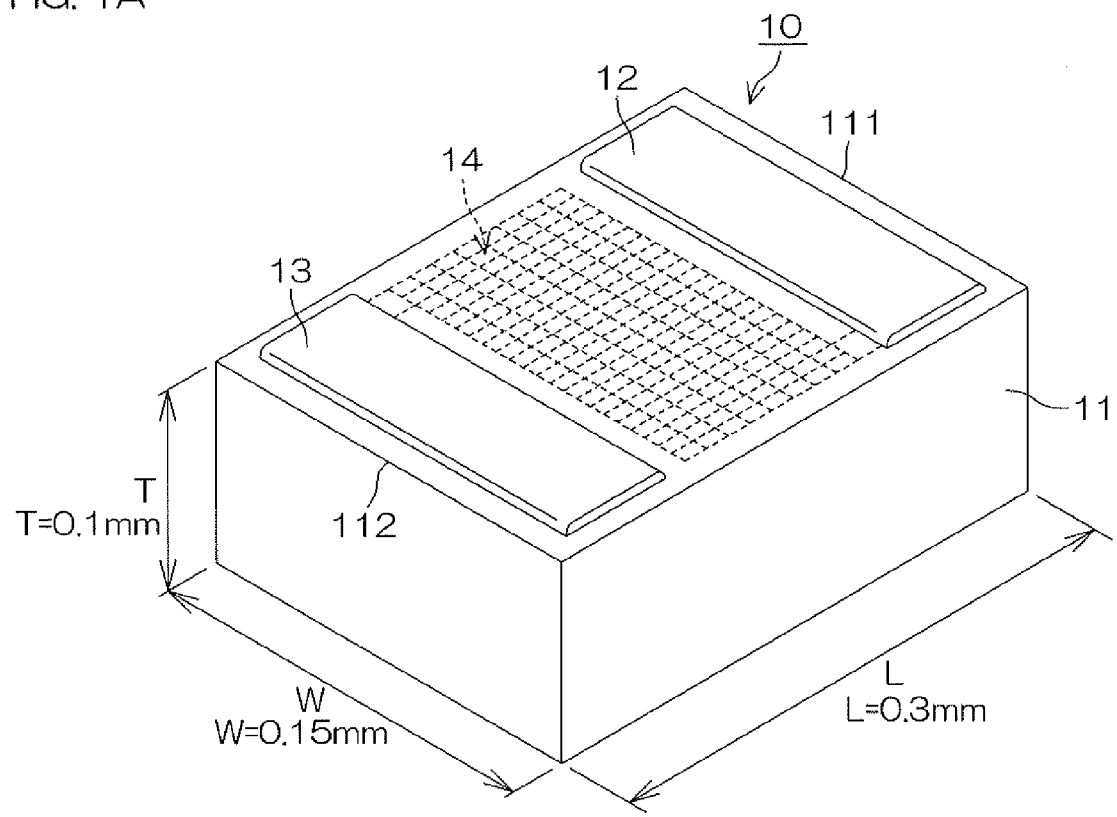
FIG. 1A is a pictorial perspective view showing an external configuration of a chip resistor 10 according to an embodiment of a first invention.
Figure 1B:
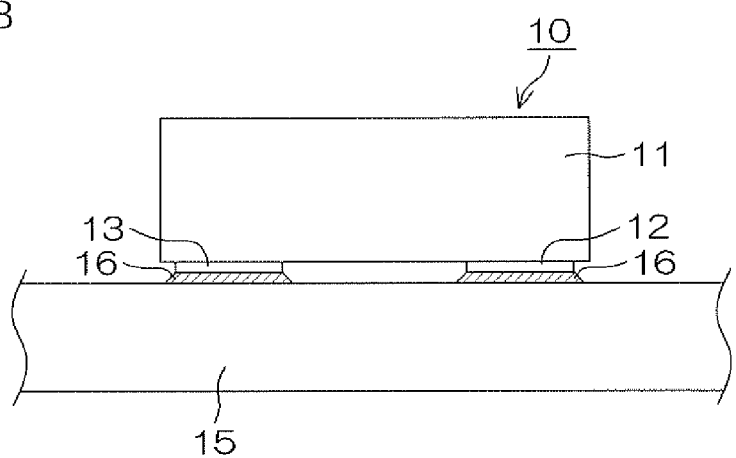
FIG. 1B is a side view showing a state in which the chip resistor 10 is mounted on a substrate.

An embodiment of the first invention will be described in detail with reference to the accompanying drawings. FIG. 1A is a pictorial perspective view showing an external configuration of a chip resistor 10 according to an embodiment of the first invention, and FIG. 1B is a side view showing a state in which the chip resistor 10 is mounted on a substrate.

With reference to FIG. 1A, the chip resistor 10 according to one embodiment of the first invention is composed of a first connection electrode 12, a second connection electrode 13, and a resistor network 14 that are formed on a substrate 11. The substrate 11 is a microchip that has a substantially rectangular parallelepiped shape when viewed planarly and that is formed to be, for example, about 0.3 mm in length L in the direction of its long side, about 0.15 mm in width W in the direction of its short side, and about 0.1 mm in thickness T. The substrate 11 can be made of, for example, silicon, glass, or ceramic. As an example, in the following embodiment, a description is given of a case in which the substrate 11 is a silicon substrate.

Figure 17:
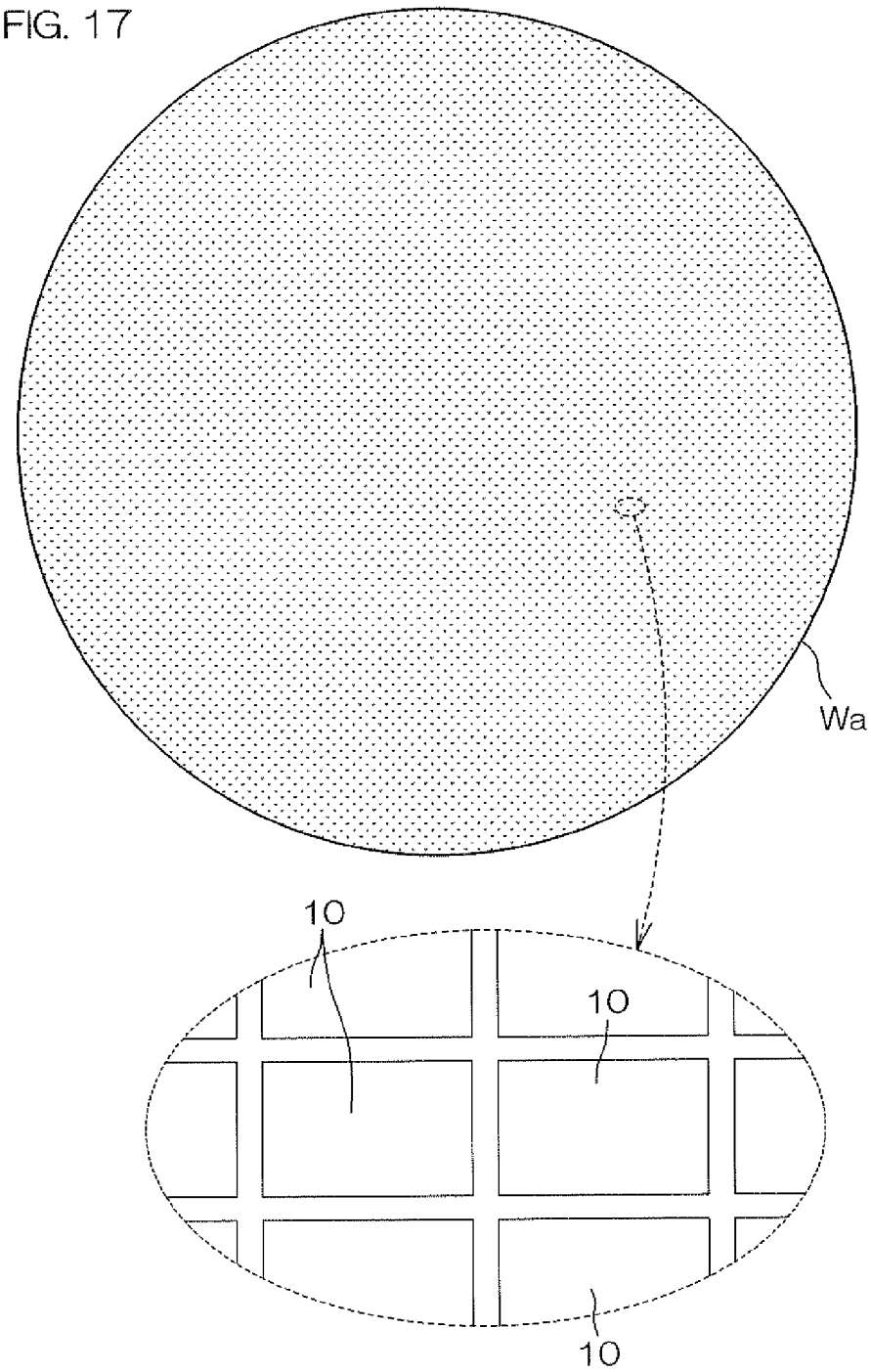
FIG. 17 is a pictorial view to describe the state in which a chip resistor is cut out from a wafer.

As shown in FIG. 17, the chip resistor 10 is obtained in such a way that many chip resistors 10 are formed in a grid-like manner on a wafer Wa (e.g., a semiconductor wafer, such as a silicon wafer, or a conductor wafer, or a non-conductive wafer) and that the wafer Wa is cut and divided into pieces as individual chip resistors 10.

On the silicon substrate 11, the first connection electrode 12 is a rectangular electrode that is disposed along one short side 111 of the silicon substrate 11 and that is long in the direction of the short side 111. The second connection electrode 13 is a rectangular electrode that is disposed along the other short side 112 and that is long in the direction of the short side 112 on the silicon substrate 11. The resistor network 14 is disposed in a central region (on a circuit forming surface or on a device-forming surface) interposed between the first connection electrode 12 and the second connection electrode 13 on the silicon substrate 11. One end side of the resistor network 14 is electrically connected to the first connection electrode 12, whereas the other end side of the resistor network 14 is electrically connected to the second connection electrode 13. The first connection electrode 12, the second connection electrode 13, and the resistor network 14 can be disposed on the silicon substrate 11, for example, by using a semiconductor manufacturing process.

The first connection electrode 12 and the second connection electrode 13 function as external connection electrodes, respectively. As shown in FIG. 1B, in a state in which the chip resistor 10 is mounted on a circuit board 15, the first connection electrode 12 and the second connection electrode 13 are electrically and mechanically connected to a circuit (not shown) of the circuit board 15 by means of a solder 16. Preferably, each of the first and second connection electrodes 12 and 13 that functions as an external connection electrode is made of gold (Au) or has its surface plated with gold in order to improve solder wetting and improve reliability.

Figure 2:
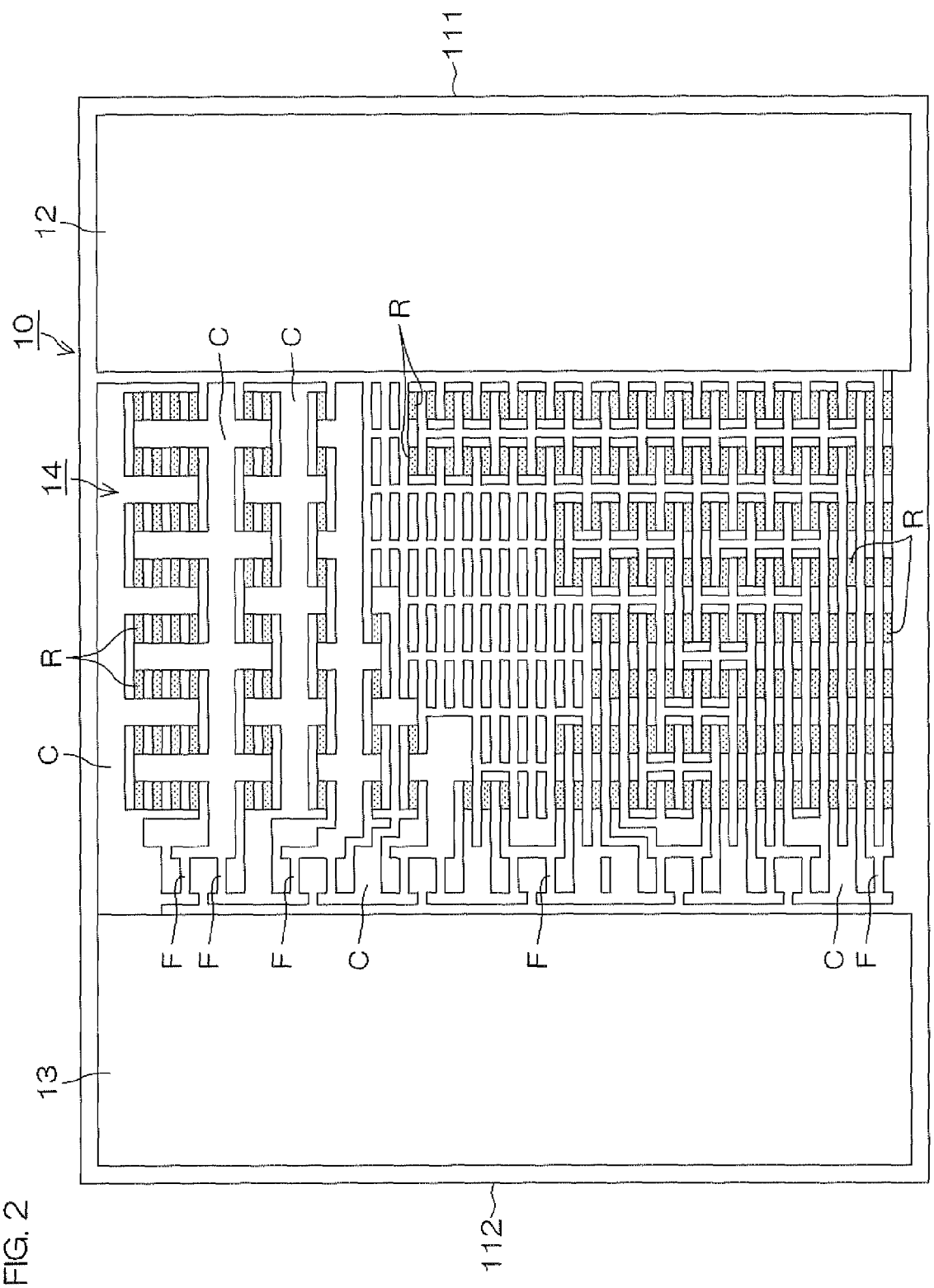
FIG. 2 is a plan view of the chip resistor 10, and shows an arrangement relationship among a first connection electrode 12, a second connection electrode 13, and a resistor network 14, and shows a planarly-viewed layout pattern of the resistor network 14.

FIG. 2 is a plan view of the chip resistor 10, and shows an arrangement relationship among the first connection electrode 12, the second connection electrode 13, and the resistor network 14, and shows a planarly-viewed layout pattern of the resistor network 14. With reference to FIG. 2, the chip resistor 10 includes the first connection electrode 12 that has a substantially rectangular shape when viewed planarly and that is disposed so that its long side extends along one short side 111 of the upper surface of the silicon substrate, the second connection electrode 13 that has a substantially rectangular shape when viewed planarly and that is disposed so that its long side extends along the other short side 112 of the upper surface of the silicon substrate, and the resistor network 14 that is disposed in a region, which is rectangular when viewed planarly, between the first connection electrode 12 and the second connection electrode 13.

The resistor network 14 has many unit resistive elements R that are arranged in a matrix on the silicon substrate 11 and each of which has an equal resistance value (in the example of FIG. 2, a configuration including 352 unit resistive elements R in total in which eight unit resistive elements R are arranged in a row-wise direction (i.e., the direction of the long side of the silicon substrate) and in which forty-four unit resistive elements R are arranged in a column-wise direction (i.e., the direction of the width of the silicon substrate)). A predetermined number of unit resistive elements R ranging from one unit resistive element to sixty-four unit resistive elements among those many unit resistive elements R are electrically connected, and a plurality of types of resistive circuits corresponding to the number of connected unit resistive elements R are formed. Thus formed plurality of types of resistive circuits are connected in a predetermined manner by means of conductor films C (conductor-made wiring films).

In addition, a plurality of fuse films F are provided which are fusible in order to electrically incorporate a resistive circuit into the resistor network 14 or in order to electrically separate it from the resistor network 14. The fuse films F are arranged along the inner side of the second connection electrode 13. More specifically, the fuse films F and the connection conductor films C are disposed so as to be adjacent to each other, and are disposed so that their array direction becomes linear.

Figure 3A:
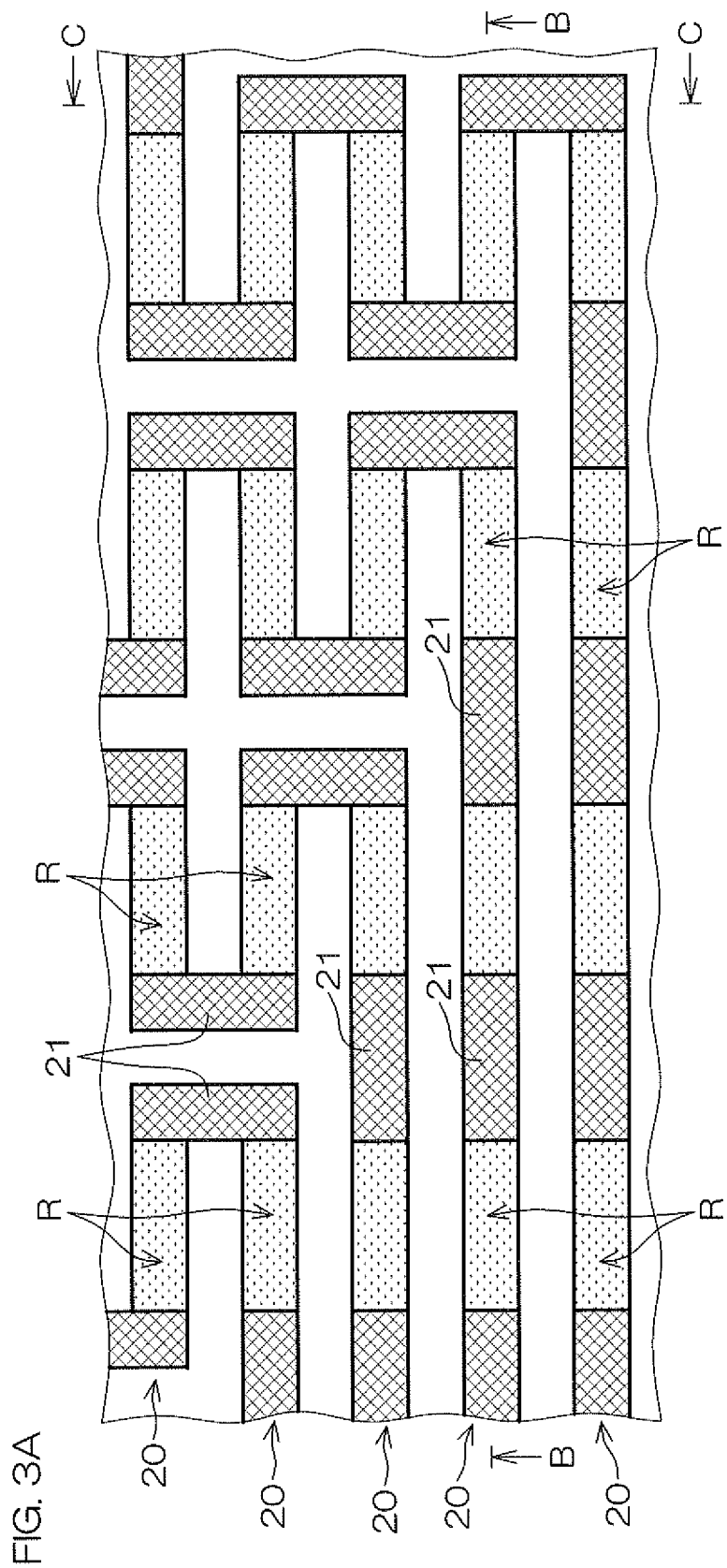
FIG. 3A is a plan view in which a part of the resistor network 14 of FIG. 2 is enlarged.

FIG. 3A is a plan view in which a part of the resistor network 14 of FIG. 2 is enlarged, and FIG. 3B and FIG. 3C are a longitudinal sectional view in the length direction (i.e., a cross-sectional view along line B-B of FIG. 3A) and a longitudinal sectional view in the width direction (i.e., a cross-sectional view along line C-C of FIG. 3A), respectively, which are depicted to describe a structure of unit resistive elements R in the resistor network 14. An arrangement of the unit resistive elements R will be described with reference to FIG. 3A, FIG. 3B, and FIG. 3C.

An insulating layer (SiO$_2$) 19 is formed on the upper surface of the silicon substrate 11 serving as a base layer, and a resistive element film 20 is disposed on the insulating layer 19. The resistive element film 20 is made of TiN or TiON or TiSiON. The resistive element film 20 is provided in the form of a plurality of resistive element films (hereinafter, referred to as a "resistive element film line") that linearly extend in parallel between the first connection electrode 12 and the second connection electrode 13, and there is a case in which the resistive element film line 20 is cut at predetermined positions in the line direction. Aluminum films serving as conductor film pieces 21 are laid on the resistive element film line 20. Each conductor film piece 21 is laid on the resistive element film line 20 at constant intervals R in the line direction.

Figure 4A:
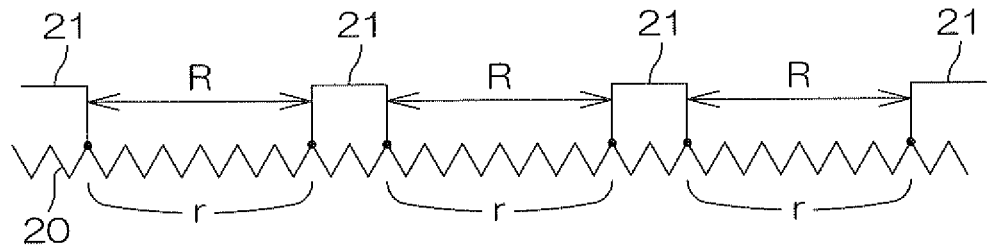
FIG. 4A, FIG. 4B, and FIG. 4C are views showing electric features of resistive element film lines 20 and conductor films 21, which are depicted as circuit symbols and as electric circuit diagrams.
Figure 4B:
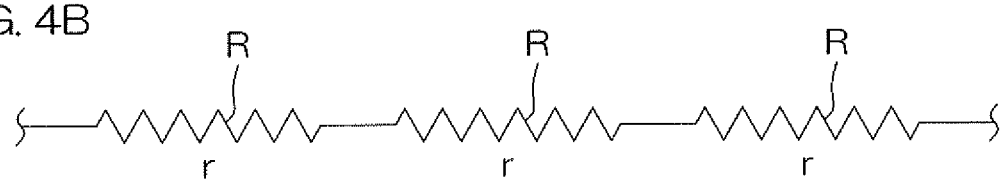
Figure 4C:
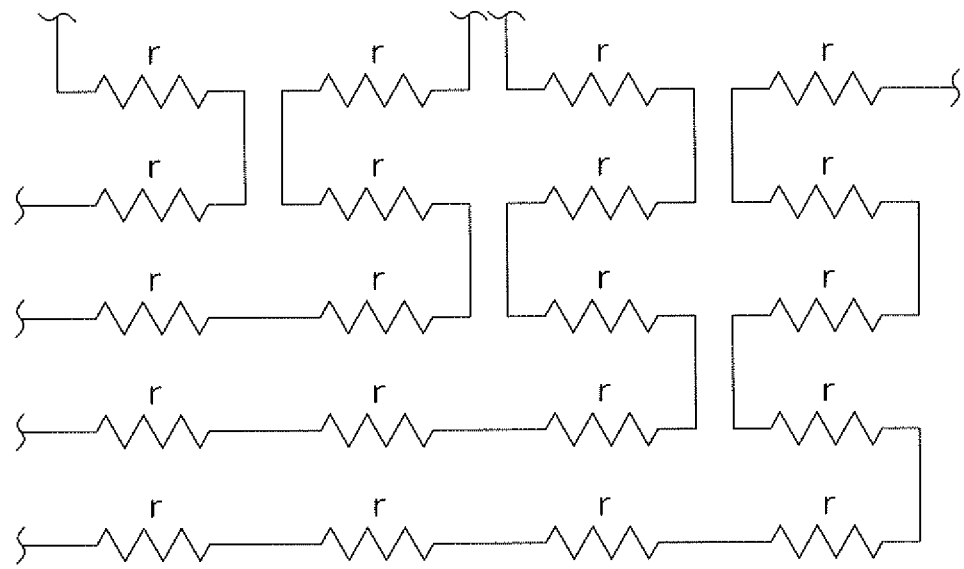

Electric features of the resistive element film line 20 and those of the conductor film pieces 21 arranged as above are represented by circuit symbols as shown in FIG. 4A to FIG. 4C. In more detail, the part of the resistive element film line 20 in each region having the predetermined interval R forms a unit resistive element R having a constant resistance value r as shown in FIG. 4A. A region of the resistive element film line 20 on which a conductor film piece 21 is stacked, is short-circuited by the conductor film piece 21. Therefore, a resistive circuit consisting of the unit resistive elements R connected in series each of which has the resistance r shown in FIG. 4B is formed.

Additionally, adjoining resistive element film lines 20 are connected by resistive element film lines 20 and conductor film pieces 21, and therefore the resistor network of FIG. 3A forms the resistive circuit of FIG. 4C.

Here, an example of a process for manufacturing the resistor network 14 is described briefly. (1) The surface of the silicon substrate 11 is thermally oxidized, and a silicon dioxide (SiO$_2$) layer serving as an insulating layer 19 is formed. (2) Thereafter, the resistive element film 20 made of TiN or TiON or TiSiON is formed on the entire surface of the insulating layer 19 by means of sputtering. (3) Furthermore, the conductor film 21 made of aluminum (Al) is laid on the resistive element film 20 by means of sputtering. (4) Thereafter, the conductor film 21 and the resistive element film 20 are selectively removed by, for example, dry etching by use of a photolithography process, and an arrangement is obtained in which the resistive element film line 20 and the conductor film 21 each of which has a constant width and extends in the row-wise direction when viewed planarly are arrayed in the column-wise direction at constant intervals as shown in FIG. 3A. At this time, a region in which the resistive element film line 20 and the conductor film 21 are partially cut is formed. (5) Thereafter, the conductor film 21 laid on the resistive element film line 20 is selectively removed. As a result, an arrangement is obtained in which the conductor film piece 21 is laid on the resistive element film line 20 at constant intervals R. (6) Thereafter, a SiN film 22 serving as a protection film is deposited, and a polyimide layer 23 serving as a protective layer is laid thereon.

In the present embodiment, the unit resistive element R included in the resistor network 14 formed on the silicon substrate 11 includes the resistive element film line 20 and the conductor film pieces 21 laid on the resistive element film line 20 at constant intervals in the line direction, and a part of the resistive element film line 20 having a constant interval R on which the conductor film piece 21 is not laid, forms a single unit resistive element R. Every parts of the resistive element film line 20 that form the unit resistive elements R have same shape and size with each other. Therefore, based on the distinctive fact that the resistive element films that are formed on the substrate and that have the same shape and the same size are substantially the same in value, many unit resistive elements R arranged in a matrix on the silicon substrate 11 have the equal resistance value.

The conductor film piece 21 laid on the resistive element film line 20 forms the unit resistive element R, and also performs a role as a connection conductor film to form a resistive circuit by connecting a plurality of unit resistive elements R.

FIG. 5A is a partially-enlarged plan view of a region including a fuse film F depicted by enlarging a part of the plan view of the chip resistor 10 of FIG. 2, and FIG. 5B is a view showing a cross-sectional structure along line B-B of FIG. 5A.

As shown in FIG. 5A and FIG. 5B, the fuse film F is also formed by the conductor film 21 laid on the resistive element film 20. In more detail, it is made of aluminum (Al) that is the same metallic material as the conductor film piece 21 at the same layer as the conductor film piece 21 laid on the resistive element film line 20 forming a unit resistive element R. As described above, in order to form a resistive circuit, the conductor film piece 21 is used also as a connection conductor film C that electrically connects a plurality of unit resistive elements R.

In other words, in the same layer laid on the resistive element film 20, a conductor film to form a unit resistive element R, a connection conductor film to form a resistive circuit, a connection conductor film to form a resistor network 14, a fuse film, and a conductor film that connects a resistor network 14 to the first connection electrode 12 and to the second connection electrode 13 are made by use of the same metallic material (e.g., aluminum) through the same manufacturing process (e.g., sputtering and photolithography process). This makes it possible to simplify the manufacturing process of the chip resistor 10 and makes it possible to simultaneously form various conductor films by using a shared mask. Additionally, alignment with the resistive element film 20 can be improved.

Figure 6:
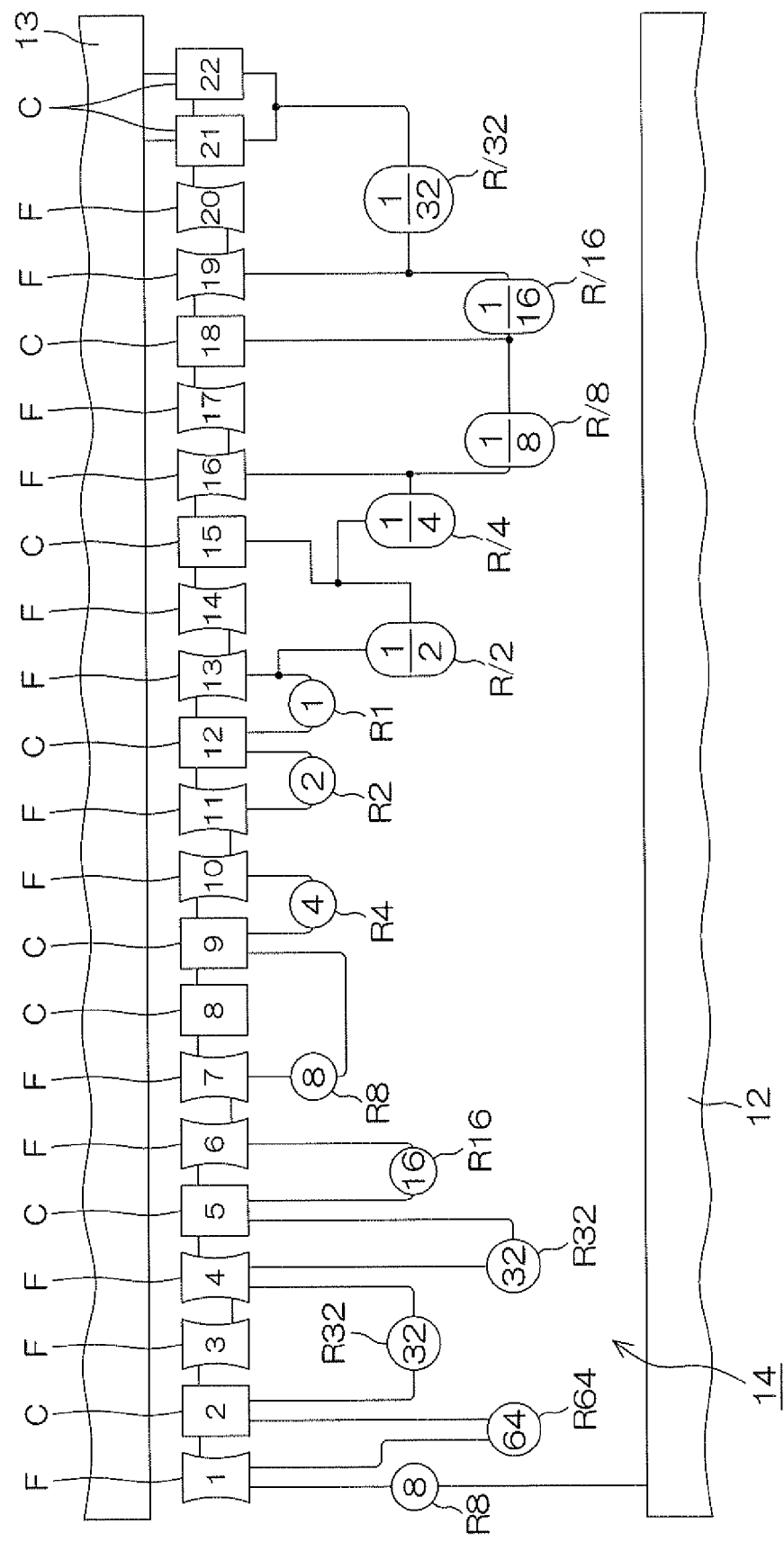
FIG. 6 is a view pictorially showing an array relationship between connection conductor films C that serve to connect a plurality of types of resistive unit elements and fuse films F in the resistor network 14 of FIG. 2 and pictorially showing a connection relationship between the connection conductor films C and the plurality of types of resistive unit elements connected to the fuse films F.

FIG. 6 is a view pictorially showing an array relationship between connection conductor films C that connect a plurality of types of resistive circuits and fuse films F in the resistor network 14 of FIG. 2 and pictorially showing a connection relationship between the connection conductor films C and the plurality of types of resistive circuits connected to the fuse films F. With reference to FIG. 6, one end of a reference resistive circuit R8 included in the resistor network 14 is connected to the first connection electrode 12. The reference resistive circuit R8 consists of eight unit resistive elements R connected in series, and the other end thereof is connected to the fuse film F1.

One end and the other end of a resistive circuit R64 consisting of sixty-four unit resistive elements R connected in series are connected to the fuse film F1 and to the connection conductor film C2, respectively. One end and the other end of a resistive circuit R32 consisting of thirty-two unit resistive elements R connected in series are connected to the connection conductor film C2 and to the fuse film F4, respectively. One end and the other end of a resistive circuit body R32 consisting of thirty-two unit resistive elements R connected in series are connected to the fuse film F4 and to the connection conductor film C5, respectively.

One end and the other end of a resistive circuit R16 consisting of sixteen unit resistive elements R connected in series are connected to the connection conductor film C5 and to the fuse film F6, respectively. One end and the other end of a resistive circuit R8 consisting of eight unit resistive elements R connected in series are connected to the fuse film F7 and the connection conductor film C9, respectively. One end and the other end of a resistive circuit R4 consisting of four unit resistive elements R connected in series are connected to the connection conductor film C9 and the fuse film F10, respectively.

One end and the other end of a resistive circuit R2 consisting of two unit resistive elements R connected in series are connected to the fuse film F11 and the connection conductor film C12, respectively. One end and the other end of a resistive circuit body R1 consisting of one unit resistive element R are connected to the connection conductor film C12 and the fuse film F13, respectively. One end and the other end of a resistive circuit R/2 consisting of two unit resistive elements R connected in parallel are connected to the fuse film F13 and the connection conductor film C15, respectively.

One end and the other end of a resistive circuit R/4 consisting of four unit resistive elements R connected in parallel are connected to the connection conductor film C15 and the fuse film F16, respectively. One end and the other end of a resistive circuit R/8 consisting of eight unit resistive elements R connected in parallel are connected to the fuse film F16 and the connection conductor film C18, respectively. One end and the other end of a resistive circuit R/16 consisting of sixteen unit resistive elements R connected in parallel are connected to the connection conductor film C18 and the fuse film F19, respectively.

One end and the other end of a resistive circuit R/32 consisting of thirty-two unit resistive elements R connected in parallel are connected to the fuse film F19 and the connection conductor film C22, respectively.

In the fuse films F and in the connection conductor films C, the fuse film F1, the connection conductor film C2, the fuse film F3, the fuse film F4, the connection conductor film C5, the fuse film F6, the fuse film F7, the connection conductor film C8, the connection conductor film C9, the fuse film F10, the fuse film F11, the connection conductor film C12, the fuse film F13, the fuse film F14, the connection conductor film C15, the fuse film F16, the fuse film F17, the connection conductor film C18, the fuse film F19, the fuse film F20, the connection conductor film C21, and the connection conductor film C22 are disposed linearly, and are connected in series. When each fuse film F is melted down, an electric connection between the melted-down fuse film F and the connection conductor film C adjacent to the fuse film F is cut off.

Figure 7:
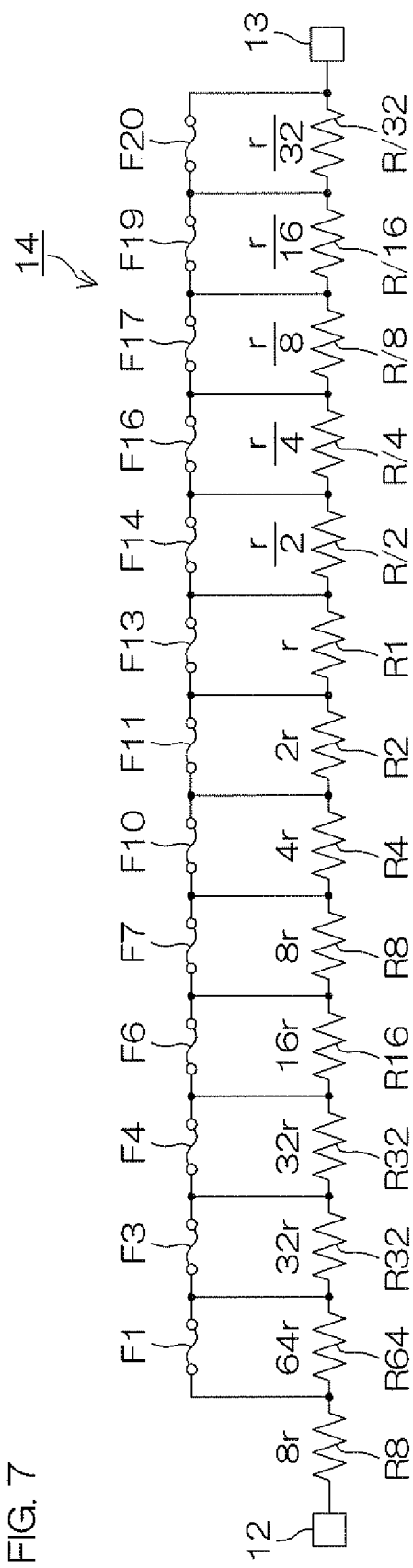
FIG. 7 is an electric circuit diagram of the resistor network 14.

This arrangement is illustrated in the form of an electric circuit diagram in FIG. 7. In detail, in a state in which none of the fuse films F is fused, the resistor network 14 forms a resistive circuit consisting of the reference resistive circuits R8 (resistance value: 8r) consisting of the eight unit resistive elements R connected in series between the first connection electrode 12 and the second connection electrode 13. For example, if the resistance value r of a single unit resistive element R is r=80Ω, the chip resistor 10 is arranged by a resistive circuit of 8r=640Ω to which the first connection electrode 12 and the second connection electrode 13 are connected.

The fuse films F are connected to the plurality of types of resistive circuits, respectively, excluding the reference resistive circuit R8 in parallel, and these plurality of types of resistive circuits are brought into short-circuited states by the respective fuse films F. In detail, although thirteen resistive circuits R64 to R/32 of twelve types are connected in series to the reference resistive circuit R8, each resistive circuit is short-circuited by the fuse film F connected in parallel, and hence, electrically, the respective resistive circuits are not incorporated in the resistor network 14.

In the chip resistor 10 according to the present embodiment, the fuse film F is selectively fused, for example, by laser light in accordance with a required resistance value. As a result, the resistive circuit connected in parallel with the fuse film F that has been fused is incorporated into the resistor network 14. Therefore, the resistor network 14 can be made into a resistor network in which its overall resistance value reaches a resistance value resulting from the fact that the resistive circuits corresponding to the fused fuse films F are connected in series and are incorporated therein.

In other words, in the chip resistor 10 according to the present embodiment, the plurality of types of resistive circuits (for example, the serial connection of the resistive circuits R64, R32, and R1 when the fuses F1, F4, and F13 are fused) can be incorporated into the resistor network by selectively fusing the fuse films corresponding to the plurality of types of resistive circuits. The respective resistance values of the plurality of types of resistive circuits are predetermined, and therefore the chip resistor 10 can be made to have a required resistance value by adjusting the resistance value of the resistor network 14, so to speak, in a digital manner.

Also, the plurality of types of resistive circuits include the plurality of types of serial resistive circuits, in which the unit resistive elements R having an equal resistance value are connected in series with the number of unit resistive elements R being increased in geometric progression as 1, 2, 4, 8, 16, 32, and 64, and the plurality of types of parallel resistive circuits, in which the unit resistive elements R having an equal resistance value are connected in parallel with the number of unit resistive elements R being increased in geometric progression as 2, 4, 8, 16, and 32. These are connected in series in a state of being short-circuited by the fuse films F. Therefore, the resistance value of the resistor network 14 as a whole can be set at an arbitrary resistance value within a wide range from a small resistance value to a large resistance value by selectively fusing the fuse films F.

Figure 8:
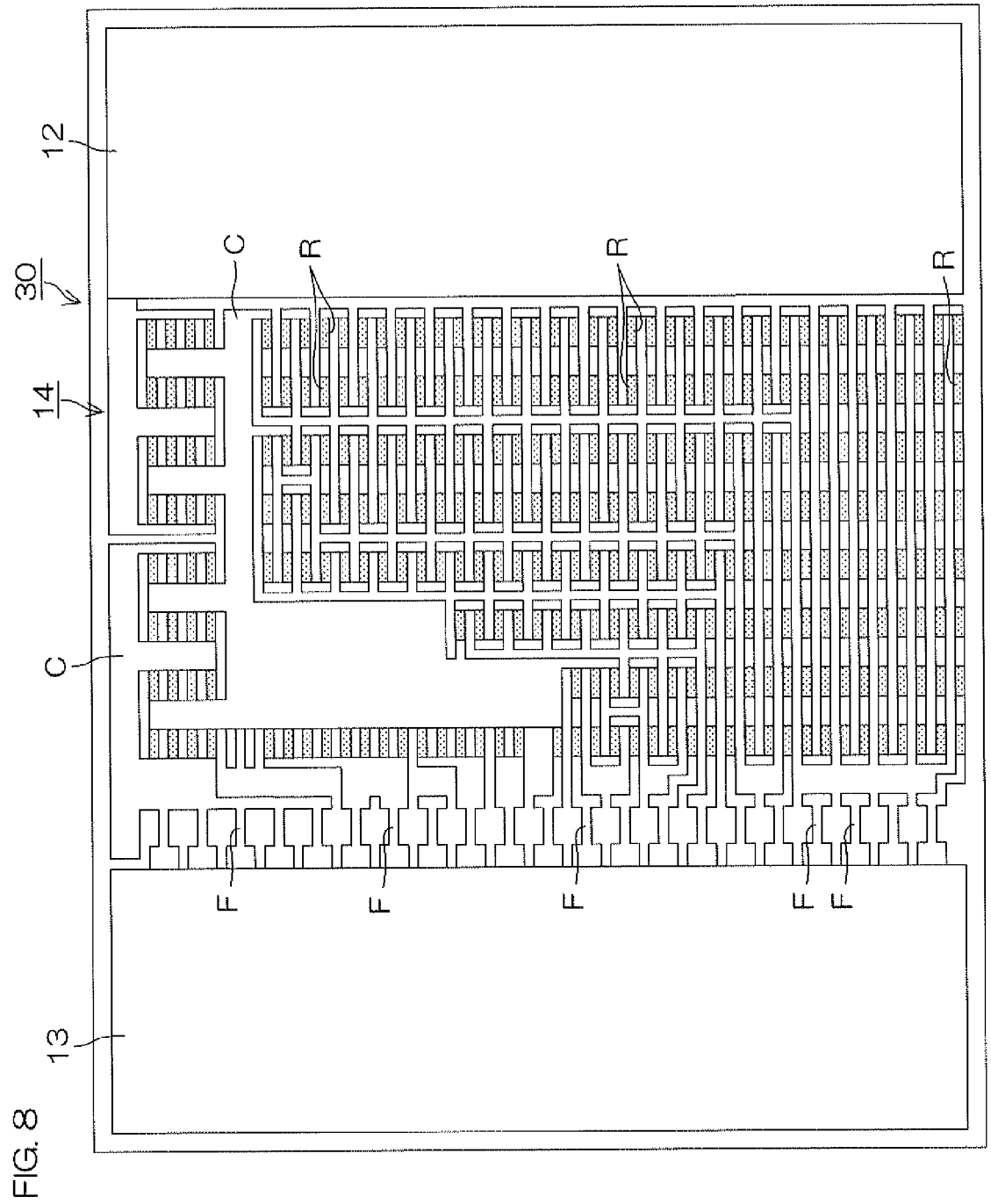
FIG. 8 is a plan view of a chip resistor 30, and shows an arrangement relationship among the first connection electrode 12, the second connection electrode 13, and the resistor network 14, and shows a planarly-viewed layout pattern of the resistor network 14.

FIG. 8 is a plan view of a chip resistor 30 according to another embodiment of the first invention, and shows an arrangement relationship among the first connection electrode 12, the second connection electrode 13, and the resistor network 14, and shows a planarly-viewed arrangement of the resistor network 14. The chip resistor 30 differs from the chip resistor 10 described above in the mode of connection of the unit resistive elements R in the resistor network 14.

In detail, the resistor network 14 of the chip resistor 30 has many unit resistive elements R having an equal resistance value and being arrayed in a matrix on the silicon substrate (the arrangement of FIG. 8 is an arrangement with a total of 352 unit resistive elements R with 8 unit resistive elements R being arrayed along the row-wise direction (longitudinal direction of the silicon substrate) and 44 unit resistive elements R being arrayed along the column-wise direction (width direction of the silicon substrate)). A predetermined number of unit resistive elements R, i.e., one to 128 of the many unit resistive elements R are electrically connected to form a plurality of types of resistive circuits. The plurality of types of resistive circuits are connected in a parallel mode by conductor films serving as network connection means and by the fuse films F. The plurality of fuse films F are arrayed along the inner side of the second connection electrode 13 so that the arrangement region thereof is rectilinear, and, when a fuse film F is fused, the resistive circuit connected to the fuse film is electrically separated from the resistor network 14.

The structure of the many unit resistive elements R forming the resistor network 14, and the structures of the connection conductor films and fuse films F are the same as the structures of the corresponding portions in the chip resistor 10, and therefore a description of these is omitted here.

Figure 9:
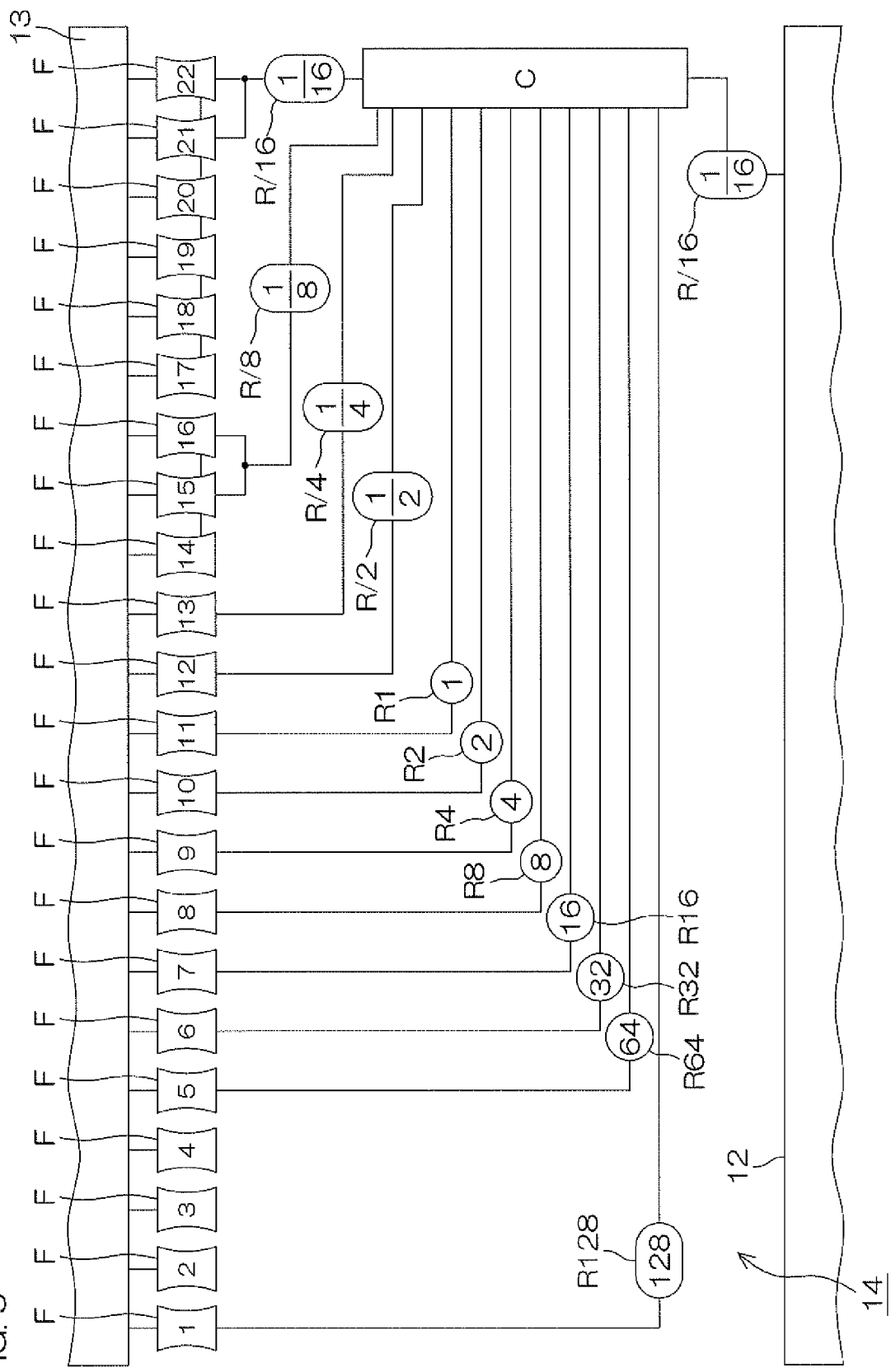
FIG. 9 is a view pictorially showing an arrangement relationship between connection conductor films C that serve to connect a plurality of types of resistive unit elements and fuse films F in the resistor network 14 of FIG. 8 and pictorially showing a connection relationship between the connection conductor films C and the plurality of types of resistive unit elements connected to the fuse films F.

FIG. 9 is an illustrative diagram of a connection mode of the plurality of types of resistive circuits in the resistor network shown in FIG. 8, an array relationship of the fuse films F connecting the resistive circuits, and a connection relationship of the plurality of types of resistive circuits connected to the fuse films F.

Referring to FIG. 9, one end of a reference resistive circuit R/16 included in the resistor network 14 is connected to the first connection electrode 12. The reference resistive circuit R/16 is formed by a parallel connection of 16 unit resistive elements R and the other end thereof is connected to the connection conductor film C to which the remaining resistive circuits are connected. One end and the other end of a resistive circuit R128 formed by a serial connection of 128 unit resistive elements R are connected to the fuse film F1 and the connection conductor film C, respectively.

One end and the other end of the resistive circuit R64 formed by a serial connection of 64 unit resistive elements R are connected to the fuse film F5 and the connection conductor film C, respectively. One end and the other end of the resistive circuit R32 formed by a serial connection of 32 unit resistive elements R are connected to the fuse film F6 and the connection conductor film C, respectively. One end and the other end of the resistive circuit R16 formed by a serial connection of 16 unit resistive elements R are connected to the fuse film F7 and the connection conductor film C, respectively.

One end and the other end of the resistive circuit R8 formed by a serial connection of 8 unit resistive elements R are connected to the fuse film F8 and the connection conductor film C, respectively. One end and the other end of the resistive circuit R4 formed by a serial connection of 4 unit resistive elements R are connected to the fuse film F9 and the connection conductor film C, respectively. One end and the other end of the resistive circuit R2 formed by a serial connection of 2 unit resistive elements R are connected to the fuse film F10 and the connection conductor film C, respectively.

One end and the other end of the resistive circuit R1 formed by a serial connection of a single unit resistive element R are connected to the fuse film F11 and the connection conductor film C, respectively. One end and the other end of the resistive circuit R/2 formed by a parallel connection of 2 unit resistive elements R are connected to the fuse film F12 and the connection conductor film C, respectively. One end and the other end of the resistive circuit R/4 formed by a parallel connection of 4 unit resistive elements R are connected to the fuse film F13 and the connection conductor film C, respectively.

The fuse films F14, F15, and F16 are electrically connected together, and one end and the other end of the resistive circuit R/8 formed by a parallel connection of 8 unit resistive elements R are connected to the fuse films F14, F15, and F16 and the connection conductor film C. The fuse films F17, F18, F19, F20, and F21 are electrically connected together, and one end and the other end of the resistive circuit R/16 formed by a parallel connection of 16 unit resistive elements R are connected to the fuse films F17 to F21 and the connection conductor film C.

The twenty-one fuse films F, i.e., the fuse films F1 to F21 are provided, and all of these fuse films are connected to the second connection electrode 13. As a result of this arrangement, a resistive circuit having one end connected to any one of the fuse films F is electrically disconnected from the resistor network 14 when the fuse film F to which the end of the resistive circuit is connected is fused.

Figure 10:
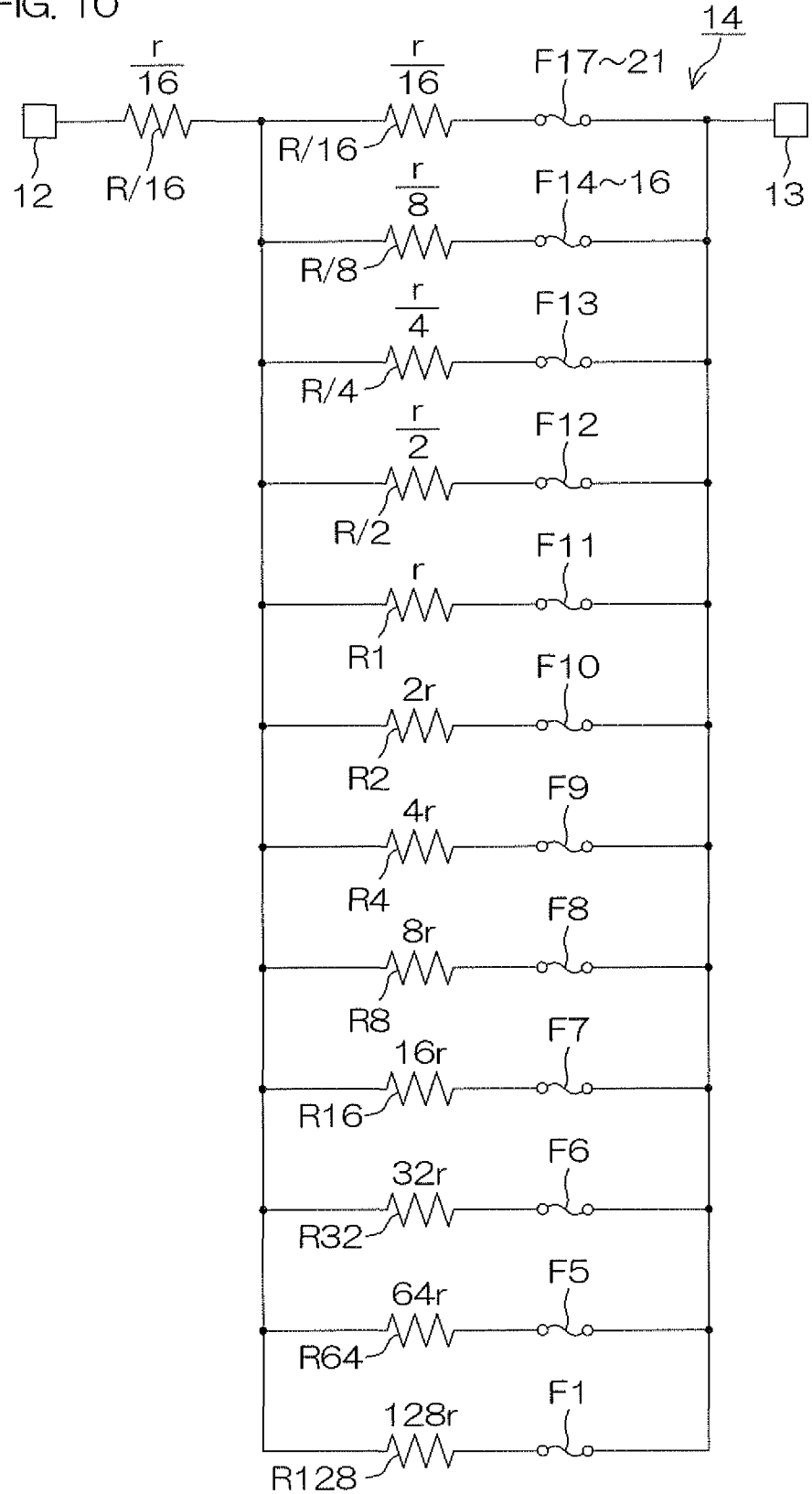
FIG. 10 is an electric circuit diagram of the resistor network 14.

The arrangement of FIG. 9, i.e., the arrangement of the resistor network 14 included in the chip resistor 30 is illustrated in the form of an electric circuit diagram in FIG. 10. In a state in which none of the fuse films F is fused, the resistor network 14 forms, between the first connection electrode 12 and the second connection electrode 13, a serial connection circuit of the reference resistive circuit R/16 and the parallel connection circuit of the 12 types of resistive circuits R/16, R/8, R/4, R/2, R1, R2, R4, R8, R16, R32, R64, and R128.

The fuse film F is serially connected to each of the 12 types of resistive circuits excluding the reference resistive circuit R/16. Therefore, in the chip resistor 30 having the resistor network 14, by selectively fusing a fuse film F, for example, with laser light in accordance with a required resistance value, the resistive circuit corresponding to the fused fuse film F (the resistive circuit connected in series to the fuse film F) is electrically separated from the resistor network 14, and the resistance value of the chip resistor 30 can thereby be adjusted.

In other words, in the chip resistor 30 according to the present embodiment, a plurality of types of resistive circuits can be electrically separated from the resistor network by selectively fusing the fuse films corresponding to the plurality of types of resistive circuits. The respective resistance values of the plurality of types of resistive circuits are predetermined, and therefore the chip resistor 30 can be made to have a required resistance value by adjusting the resistance value of the resistor network 14, so to speak, in a digital manner.

Also, the plurality of types of resistive circuits include the plurality of types of serial resistive circuits, in which the unit resistive elements R having an equal resistance value are connected in series with the number of unit resistive elements R being increased in geometric progression as 1, 2, 4, 8, 16, 32, 64, and 128, and the plurality of types of parallel resistive circuits, in which the unit resistive elements R having an equal resistance value are connected in parallel with the number of unit resistive elements R being increased in geometric progression as 2, 4, 8, and 16. Therefore, the resistance value of the resistor network 14 as a whole can be set at an arbitrary resistance value finely and digitally by selectively fusing the fuse films F.

In the electric circuit shown in FIG. 10, there is a tendency for an overcurrent to flow through the reference resistive circuit R/16 and the resistive circuits having low resistance values among the parallel connection resistive circuits, and the rated current that can be made to flow through the resistances must be designed to be large in setting the resistances. Therefore, to disperse the current, the connection structure of the resistor network may be changed to change the electric circuit shown in FIG. 10 to that shown in FIG. 11A. In detail, the reference resistive circuit R/16 is eliminated, and the circuit is changed to include an arrangement 140 in which the resistive circuits that are connected in parallel have a minimum resistance value of r, and a plurality of resistive unit elements R1 with the resistance value r are connected in parallel.

FIG. 11B is an electric circuit diagram in which specific resistance values are indicated and shows a circuit that includes the arrangement 140 where a plurality of sets of serial connections of a unit resistive element of 80Ω and a fuse film F are connected in parallel. Dispersion of the current that flows can thereby be achieved.

Figure 12:
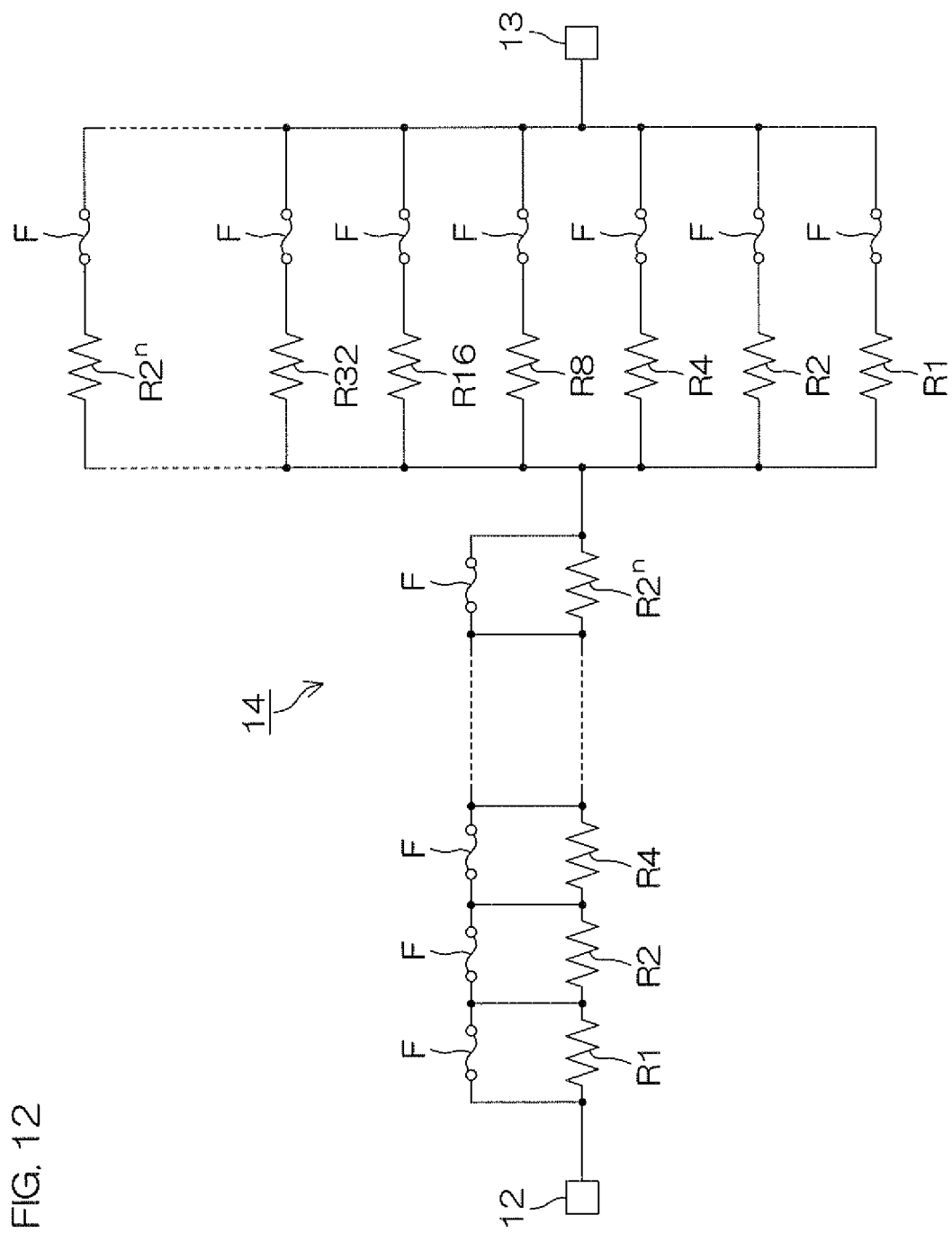
FIG. 12 is an electric circuit diagram of the resistor network 14 according to another embodiment of the first invention.

FIG. 12 is an electric circuit diagram of the circuit arrangement of the resistor network 14 included in a chip resistor according to still another embodiment of the first invention. A feature of the resistor network 14 shown in FIG. 12 is that it has the circuit arrangement where a serial connection of a plurality of types of resistive circuits and a parallel connection of a plurality of types of resistive circuits are connected in series.

As in the embodiment described above, in the plurality of types of resistive circuits connected in series, a fuse film F is connected in parallel to each resistive circuit and all of the plurality of types of resistive circuits that are connected in series are brought into short-circuited states by the fuse films F. Therefore, when a fuse film F is fused, the resistive circuit short-circuited by the fuse film F is electrically incorporated into the resistor network 14. On the other hand, a fuse film F is connected in series to each of the plurality of types of resistive circuits that are connected in parallel. Therefore, the resistive circuit to which the fuse film F is connected in series can be electrically disconnected from the parallel connection of resistive circuits by fusing the fuse film F.

With this arrangement, for example, a low resistance of not more than 1 kΩ can be formed at the parallel connection side, and a resistive circuit of not less than 1 kΩ can be formed at the serial connection side. Therefore, resistive circuits of a wide range from a low resistance of several Ω to a high resistance of several MΩ can be formed using the resistor networks 14 arranged with equal basic designs. Additionally, when the resistance value is set more precisely, if the fuse film of a serial-connection-side resistive circuit that is close in resistance value to a required resistance value is cut in advance, the resistance value can be finely adjusted by fusing the fuse films of the resistive circuits at the parallel connection side to improve the precision of adjustment to a desired resistance value.

Figure 13:
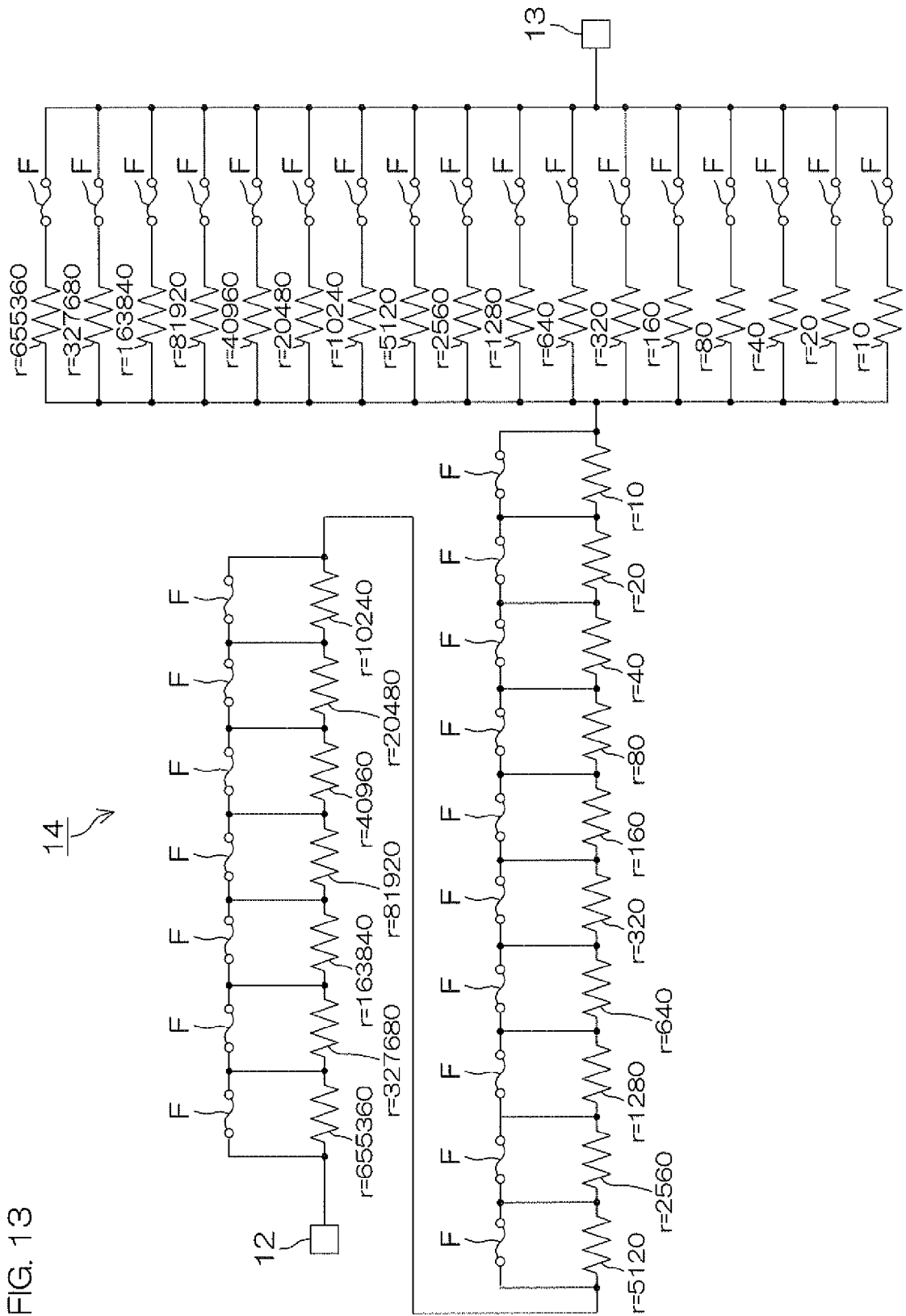
FIG. 13 is an electric circuit diagram showing an arrangement example of a resistor network in a chip resistor that indicates specific resistance values.

FIG. 13 is an electric circuit diagram of a specific arrangement example of the resistor network 14 in a chip resistor having a resistance value in the range of 10Ω to 1 MΩ. The resistor network 14 shown in FIG. 13 also has the circuit arrangement in which a serial connection of a plurality of types of resistive circuits short-circuited by the fuse films F and a parallel connection of a plurality of types of resistive circuits serially connected to the fuse films F are connected in series.

With the resistive circuit of FIG. 13, an arbitrary resistance value of 10 to 1 kΩ can be set within a precision of 1% at the parallel connection side. Additionally, an arbitrary resistance value of 1 k to 1 MΩ can be set within a precision of 1% at the serial connection side circuit. When the serial-connection-side circuit is used, the advantage of being capable of setting the resistance value with higher precision is provided by fusing in advance the fuse film F of the resistive circuit close to a desired resistance value and then adjusting to the desired resistance value.

Although only cases where the same layer is used for the fuse films F as that used for the connection conductor films C have been described, the portion of the connection conductor film C may have another conductor film laid further thereon to decrease the resistance value of the conductor films. Additionally, the resistive element film may be removed, and only the connection conductor film C may be used. Even in this case, the fusing property of the fuse films F is not degraded as long as the conductor film is not laid on the fuse films F.

Figure 14A:
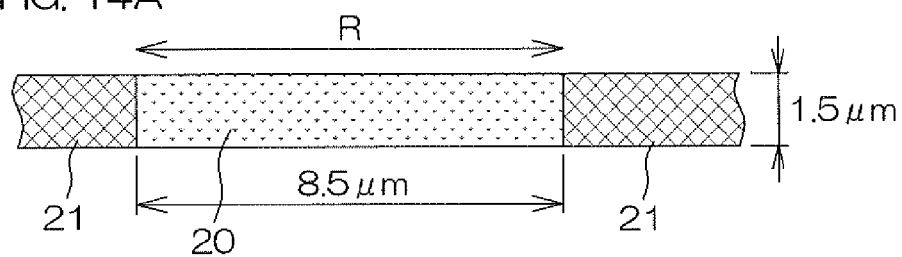
FIG. 14A and FIG. 14B are pictorial plan views to describe a structure of a main part of a chip resistor 90 according to still another embodiment of the first invention.
Figure 14B:
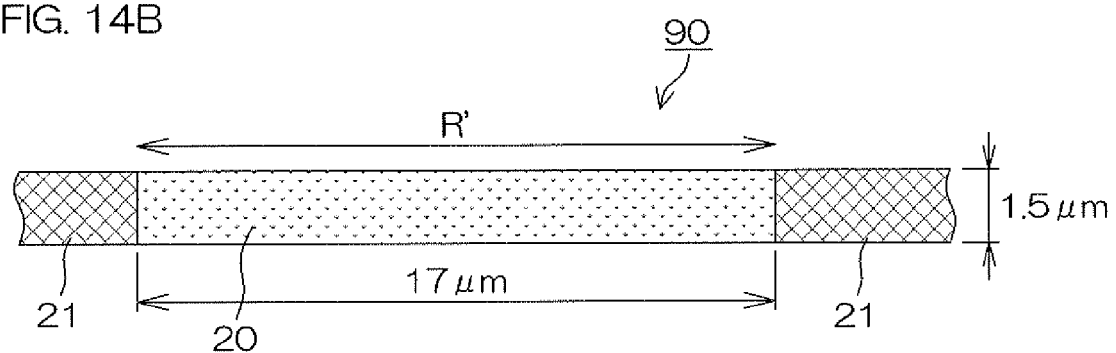

FIG. 14A and FIG. 14B are pictorial plan views to describe a structure of a main part of a chip resistor 90 according to still another embodiment of the first invention. For example, in the chip resistor 10 (see FIG. 1 and FIG. 2) and the chip resistor 30 (see FIG. 8), a relationship between the conductor film piece 21 and the resistive element film line 20 forming a resistive circuit is represented as the arrangement of FIG. 14A when viewed planarly. In other words, the part of the resistive element film line 20 in a region having a predetermined interval R forms a unit resistive element R having a constant resistance value r as shown in FIG. 14A. The conductor film piece 21 is stacked at both sides of the unit resistive element R, and the resistive element film line 20 is short-circuited by this conductor film piece 21.

Here, in the chip resistor 10 and the chip resistor 30 mentioned above, the length of the part of the resistive element film line 20 forming the unit resistive element R is, for example, 12 μm, the width of the resistive element film line 20 is, for example, 1.5 μm, and the unit resistance (sheet resistance) is 10Ω/□. Therefore, the resistance value r of the unit resistive element R is 80Ω (r=80Ω). By the way, in the chip resistor 10 shown in, for example, FIG. 1 and FIG. 2, there is demand to increase the resistivity of the chip resistor 10 by heightening the resistance value of the resistor network 14 without expanding the arrangement region of the resistor network 14.

Therefore, in the chip resistor 90 according to the present embodiment, the layout of the resistor network 14 is changed, and the unit resistive element forming the resistive circuit included in the resistor network is made to have the shape and size shown in FIG. 14B when viewed planarly. With reference to FIG. 14B, the resistive element film line 20 includes a line-shaped resistive element film line 20 that extends linearly with a width of 1.5 μm. In the resistive element film line 20, the part of the resistive element film line 20 having a predetermined interval R' forms a unit resistive element R' having a constant resistance value r'. The length of the unit resistive element R' is set at, for example, 17 μm. This makes it possible to allow the unit resistive element R' to have a resistance value r' of 160Ω (r'=160Ω) that is approximately twice as large as the unit resistive element R of FIG. 14A.

The conductor film piece 21 laid on the resistive element film line 20 can be arranged to have the same length both in that of FIG. 14A and in that of FIG. 14B. Therefore, the layout pattern of each unit resistive element R' forming the resistive circuit included in the resistor network 14 is changed so that the unit resistive elements R' can be connected in series, and, as a result, the chip resistor 90 is increased in resistivity.

Figure 15A:
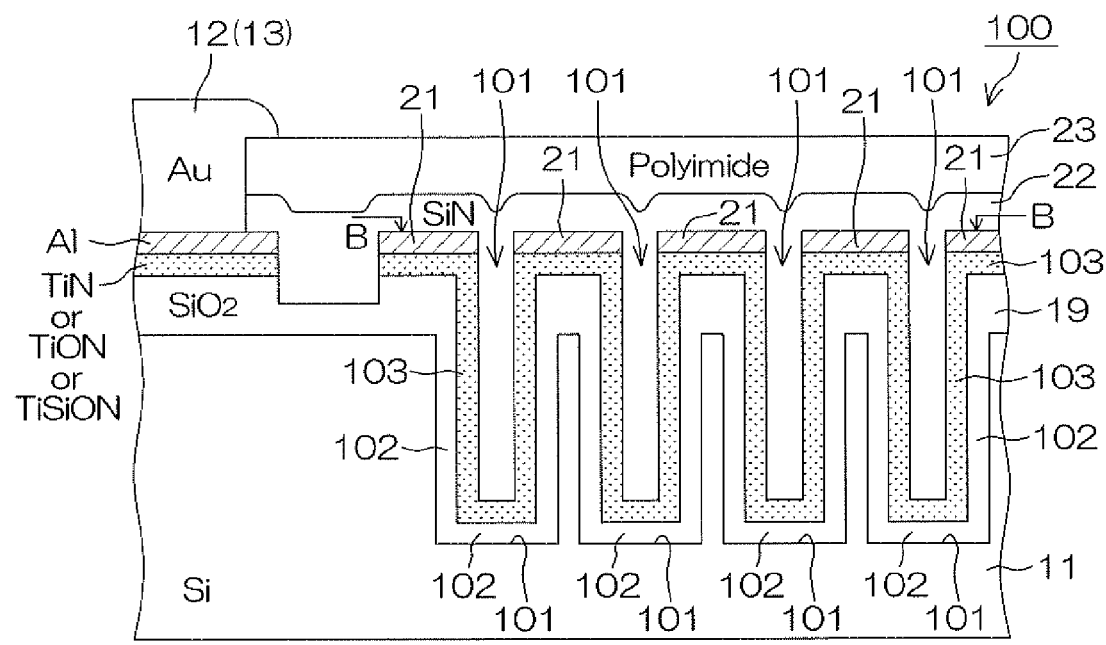
FIG. 15A is a pictorial cross-sectional view showing a structure of a main part of a chip resistor 100 according to still another embodiment of the first invention.
Figure 15B:
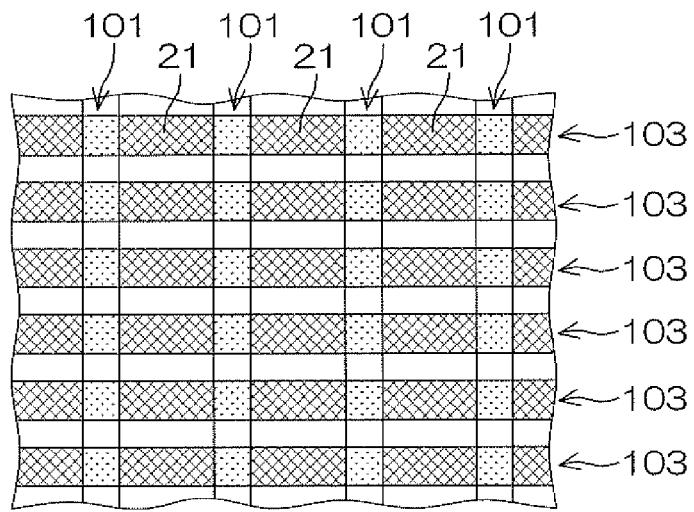
FIG. 15B is a pictorial, partial plan view along an arrow B of FIG. 15A.

FIG. 15A is a pictorial cross-sectional view showing a structure of a main part of a chip resistor 100 according to still another embodiment of the first invention, and FIG. 15B is a pictorial, partial plan view along an arrow B of FIG. 15A.

First, with reference to FIG. 15A, the chip resistor 100 has a silicon substrate 11 serving as a base layer, and an insulating layer ($SiO_2$) 19 is formed on the upper surface of the silicon substrate 11. The surface of the insulating layer 19 is a circuit-forming surface. In the chip resistor 100, a trench 101 dug down to a predetermined depth from the surface of the insulating layer 19 that is a circuit forming surface toward the silicon substrate 11 is formed by, for example, dry etching. The inner wall surface and the bottom surface of the trench 101 are covered with an insulating film 102 of $SiO_2$ by, for example, thermal oxidation. The insulating film 102 is connected integrally with the insulating layer 19 formed on the upper surface of the silicon substrate 11.

A resistive element film 103 is formed on the insulating layer 19 of the upper surface of the silicon substrate 11 and on the insulating film 102 in the trench 101. The resistive element film 103 is made of TiN or TiON or TiSiON. The resistive element film 103 is disposed on the insulating film 102 along the inner wall surface and the bottom surface of the trench 101 in such a manner as to traverse each trench 101.

With reference to FIG. 15B, the trench 101 longitudinally extends in the surface direction of the silicon substrate 11, and the trenches 101 are formed linearly in parallel at equal intervals. The resistive element film 103 formed on the insulating film 102 extends while traversing the trenches 101 one by one along the inner wall surface of the trench 101 in such a manner as to traverse the upper surface of the insulating layer 19 and the trenches 101. The resistive element film 103 extends in a direction perpendicular to the length direction of the trench 101. The resistive element film 103 is provided in the form of a plurality of resistive element films extending in parallel (hereinafter, referred to as a "resistive element film line"), and includes a plurality of resistive element film lines 103 extending in parallel.

An aluminum film as a conductor film piece 21 is laid on a part of the resistive element film line 103 disposed on the insulating layer 19. The resistance of the part of the resistive element film 103 on which the conductor film piece 21 is laid is short-circuited by the conductor film piece 21. Therefore, in the chip resistor 100 shown in FIG. 15A and FIG. 15B, the part of the resistive element film line 103 extending along the inner wall surface and the bottom surface of the trench 101 forms a unit resistive element R". The length of the resistive element film line 103 forming the unit resistive element R" can be set at a predetermined length by adjusting the depth of the trench 101 (for example, the depth of the trench 101 can be set at several tens of micrometers to 100 μm). Therefore, the resistance value of the unit resistive element R" can be heightened. As a result, the chip resistor 100 is changed, as a whole, into a chip resistor whose resistivity has been increased.

Although the conductor film 21 is disposed to improve the accuracy of the resistance value in the present embodiment, an arrangement in which the conductor film 21 is not provided can be employed when priority is placed on an increase in resistivity.

According to the first invention, in the aforementioned chip resistor whose resistivity has been increased, an even more resistive chip resistor can be made by an appropriate combination of arrangements for an increase in resistivity.

Figure 16:
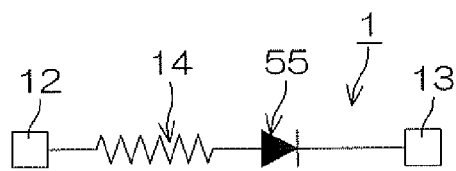
FIG. 16 is a circuit diagram of a discrete component 1 according to one embodiment of the first invention.

FIG. 16 is a view showing a circuit configuration of a discrete component 1 formed by incorporating another circuit into the aforementioned chip resistor.

For example, the discrete component 1 is a discrete component in which a diode 55 and the resistive circuit 14 are connected together in series. This discrete component 1 is a chip type discrete component including the diode 55. Without being limited to the chip type taken as an example, the first invention is applicable as a discrete component having the aforementioned resistive circuit 14.

In the first invention, various design changes can be made within the scope of the appended claims without being limited to the embodiment described above. For example, instead of the trench, a relief pattern may be formed on the substrate, and the resistivity may be increased by increasing the length of a resistive element film so as to form the resistive element film along its surface.

[2] With Regard to Second Invention

A second invention has the following features.

A1. A chip resistor characterized by including a substrate having a circuit forming surface, a first connection electrode and a second connection electrode that are formed on the substrate, a resistor network that is formed on the substrate and that has ends one of which is connected to the first connection electrode and an opposite one of which is connected to the second connection electrode, the resistor network including a first resistive circuit arranged by a first resistive element film formed on the substrate, a second resistive circuit arranged by a second resistive element film laid on the first resistive circuit with an interlayer insulating film therebetween, a connection circuit to connect the first resistive circuit and the second resistive circuit together in series, and, in addition, a fuse film that is fusible to electrically incorporate an arbitrary resistive circuit included in the resistor network into the resistor network or that is fusible to electrically separate the arbitrary resistive circuit from the resistor network.

A2. The chip resistor recited in "A1.", characterized in that each of the first resistive element film and the second resistive element film has a line-shaped resistive element film line that has a constant width and that extends linearly.

A3. The chip resistor recited in "A1." or "A2.", characterized in that each of the first resistive circuit and the second resistive circuit is formed in a same layout pattern when viewed planarly.

A4. The chip resistor recited in "A2.", characterized in that at least one of the first resistive circuit and the second resistive circuit includes a plurality of conductor film pieces that are laid on the resistive element film line at constant intervals in a line direction, and a resistive element film line part at a part of the interval on which the conductor film piece is not laid forms one unit resistive element.

A5. The chip resistor recited in "A4.", characterized in that the first resistive circuit includes the plurality of conductor film pieces, and the fuse film which is made of a same material as the conductor film piece is formed at a same layer as a laying layer of the conductor film piece.

A6. The chip resistor recited in any one of "A1." to "A5.", characterized in that the resistor network includes a plurality of types of resistive circuits that have mutually different resistance values.

A7. The chip resistor recited in "A6.", characterized in that the fuse film is fusible to electrically incorporate the plurality of types of resistive circuits included in the resistor network selectively into the resistor network or is fusible to electrically separate the plurality of types of resistive circuits included therein from the resistor network.

A8. The chip resistor recited in "A1.", characterized in that the first resistive circuit has a plurality of unit resistive elements made of the first resistive element film, the second resistive circuit has a plurality of unit resistive elements made of the second resistive element film, and each unit resistive element included in the second resistive circuit is connected in series by the connection circuit to each unit resistive element included in the first resistive circuit.

A9. The chip resistor recited in any one of "A1." to "A8.", characterized in that the first resistive element film and the second resistive element film are made of TiN or TiON or TiSiON.

A10. A chip resistor characterized by including a substrate that has a device-forming surface, a first resistive element film formed on the device-forming surface, an interlayer insulating film with which the first resistive element film is covered, a second resistive element film formed on the interlayer insulating film, a via to connect the first resistive element film and the second resistive element film together in series, and a pair of external connection electrodes that are disposed on the device-forming surface and that are connected to the first resistive element film or to the second resistive element film.

A11. The chip resistor recited in "A10.", characterized in that the first resistive element film and the second resistive element film have an overlapping region in which the first and second resistive element films overlap with each other when viewed planarly so as to look down the device-forming surface, and both resistive element films are electrically connected together by the via in the overlapping region.

A12. The chip resistor recited in "A10." or "A11.", characterized in that the first resistive element film and the second resistive element film are made of TiN or TiON or TiSiON.

A13. The chip resistor recited in any one of "A10." to "A12.", characterized in that the first resistive element film and the second resistive element film are subjected to patterning so as to have a predetermined resistive circuit mode.

A14. A chip resistor characterized by including a substrate having a circuit forming surface, a first connection electrode and a second connection electrode that are formed on the substrate, a resistor network that is formed on the substrate and that has ends one of which is connected to the first connection electrode and an opposite one of which is connected to the second connection electrode, the resistor network including a first resistive circuit formed on a circuit forming surface positioned between the first connection electrode and the second connection electrode on the substrate, a second resistive circuit formed under at least one of the first connection electrode and the second connection electrode, and a connection circuit to connect the first resistive circuit and the second resistive circuit together in series.

A15. The chip resistor recited in "A14.", characterized by including a fuse film that is fusible to electrically incorporate an arbitrary resistive circuit included in the resistor network into the resistor network or that is fusible to electrically separate the arbitrary resistive circuit from the resistor network.

A16. The chip resistor recited in any one of "A1." to "A15.", characterized in that an area of a region in which the resistor network is formed and an area of a region in which the first connection electrode or the second connection electrode or the pair of external connection electrodes is disposed are substantially equal to each other in area ratio when the chip resistor is viewed planarly.

According to the invention recited in "A1.", the resistor network includes the first resistive circuit and the second resistive circuit stacked with the interlayer insulating film therebetween, and the chip resistor can be made compact and can be increased in resistivity. Additionally, an arbitrary resistive circuit is electrically incorporated into the resistor network or is electrically separated from the resistor network by fusing an arbitrary one of a plurality of fuse films, and, as a result, the resistance value of the resistor network can be adjusted, and the resistance value of the chip resistor can be allowed to coincide with a plurality of types of required resistance values without changing a basic design. As a result, it is possible to provide a chip resistor having the same basic design and having its resistance value allowed to coincide with a required resistance value. Moreover, it is also to cope with even a case where the required resistance value is high.

According to the invention recited in "A2.", the first resistive circuit and the second resistive circuit can be increased in resistivity by use of the resistive element film line.

According to the invention recited in "A3.", the first resistive circuit of the first layer and the second resistive circuit of the second layer can be made by the same design. Therefore, it is possible to provide a high-resistance chip resistor whose circuit design can be easily performed and that can be easily manufactured.

According to the invention recited in "A4.", it is possible to provide a high-resistance chip resistor whose resistance value can be accurately set and whose resistance value can be easily adjusted.

According to the invention recited in "A5.", a plurality of types of metal films (conductor films) can be easily manufactured and can be easily formed at a time through a comparatively small number of process steps.

According to the invention recited in "A6.", it is possible to provide a high-resistance chip resistor whose resistance value is easily adjusted.

According to the invention recited in "A7.", as in the invention recited in "A6.", it is possible to provide a high-resistance chip resistor whose resistance value is easily adjusted. According to the invention recited in "A8.", it is possible to provide a high-resistance chip resistor.

According to the invention recited in "A9.", it is possible to provide a chip resistor in which a resistive element film can be excellently formed.

According to the invention recited in "A10.", it is possible to provide a chip resistor capable of achieving both a reduction in size and an increase in resistivity.

According to the invention recited in "A11.", it is possible to provide a chip resistor in which the first resistive element film and the second resistive element film can be easily connected together in series by use of vias.

According to the invention recited in "A12.", it is possible to provide a chip resistor in which the resistive element film can be excellently formed.

According to the invention recited in "A13.", it is possible to provide a chip resistor that has a desired high-resistance value and in which the first resistive element film and the second resistive element film can undergo patterning suitable for their respective resistive circuits.

According to the invention recited in "A14.", it is possible to provide a chip resistor increased in resistivity by using the lower side of an external electrode that has not been used as an arrangement region for conventional resistive circuits.

According to the invention recited in "A15.", it is possible to provide a chip resistor in which the resistive element film can be excellently formed.

According to the invention recited in "A16.", it is possible to provide a chip resistor that is a minimum-type chip resistor and that is increased in resistivity.

An embodiment of the second invention will be described in detail with reference to the accompanying drawings.

Figure 18A:
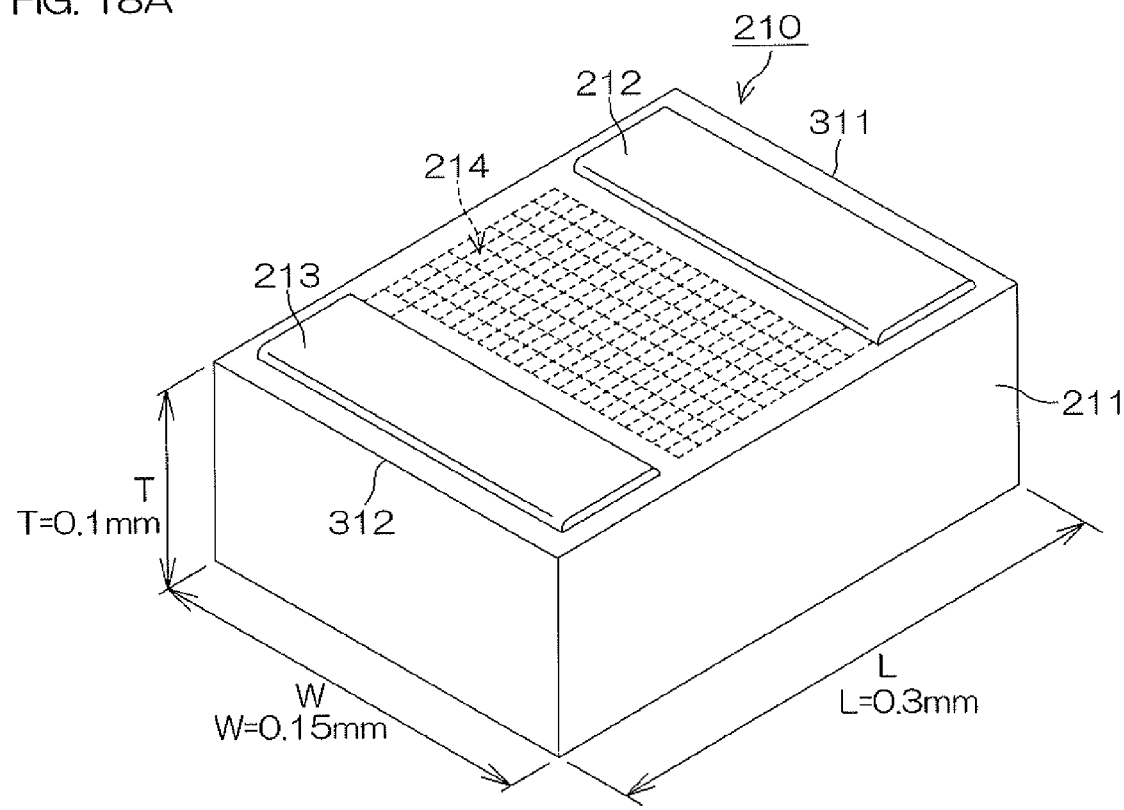
FIG. 18A is a pictorial perspective view showing an external configuration of a chip resistor 210 according to one embodiment of the second invention.
Figure 18B:
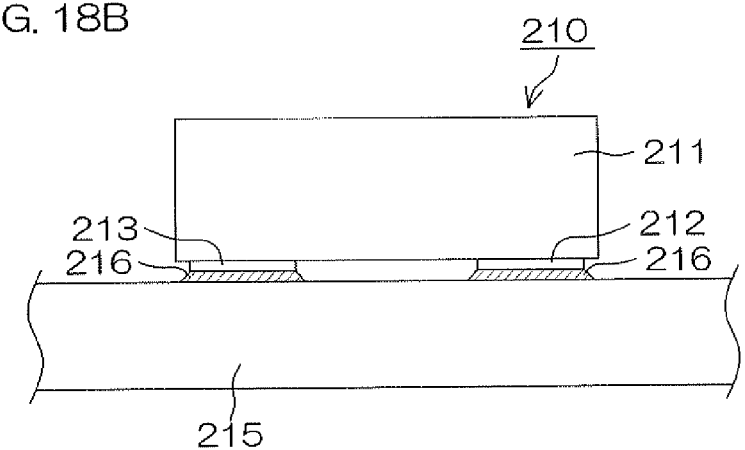
FIG. 18B is a side view showing a state in which the chip resistor 210 is mounted on a substrate.

FIG. 18A is a pictorial perspective view showing an external configuration of a chip resistor 210 according to one embodiment of the second invention, and FIG. 18B is a side view showing a state in which the chip resistor 210 is mounted on a substrate. With reference to FIG. 18A, the chip resistor 210 according to one embodiment of the second invention is composed of a first connection electrode 212, a second connection electrode 213, and a resistor network 214 that are formed on a substrate 211. The substrate 211 is a microchip that has a substantially rectangular parallelepiped shape when viewed planarly and that is formed to be, for example, about 0.3 mm in length L in the direction of its long side, about 0.15 mm in width W in the direction of its short side, and about 0.1 mm in thickness T. The substrate 211 can be made of, for example, silicon, glass, or ceramic. As an example, in the following embodiment, a description is given of a case in which the substrate 211 is a silicon substrate.

Figure 37:
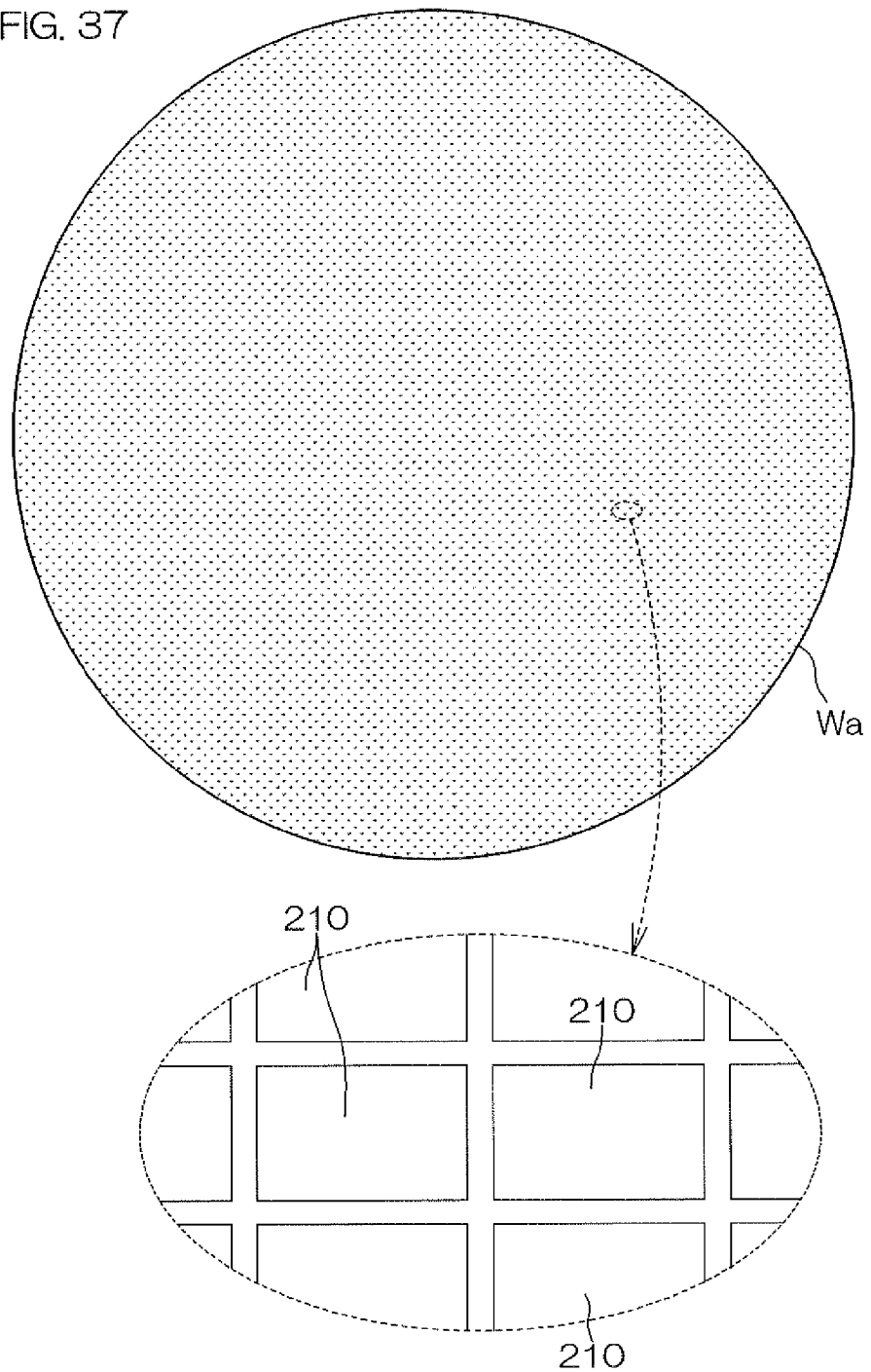
FIG. 37 is a pictorial view to describe the state in which a chip resistor is cut out from a wafer.

As shown in FIG. 37, the chip resistor 210 is obtained in such a way that many chip resistors 210 are formed in a grid-like manner on a wafer Wa (e.g., a semiconductor wafer, such as a silicon wafer, or a conductor wafer, or a non-conductive wafer) and that the wafer Wa is cut and divided into pieces as individual chip resistors 210.

On the silicon substrate 211, the first connection electrode 212 is a rectangular electrode that is disposed along one short side 311 of the silicon substrate 211 and that is long in the direction of the short side 311. The second connection electrode 213 is a rectangular electrode that is disposed along the other short side 312 and that is long in the direction of the short side 312 on the silicon substrate 211. The resistor network 214 is disposed in a central region (on a circuit-forming surface or on a device-forming surface) interposed between the first connection electrode 212 and the second connection electrode 213 on the silicon substrate 211. One end side of the resistor network 214 is electrically connected to the first connection electrode 212, whereas the other end side of the resistor network 214 is electrically connected to the second connection electrode 213. The first connection electrode 212, the second connection electrode 213, and the resistor network 214 can be disposed on the silicon substrate 211, for example, by using a semiconductor manufacturing process.

The first connection electrode 212 and the second connection electrode 213 function as external connection electrodes, respectively. As shown in FIG. 18B, in a state in which the chip resistor 210 is mounted on a circuit board 215, the first connection electrode 212 and the second connection electrode 213 are electrically and mechanically connected to a circuit (not shown) of the circuit board 215 by means of a solder 216. Preferably, each of the first and second connection electrodes 212 and 213 that functions as an external connection electrode is made of gold (Au) or has its surface plated with gold in order to improve solder wetting and improve reliability.

Figure 19:
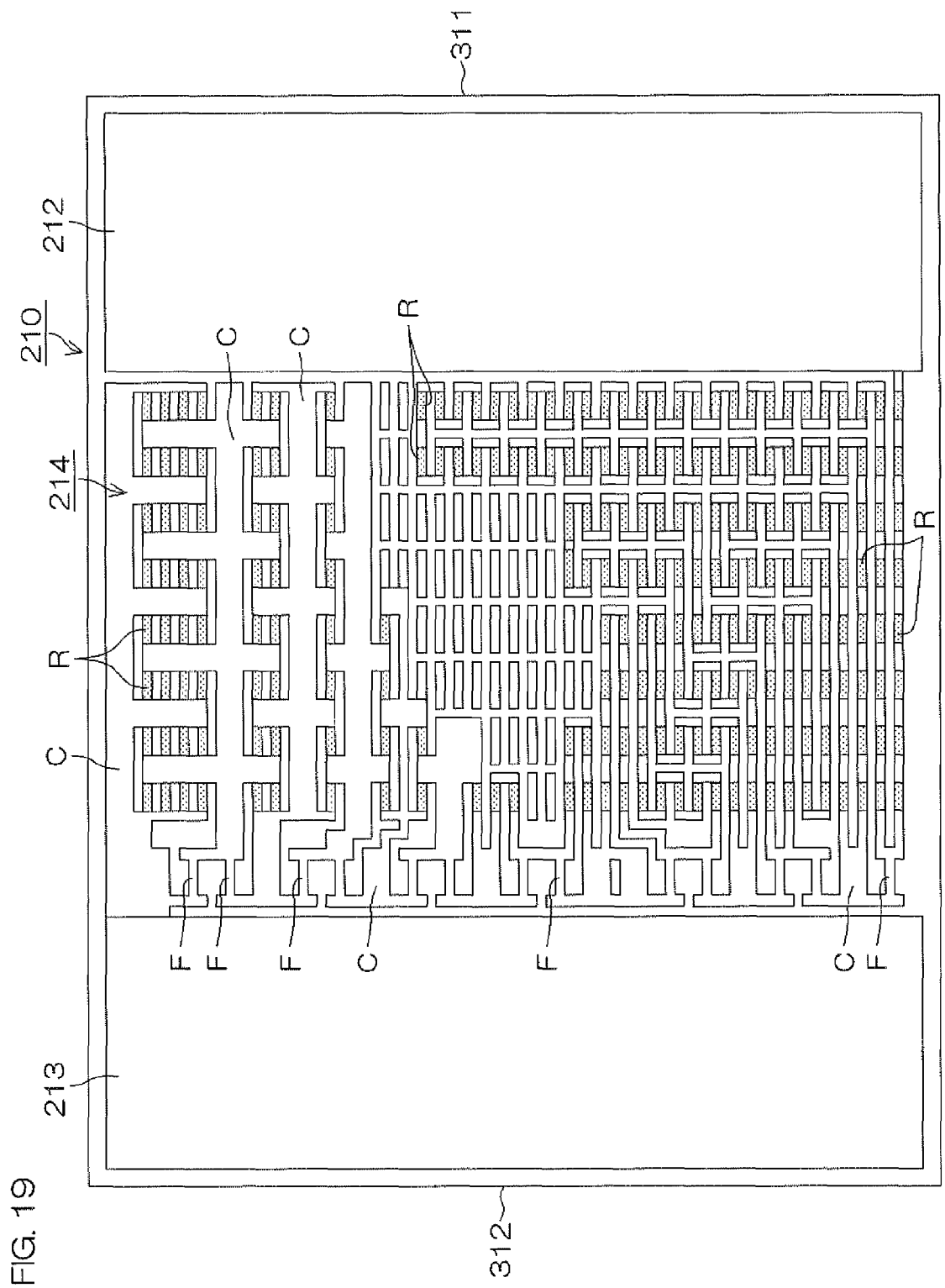
FIG. 19 is a plan view of the chip resistor 210, and shows an arrangement relationship among a first connection electrode 212, a second connection electrode 213, and a resistor network 214, and shows a planarly-viewed layout pattern of the resistor network 214.

FIG. 19 is a plan view of the chip resistor 210, and shows an arrangement relationship among the first connection electrode 212, the second connection electrode 213, and the resistor network 214, and shows a planarly-viewed layout pattern of the resistor network 214. With reference to FIG. 19, the chip resistor 210 includes the first connection electrode 212 that has a substantially rectangular shape when viewed planarly and that is disposed so that its long side extends along one short side 311 of the upper surface of the silicon substrate, the second connection electrode 213 that has a substantially rectangular shape when viewed planarly and that is disposed so that its long side extends along the other short side 312 of the upper surface of the silicon substrate, and the resistor network 214 that is disposed in a region, which is rectangular when viewed planarly, between the first connection electrode 212 and the second connection electrode 213.

The resistor network 214 has many unit resistive elements R that are arranged in a matrix on the silicon substrate 211 and each of which has an equal resistance value (in the example of FIG. 19, a configuration including 352 unit resistive elements R in total in which eight unit resistive elements R are arranged in a row-wise direction (i.e., the direction of the long side of the silicon substrate) and in which forty-four unit resistive elements R are arranged in a column-wise direction (i.e., the direction of the width of the silicon substrate)). A predetermined number of unit resistive elements R ranging from one unit resistive element to sixty-four unit resistive elements among those many unit resistive elements R are electrically connected, and a plurality of types of resistive circuits corresponding to the number of connected unit resistive elements R are formed. The plurality of types of resistive circuits are connected in a predetermined manner by means of conductor films C (conductor-made wiring films).

In addition, a plurality of fuse films F are provided which are fusible in order to electrically incorporate a resistive circuit into the resistor network 214 or in order to electrically separate it from the resistor network 214. The fuse films F are arranged along the inner side of the second connection electrode 213. More specifically, the fuse films F and the connection conductor films C are disposed so as to be adjacent to each other, and are disposed so that their array direction becomes linear.

FIG. 20A is a plan view in which a part of the resistor network 214 of FIG. 19 is enlarged, and FIG. 20B and FIG. 20C are a longitudinal sectional view in the length direction (i.e., a cross-sectional view along line B-B of FIG. 20A) and a longitudinal sectional view in the width direction (i.e., a cross-sectional view along line C-C of FIG. 20A), respectively, which are depicted to describe a structure of unit resistive elements R in the resistor network 214. An arrangement of the unit resistive elements R will be described with reference to FIG. 20A, FIG. 20B, and FIG. 20C.

An insulating layer (SiO$_2$) 219 is formed on the upper surface of the silicon substrate 211 serving as a base layer, and a resistive element film 220 is disposed on the insulating layer 219. The resistive element film 220 is made of TiN or TiON or TiSiON. The resistive element film 220 is provided in the form of a plurality of resistive element films (hereinafter, referred to as a "resistive element film line") that linearly extend in parallel between the first connection electrode 212 and the second connection electrode 213, and there is a case in which the resistive element film line 220 is cut at predetermined positions in the line direction. Aluminum films serving as conductor film pieces 221 are laid on the resistive element film line 220. Each conductor film piece 221 is laid on the resistive element film line 220 at constant intervals R in the line direction.

Figure 21A:
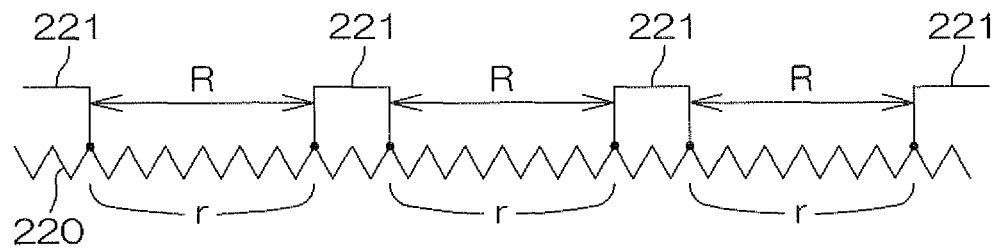
FIG. 21A, FIG. 21B, and FIG. 21C are views showing electric features of resistive element film lines 220 and conductor films 221, which are depicted as circuit symbols and as electric circuit diagrams.
Figure 21B:
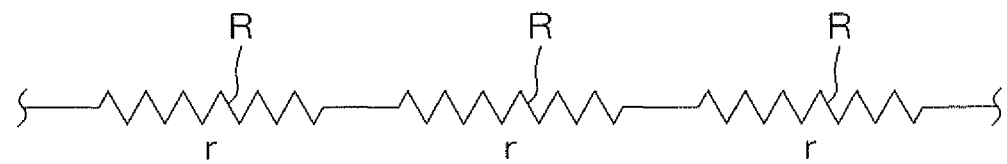
Figure 21C:
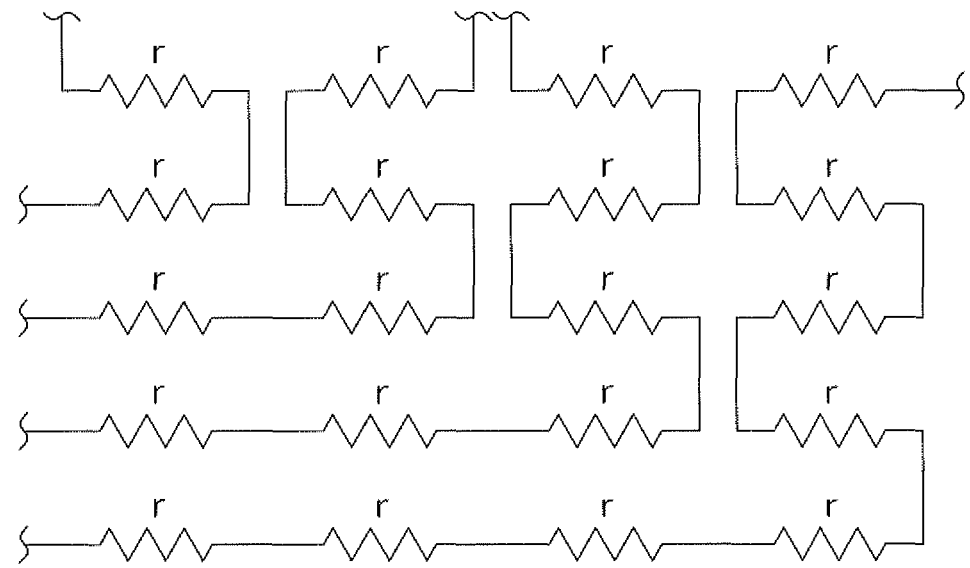

Electric features of the resistive element film line 220 and the conductor film pieces 221 arranged as above are represented by circuit symbols as shown in FIG. 21A to FIG. 21C. In more detail, the part of the resistive element film line 220 in each region having the predetermined interval R forms a unit resistive element R having a constant resistance value r as shown in FIG. 21A. A region of the resistive element film line 220 in which the conductor film piece 221 is stacked is short-circuited by the conductor film piece 221. Therefore, a resistive circuit consisting of the unit resistive elements R connected in series each of which has the resistance r shown in FIG. 21B is formed.

Additionally, adjoining resistive element film lines 220 are connected by resistive element film lines 220 and conductor film pieces 221, and therefore the resistor network of FIG. 20A forms the resistive circuit of FIG. 21C.

Here, an example of a process for manufacturing the resistor network 214 is described briefly. (1) The surface of the silicon substrate 211 is thermally oxidized, and a silicon dioxide (SiO$_2$) layer serving as an insulating layer 219 is formed. (2) Thereafter, the resistive element film 220 made of TiN or TiON or TiSiON is formed on the entire surface of the insulating layer 219 by means of sputtering. (3) Furthermore, the conductor film 221 made of aluminum (Al) is laid on the resistive element film 220 by means of sputtering. (4) Thereafter, the conductor film 221 and the resistive element film 220 are selectively removed by, for example, dry etching by use of a photolithography process, and an arrangement is obtained in which the resistive element film line 220 and the conductor film 221 each of which has a constant width and extends in the row-wise direction when viewed planarly are arrayed in the column-wise direction at constant intervals as shown in FIG. 20A. At this time, a region in which the resistive element film line 220 and the conductor film 221 are partially cut is formed. (5) Thereafter, the conductor film 221 laid on the resistive element film line 220 is selectively removed. As a result, an arrangement is obtained in which the conductor film piece 221 is laid on the resistive element film line 220 at constant intervals R. (6) Thereafter, a SiN film 222 serving as a protection film is deposited, and a polyimide layer 223 serving as a protective layer is laid thereon.

In the present embodiment, the unit resistive element R included in the resistor network 214 formed on the silicon substrate 211 includes the resistive element film line 220 and the conductor film pieces 221 laid on the resistive element film line 220 at constant intervals in the line direction, and a part of the resistive element film line 220 having a constant interval R on which the conductor film piece 21 is not laid, forms a single unit resistive element R. Every parts of the resistive element film line 220 that form the unit resistive elements R have same shape and size with each other. Therefore, based on the distinctive fact that the resistive element films that are formed on the substrate and that have the same shape and the same size are substantially the same in value, many unit resistive elements R arranged in a matrix on the silicon substrate 211 have the equal resistance value.

The conductor film piece 221 laid on the resistive element film line 220 forms the unit resistive element R, and also performs a role as a connection conductor film to form a resistive circuit by connecting a plurality of unit resistive elements R.

FIG. 22A is a partially-enlarged plan view of a region including a fuse film F depicted by enlarging a part of the plan view of the chip resistor 210 of FIG. 19, and FIG. 22B is a view showing a cross-sectional structure along line B-B of FIG. 22A.

As shown in FIG. 22A and FIG. 22B, the fuse film F is also formed by the conductor film 221 laid on the resistive element film 220. In more detail, it is made of aluminum (Al) that is the same metallic material as the conductor film piece 221 at the same layer as the conductor film piece 221 laid on the resistive element film line 220 forming a unit resistive element R. As described above, in order to form a resistive circuit, the conductor film piece 221 is used also as a connection conductor film C that electrically connects a plurality of unit resistive elements R.

In other words, in the same layer laid on the resistive element film 220, a conductor film for forming a unit resistive element R, a connection conductor film for forming a resistive circuit, a connection conductor film for forming a resistor network 214, a fuse film, and a conductor film that connects a resistor network 214 to the first connection electrode 212 and to the second connection electrode 213 are made by use of the same metallic material (e.g., aluminum) through the same manufacturing process (e.g., sputtering and photolithography process). This makes it possible to simplify the manufacturing process of the chip resistor 210 and makes it possible to simultaneously form various conductor films by using a shared mask. Additionally, alignment with the resistive element film 220 can be improved.

Figure 23:
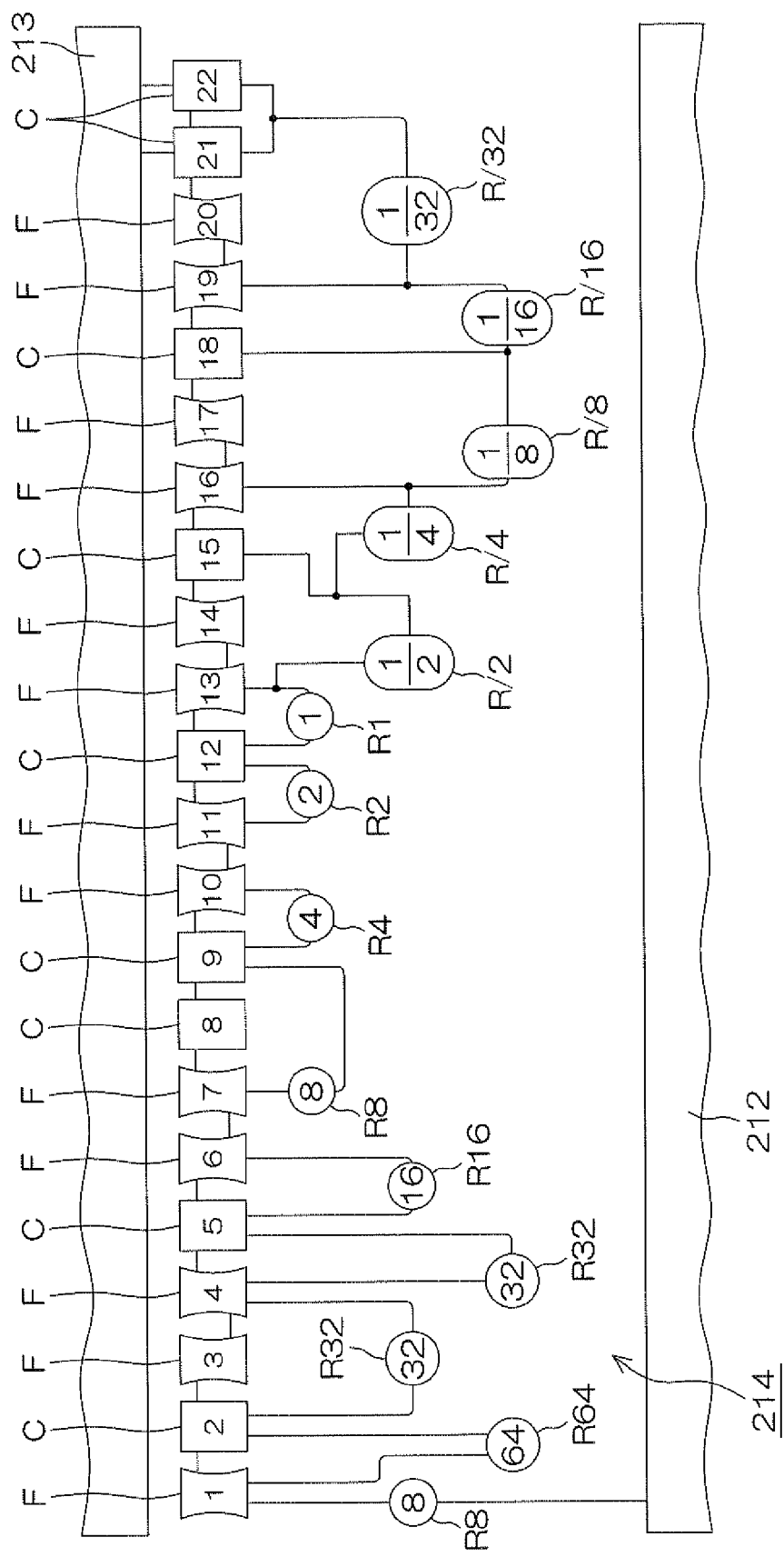
FIG. 23 is a view pictorially showing an array relationship between connection conductor films C that serve to connect a plurality of types of resistive unit elements and fuse films F in the resistor network 214 of FIG. 19 and pictorially showing a connection relationship between the connection conductor films C and the plurality of types of resistive unit elements connected to the fuse films F.

FIG. 23 is a view pictorially showing an array relationship between connection conductor films C that connect a plurality of types of resistive circuits and fuse films F in the resistor network 214 of FIG. 19 and pictorially showing a connection relationship between the connection conductor films C and the plurality of types of resistive circuits connected to the fuse films F. With reference to FIG. 23, one end of a reference resistive circuit R8 included in the resistor network 214 is connected to the first connection electrode 212. The reference resistive circuit R8 consists of eight unit resistive elements R connected in series, and the other end thereof is connected to the fuse film F1.

One end and the other end of a resistive circuit R64 consisting of sixty-four unit resistive elements R connected in series are connected to the fuse film F1 and to the connection conductor film C2, respectively. One end and the other end of a resistive circuit R32 consisting of thirty-two unit resistive elements R connected in series are connected to the connection conductor film C2 and to the fuse film F4, respectively. One end and the other end of a resistive circuit body R32 consisting of thirty-two unit resistive elements R connected in series are connected to the fuse film F4 and to the connection conductor film C5, respectively.

One end and the other end of a resistive circuit R16 consisting of sixteen unit resistive elements R connected in series are connected to the connection conductor film C5 and to the fuse film F6, respectively. One end and the other end of a resistive circuit R8 consisting of eight unit resistive elements R connected in series are connected to the fuse film F7 and the connection conductor film C9, respectively. One end and the other end of a resistive circuit R4 consisting of four unit resistive elements R connected in series are connected to the connection conductor film C9 and the fuse film F10, respectively.

One end and the other end of a resistive circuit R2 consisting of two unit resistive elements R connected in series are connected to the fuse film F11 and the connection conductor film C12, respectively. One end and the other end of a resistive circuit body R1 consisting of one unit resistive element R are connected to the connection conductor film C12 and the fuse film F13, respectively. One end and the other end of a resistive circuit R/2 consisting of two unit resistive elements R connected in parallel are connected to the fuse film F13 and the connection conductor film C15, respectively.

One end and the other end of a resistive circuit R/4 consisting of four unit resistive elements R connected in parallel are connected to the connection conductor film C15 and the fuse film F16, respectively. One end and the other end of a resistive circuit R/8 consisting of eight unit resistive elements R connected in parallel are connected to the fuse film F16 and the connection conductor film C18, respectively. One end and the other end of a resistive circuit R/16 consisting of sixteen unit resistive elements R connected in parallel are connected to the connection conductor film C18 and the fuse film F19, respectively.

One end and the other end of a resistive circuit R/32 consisting of thirty-two unit resistive elements R connected in parallel are connected to the fuse film F19 and the connection conductor film C22, respectively.

In the fuse films F and in the connection conductor films C, the fuse film F1, the connection conductor film C2, the fuse film F3, the fuse film F4, the connection conductor film C5, the fuse film F6, the fuse film F7, the connection conductor film C8, the connection conductor film C9, the fuse film F10, the fuse film F11, the connection conductor film C12, the fuse film F13, the fuse film F14, the connection conductor film C15, the fuse film F16, the fuse film F17, the connection conductor film C18, the fuse film F19, the fuse film F20, the connection conductor film C21, and the connection conductor film C22 are disposed linearly, and are connected in series. When each fuse film F is melted down, an electric connection between the melted-down fuse film F and the connection conductor film C adjacent to the fuse film F is cut off.

Figure 24:
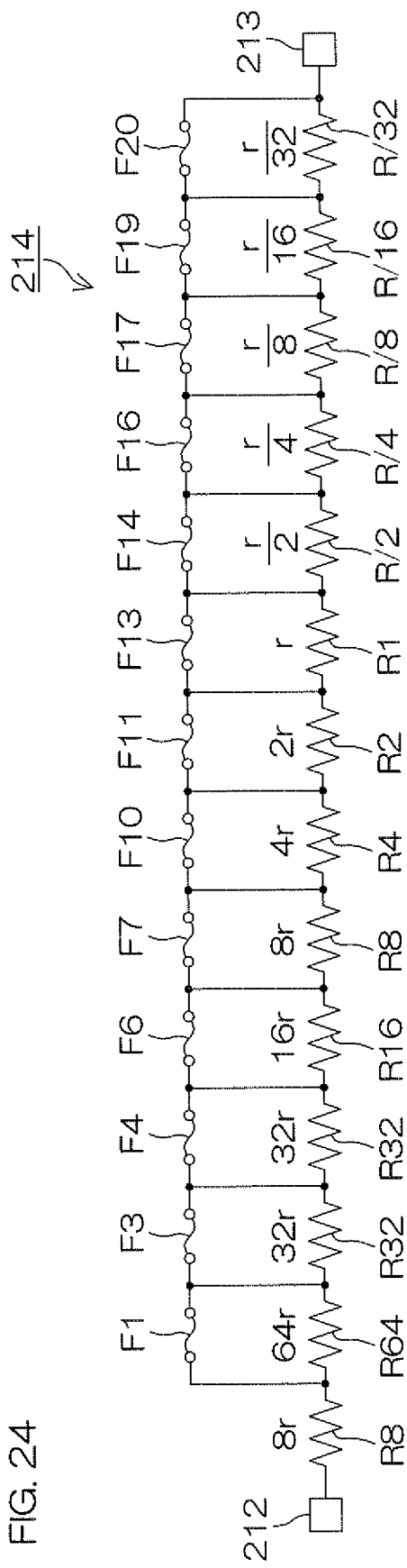
FIG. 24 is an electric circuit diagram of the resistor network 214.

This arrangement is illustrated in the form of an electric circuit diagram in FIG. 24. In detail, in a state in which none of the fuse films F is fused, the resistor network 214 forms a resistive circuit consisting of the reference resistive circuit R8 (resistance value: 8r) consisting of the eight unit resistive elements R connected in series between the first connection electrode 212 and the second connection electrode 213. For example, if the resistance value r of a single unit resistive element R is r=80Ω, the chip resistor 210 is arranged by a resistive circuit of 8r=640Ω to which the first connection electrode 212 and the second connection electrode 213 are connected.

The fuse films F are connected to the plurality of types of resistive circuits, respectively, excluding the reference resistive circuit R8 in parallel, and the plurality of types of resistive circuits are brought into short-circuited states by the respective fuse films F. In detail, although thirteen resistive circuits R64 to R/32 of twelve types are connected in series to the reference resistive circuit R8, each resistive circuit is short-circuited by the fuse film F connected in parallel, and hence, electrically, the respective resistive circuits are not incorporated in the resistor network 214.

In the chip resistor 210 according to the present embodiment, the fuse film F is selectively fused, for example, by laser light in accordance with a required resistance value. As a result, the resistive circuit connected in parallel with the fuse film F that has been fused is incorporated into the resistor network 214. Therefore, the resistor network 214 can be made into a resistor network in which its overall resistance value reaches a resistance value resulting from the fact that the resistive circuits corresponding to the fused fuse films F are connected in series and are incorporated therein.

In other words, in the chip resistor 210 according to the present embodiment, the plurality of types of resistive circuits (for example, the serial connection of the resistive circuits R64, R32, and R1 when the fuses F1, F4, and F13 are fused) can be incorporated into the resistor network by selectively fusing the fuse films corresponding to the plurality of types of resistive circuits. The respective resistance values of the plurality of types of resistive circuits are predetermined, and therefore the chip resistor 210 can be made to have a required resistance value by adjusting the resistance value of the resistor network 214, so to speak, in a digital manner.

Also, the plurality of types of resistive circuits include the plurality of types of serial resistive circuits, in which the unit resistive elements R having an equal resistance value are connected in series with the number of unit resistive elements R being increased in geometric progression as 1, 2, 4, 8, 16, 32, and 64, and the plurality of types of parallel resistive circuits, in which the unit resistive elements R having an equal resistance value are connected in parallel with the number of unit resistive elements R being increased in geometric progression as 2, 4, 8, 16, and 32. These are connected in series in a state of being short-circuited by the fuse films F. Therefore, the resistance value of the resistor network 214 as a whole can be set at an arbitrary resistance value within a wide range from a small resistance value to a large resistance value by selectively fusing the fuse films F.

Figure 25:
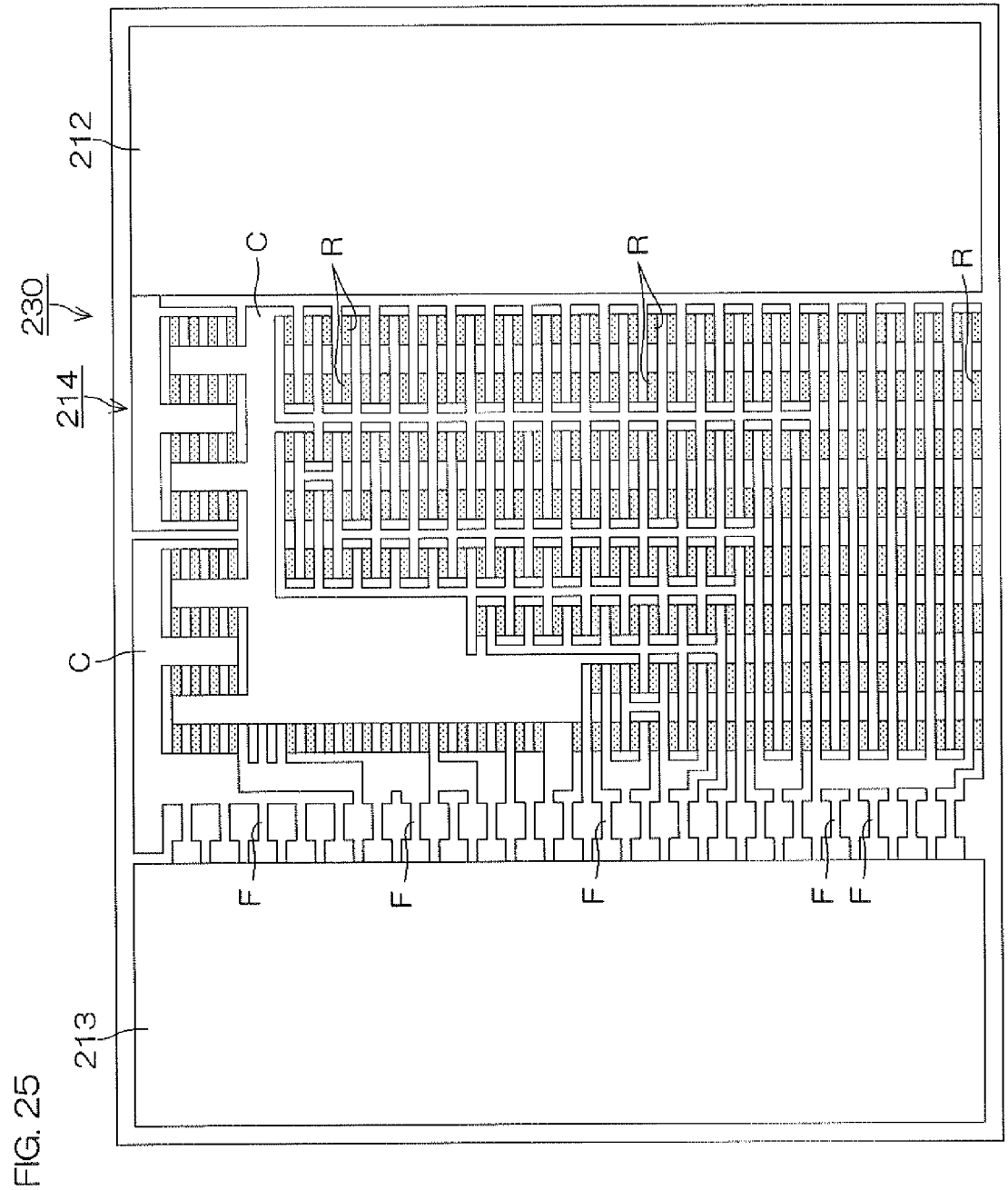
FIG. 25 is a plan view of a chip resistor 230, and shows an arrangement relationship among the first connection electrode 212, the second connection electrode 213, and the resistor network 214, and shows a planarly-viewed layout pattern of the resistor network 214.

FIG. 25 is a plan view of a chip resistor 230 according to another embodiment of the second invention, and shows an arrangement relationship among the first connection electrode 212, the second connection electrode 213, and the resistor network 214, and shows a planarly-viewed arrangement of the resistor network 214. The chip resistor 230 differs from the chip resistor 210 described above in the mode of connection of the unit resistive elements R in the resistor network 214.

In detail, the resistor network 214 of the chip resistor 230 has many unit resistive elements R having an equal resistance value and being arrayed in a matrix on the silicon substrate (the arrangement of FIG. 25 is an arrangement with a total of 352 unit resistive elements R with 8 unit resistive elements R being arrayed along the row-wise direction (longitudinal direction of the silicon substrate) and 44 unit resistive elements R being arrayed along the column-wise direction (width direction of the silicon substrate)). A predetermined number of unit resistive elements R, i.e., one to 128 of the many unit resistive elements R are electrically connected to form a plurality of types of resistive circuits. The plurality of types of resistive circuits are connected in a parallel mode by conductor films serving as network connection means and by the fuse films F. The plurality of fuse films F are arrayed along the inner side of the second connection electrode 213 so that the arrangement region thereof is rectilinear, and, when a fuse film F is fused, the resistive circuit connected to the fuse film is electrically separated from the resistor network 214.

The structure of the many unit resistive elements R forming the resistor network 214, and the structures of the connection conductor films and fuse films F are the same as the structures of the corresponding portions in the chip resistor 210, and therefore a description of these is omitted here.

Figure 26:
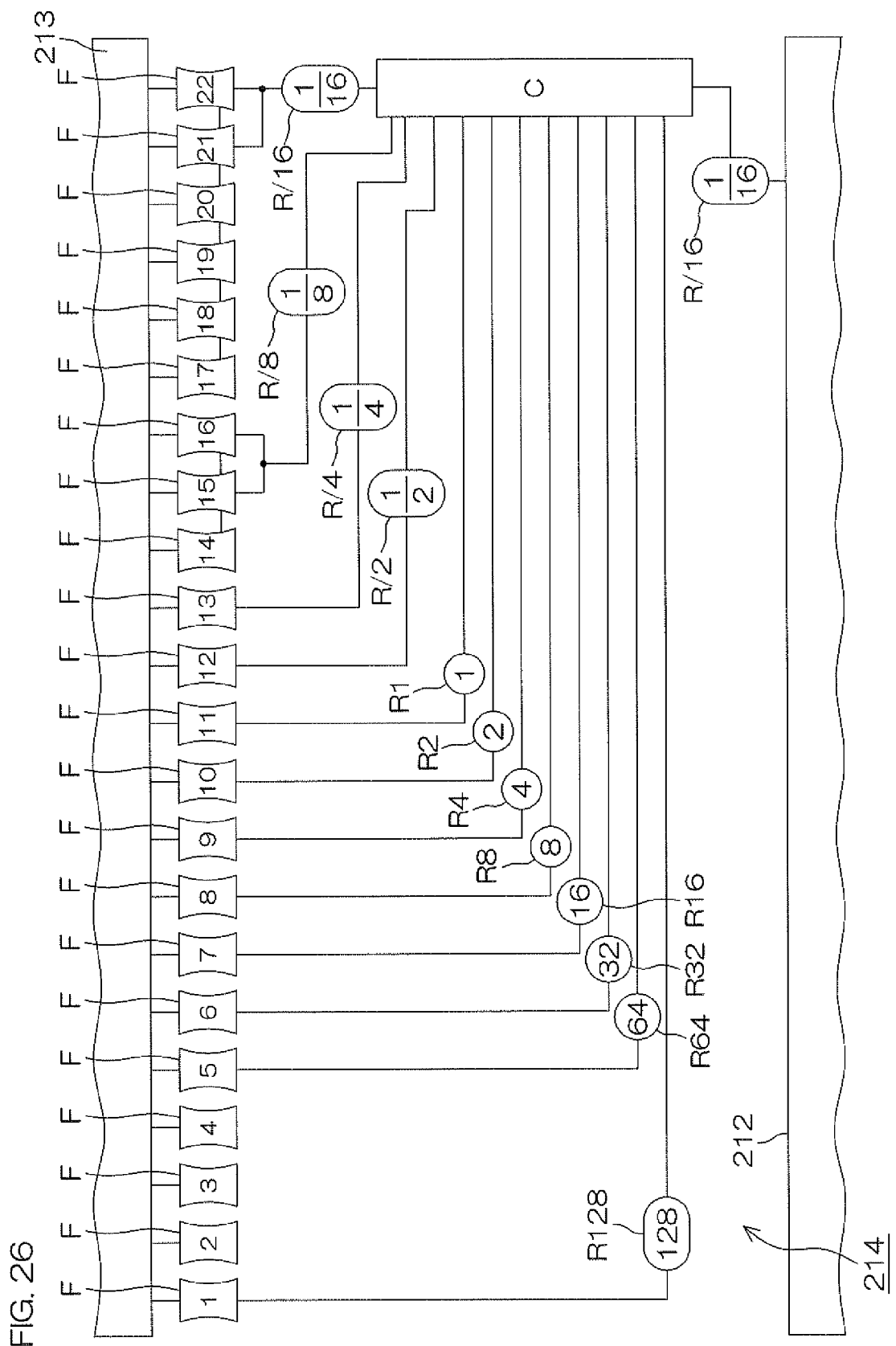
FIG. 26 is a view pictorially showing an arrangement relationship between connection conductor films C that serve to connect a plurality of types of resistive unit elements and fuse films F in the resistor network 214 of FIG. 25 and pictorially showing a connection relationship between the connection conductor films C and the plurality of types of resistive unit elements connected to the fuse films F.

FIG. 26 is an illustrative diagram of a connection mode of the plurality of types of resistive circuits in the resistor network shown in FIG. 25, an array relationship of the fuse films F connecting the resistive circuits, and a connection relationship of the plurality of types of resistive circuits connected to the fuse films F.

Referring to FIG. 26, one end of a reference resistive circuit R/16 included in the resistor network 214 is connected to the first connection electrode 212. The reference resistive circuit R/16 is formed by a parallel connection of 16 unit resistive elements R and the other end thereof is connected to the connection conductor film C to which the remaining resistive circuits are connected. One end and the other end of the resistive circuit R128 formed by a serial connection of 128 unit resistive elements R are connected to the fuse film F1 and the connection conductor film C, respectively.

One end and the other end of the resistive circuit R64 formed by a serial connection of 64 unit resistive elements R are connected to the fuse film F5 and the connection conductor film C, respectively. One end and the other end of the resistive circuit R32 formed by a serial connection of 32 unit resistive elements R are connected to the fuse film F6 and the connection conductor film C, respectively. One end and the other end of the resistive circuit R16 formed by a serial connection of 16 unit resistive elements R are connected to the fuse film F7 and the connection conductor film C, respectively.

One end and the other end of the resistive circuit R8 formed by a serial connection of 8 unit resistive elements R are connected to the fuse film F8 and the connection conductor film C, respectively. One end and the other end of the resistive circuit R4 formed by a serial connection of 4 unit resistive elements R are connected to the fuse film F9 and the connection conductor film C, respectively. One end and the other end of the resistive circuit R2 formed by a serial connection of 2 unit resistive elements R are connected to the fuse film F10 and the connection conductor film C, respectively.

One end and the other end of the resistive circuit R1 formed by a serial connection of a single unit resistive element R are connected to the fuse film F11 and the connection conductor film C, respectively. One end and the other end of the resistive circuit R/2 formed by a parallel connection of 2 unit resistive elements R are connected to the fuse film F12 and the connection conductor film C, respectively. One end and the other end of the resistive circuit R/4 formed by a parallel connection of 4 unit resistive elements R are connected to the fuse film F13 and the connection conductor film C, respectively.

The fuse films F14, F15, and F16 are electrically connected together, and one end and the other end of the resistive circuit R/8 formed by a parallel connection of 8 unit resistive elements R are connected to the fuse films F14, F15, and F16 and the connection conductor film C. The fuse films F17, F18, F19, F20, and F21 are electrically connected together, and one end and the other end of the resistive circuit R/16 formed by a parallel connection of 16 unit resistive elements R are connected to the fuse films F17 to F21 and the connection conductor film C.

The twenty-one fuse films F, i.e., the fuse films F1 to F21 are provided, and all of these fuse films are connected to the second connection electrode 213. As a result of this arrangement, a resistive circuit having one end connected to any one of the fuse films F is electrically disconnected from the resistor network 214 when the fuse film F to which the end of the resistive circuit is connected is fused.

Figure 27:
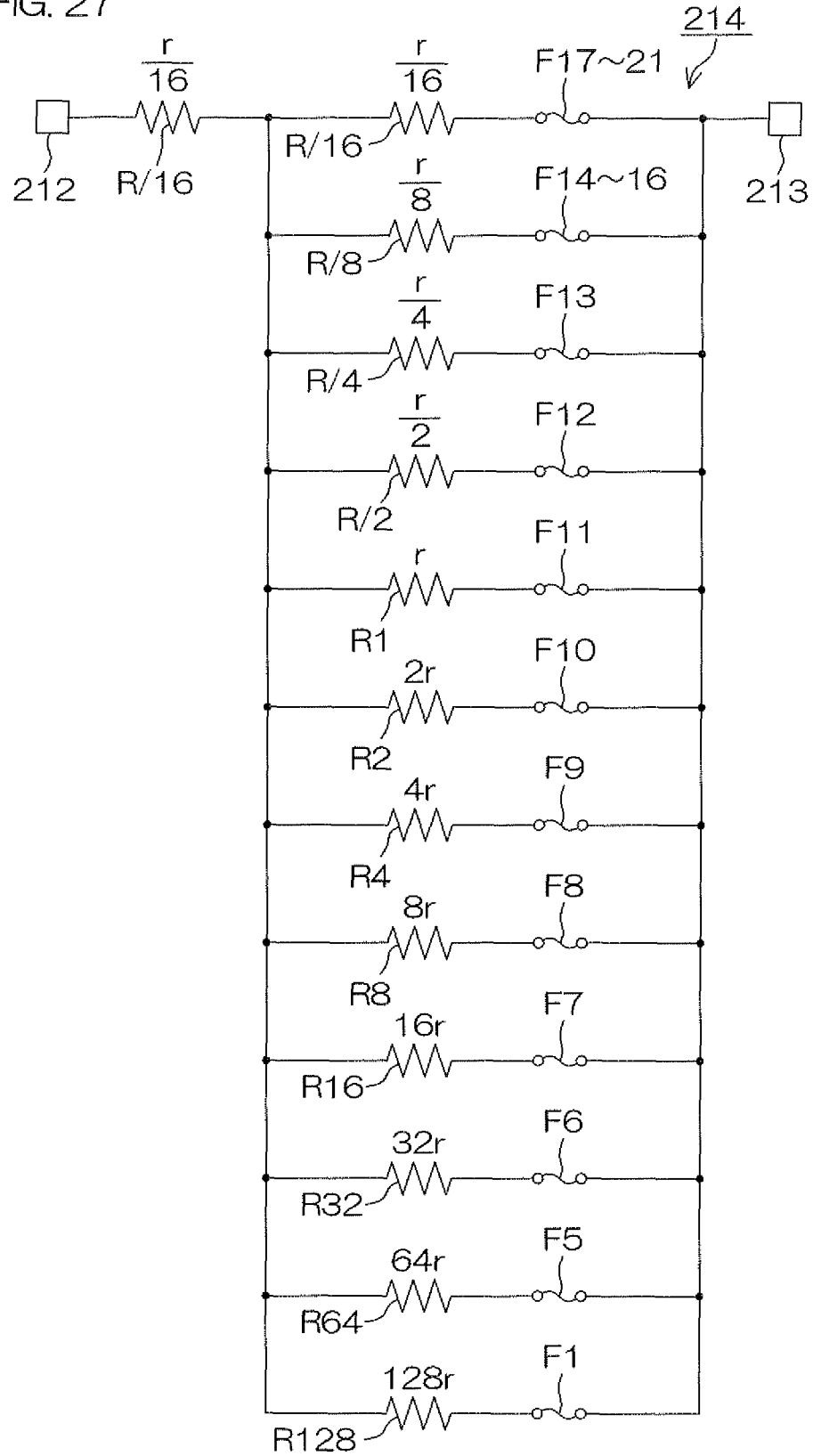
FIG. 27 is an electric circuit diagram of the resistor network 214.

The arrangement of FIG. 26, i.e., the arrangement of the resistor network 214 included in the chip resistor 230 is illustrated in the form of an electric circuit diagram in FIG. 27. In a state in which none of the fuse films F is fused, the resistor network 214 forms, between the first connection electrode 214 and the second connection electrode 213, a serial connection circuit of the reference resistive circuit R/16 and the parallel connection circuit of the 12 types of resistive circuits R/16, R/8, R/4, R/2, R1, R2, R4, R8, R16, R32, R64, and R128.

The fuse film F is serially connected to each of the 12 types of resistive circuits excluding the reference resistive circuit R/16. Therefore, in the chip resistor 230 having the resistor network 214, by selectively fusing a fuse film F, for example, with laser light in accordance with a required resistance value, the resistive circuit corresponding to the fused fuse film F (the resistive circuit connected in series to the fuse film F) is electrically separated from the resistor network 214, and the resistance value of the chip resistor 230 can thereby be adjusted.

In other words, in the chip resistor 230 according to the present embodiment, a plurality of types of resistive circuits can be electrically separated from the resistor network by selectively fusing the fuse films corresponding to the plurality of types of resistive circuits. The respective resistance values of the plurality of types of resistive circuits are predetermined, and therefore the chip resistor 230 can be made to have a required resistance value by adjusting the resistance value of the resistor network 214, so to speak, in a digital manner.

Also, the plurality of types of resistive circuits include the plurality of types of serial resistive circuits, in which the unit resistive elements R having an equal resistance value are connected in series with the number of unit resistive elements R being increased in geometric progression as 1, 2, 4, 8, 16, 32, 64, and 128, and the plurality of types of parallel resistive circuits, in which the unit resistive elements R having an equal resistance value are connected in parallel with the number of unit resistive elements R being increased in geometric progression as 2, 4, 8, and 16. Therefore, the resistance value of the resistor network 214 as a whole can be set at an arbitrary resistance value finely and digitally by selectively fusing the fuse films F.

In the electric circuit shown in FIG. 27, there is a tendency for an overcurrent to flow through the reference resistive circuit R/16 and the resistive circuits having low resistance values among the parallel connection resistive circuits, and the rated current that can be made to flow through the resistances must be designed to be large in setting the resistances. Therefore, to disperse the current, the connection structure of the resistor network may be changed to change the electric circuit shown in FIG. 27 to that shown in FIG. 28A. In detail, the reference resistive circuit R/16 is eliminated and the circuit is changed to include an arrangement 340 in which the resistive circuits that are connected in parallel have a minimum resistance value of r and in which a plurality of resistive unit elements R1 with the resistance value r are connected in parallel.

Figure 28:
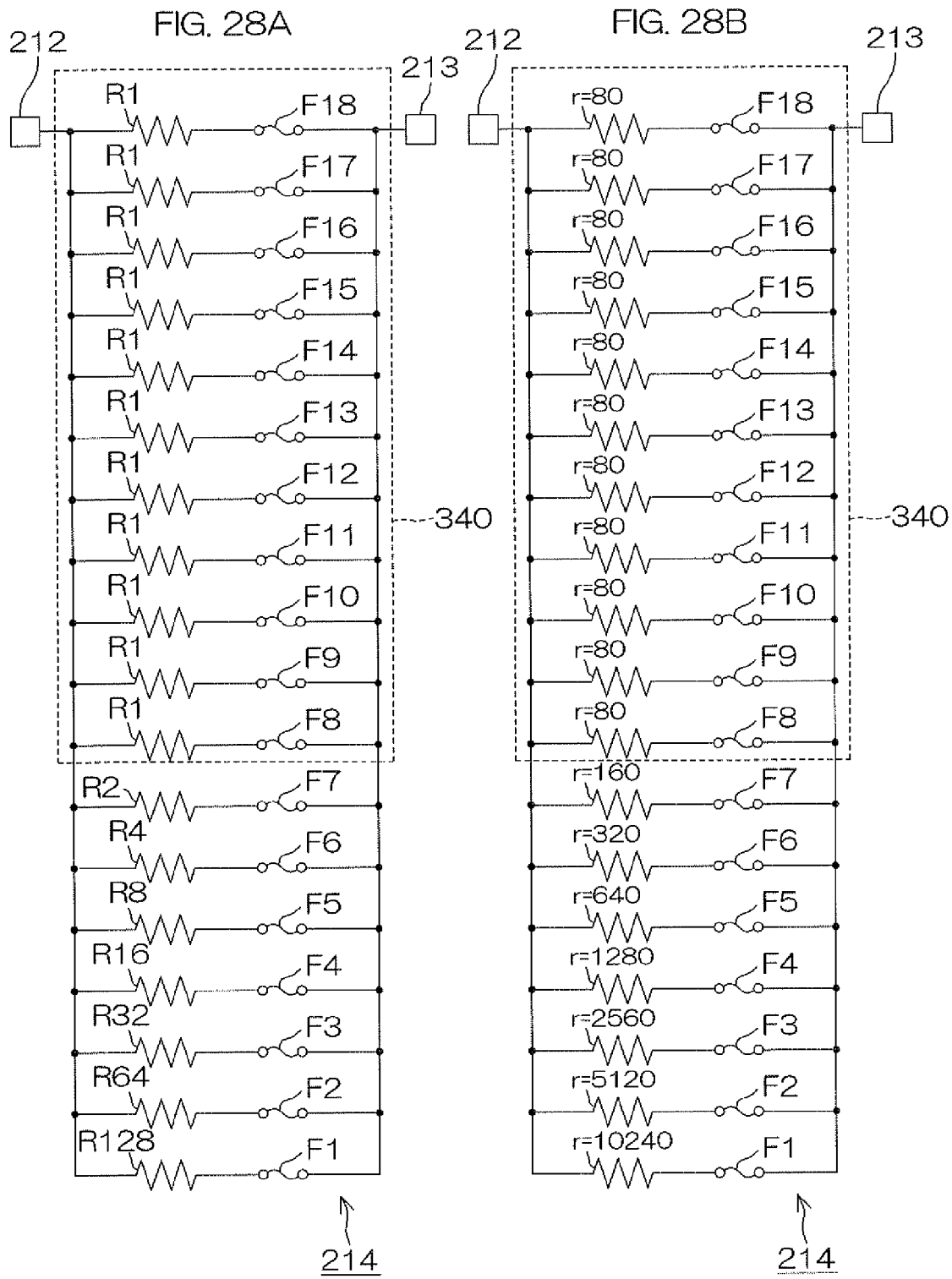
FIG. 28A and FIG. 28B are electric circuit diagrams showing a modification of an electric circuit shown in FIG. 27.

FIG. 28B is an electric circuit diagram in which specific resistance values are indicated, and shows a circuit that includes the arrangement 340 where a plurality of sets of serial connections of a unit resistive element of 80Ω and a fuse film F are connected in parallel. Dispersion of the current that flows can thereby be achieved.

Figure 29:
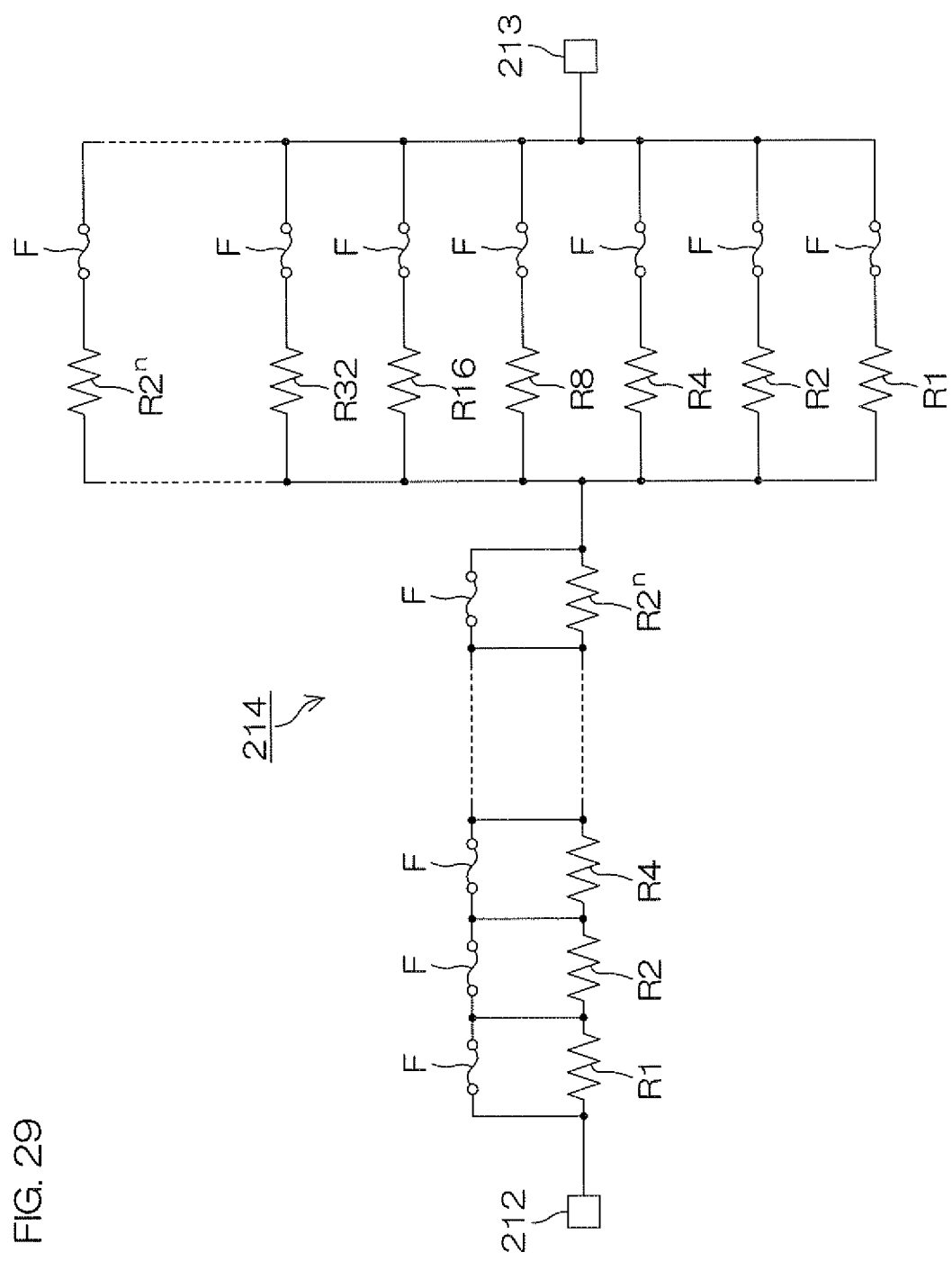
FIG. 29 is an electric circuit diagram of the resistor network 214 according to another embodiment of the second invention.

FIG. 29 is an electric circuit diagram of the circuit arrangement of the resistor network 214 included in a chip resistor according to still another embodiment of the present invention. A feature of the resistor network 214 shown in FIG. 29 is that it has a circuit arrangement where a serial connection of a plurality of types of resistive circuits and a parallel connection of a plurality of types of resistive circuits are connected in series.

As in the embodiment described above, in the plurality of types of resistive circuits connected in series, a fuse film F is connected in parallel to each resistive circuit and all of the plurality of types of resistive circuits that are connected in series are brought into short-circuited states by the fuse films F. Therefore, when a fuse film F is fused, the resistive circuit short-circuited by the fuse film F is electrically incorporated into the resistor network 214. On the other hand, a fuse film F is connected in series to each of the plurality of types of resistive circuits that are connected in parallel. Therefore, the resistive circuit to which the fuse film F is connected in series can be electrically disconnected from the parallel connection of resistive circuits by fusing the fuse film F.

With this arrangement, for example, a low resistance of not more than 1 kΩ can be formed at the parallel connection side, and a resistive circuit of not less than 1 kΩ can be formed at the serial connection side. Therefore, resistive circuits of a wide range from a low resistance of several Ω to a high resistance of several MΩ can be formed using the resistor networks 214 arranged with equal basic designs. Additionally, when the resistance value is set more precisely, if the fuse film of a serial-connection-side resistive circuit that is close in resistance value to a required resistance value is cut in advance, the resistance value can be finely adjusted by fusing the fuse films of the resistive circuits at the parallel connection side to improve the precision of adjustment to a desired resistance value.

Figure 30:
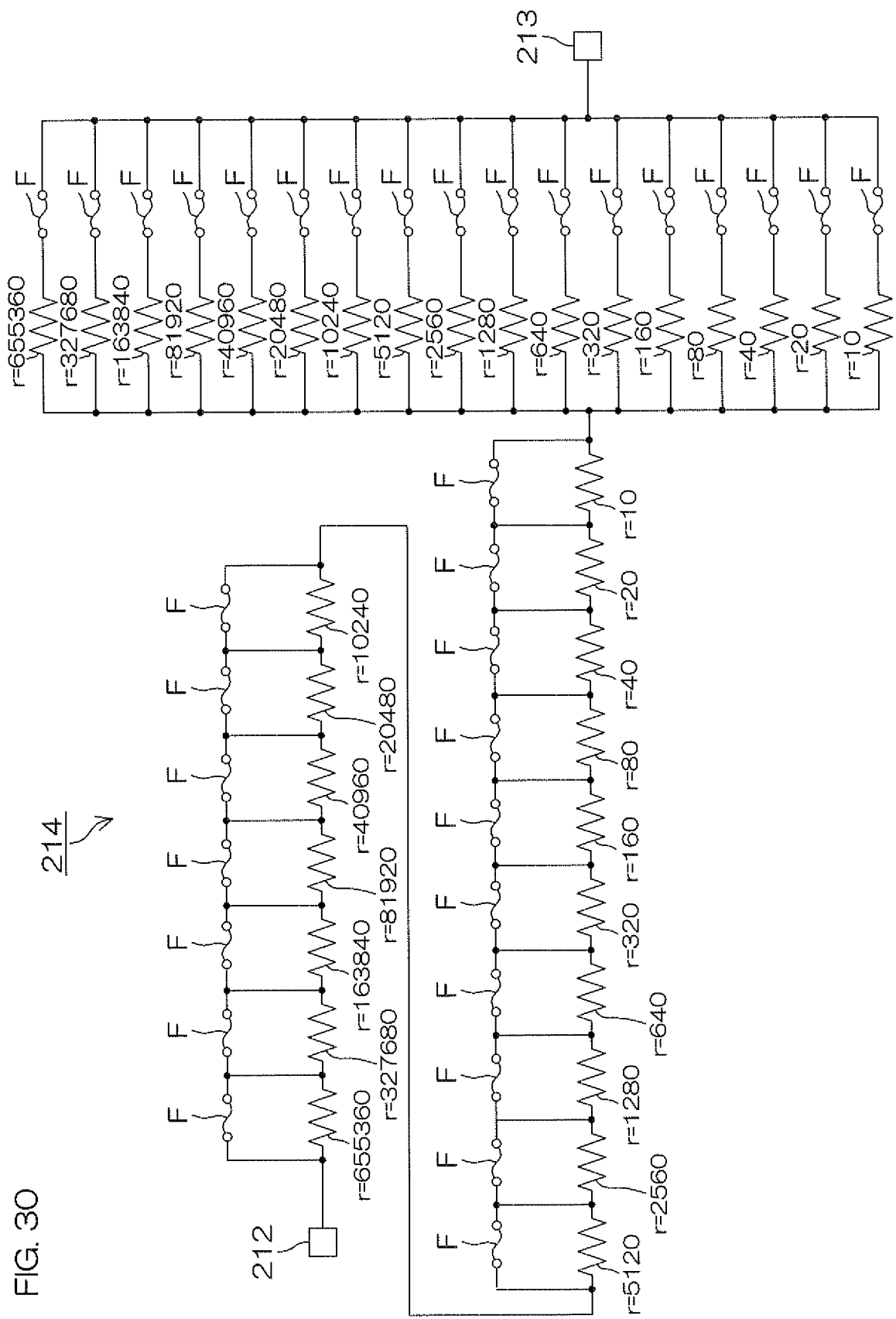
FIG. 30 is an electric circuit diagram showing an arrangement example of a resistor network in a chip resistor that indicates specific resistance values.

FIG. 30 is an electric circuit diagram of a specific arrangement example of the resistor network 214 in a chip resistor having a resistance value in the range of 10Ω to 1 MΩ. The resistor network 214 shown in FIG. 30 also has the circuit arrangement in which a serial connection of a plurality of types of resistive circuits short-circuited by the fuse films F and a parallel connection of a plurality of types of resistive circuits serially connected to the fuse films F are connected in series.

With the resistive circuit of FIG. 30, an arbitrary resistance value of 10 to 1 kΩ can be set within a precision of 1% at the parallel connection side. Additionally, an arbitrary resistance value of 1 k to 1 MΩ can be set within a precision of 1% at the serial connection side circuit. When the serial connection side circuit is used, the advantage of being capable of setting the resistance value with higher precision is provided by fusing in advance the fuse film F of the resistive circuit close to a desired resistance value and then adjusting to the desired resistance value.

Although only cases where the same layer is used for the fuse films F as that used for the connection conductor films C have been described, the portion of the connection conductor film C may have another conductor film laid further thereon to decrease the resistance value of the conductor films. Even in this case, the fusing property of the fuse films F is not degraded as long as the conductor film is not laid on the fuse films F.

Figure 31A:
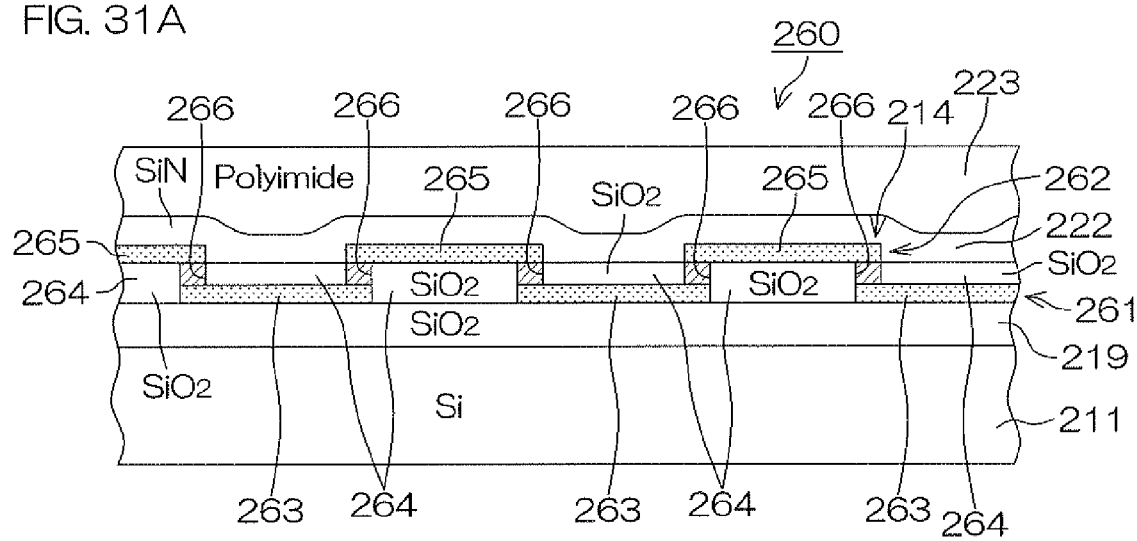
FIG. 31A is a pictorial cross-sectional view showing a structure of a main part of a chip resistor 260 according to still another embodiment of the second invention.
Figure 31B:
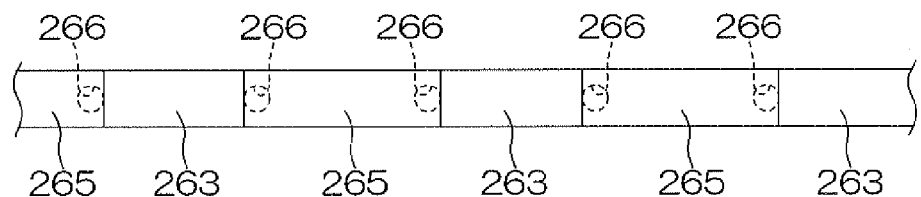
FIG. 31B is a pictorial plan view of FIG. 31A.
Figure 31C:
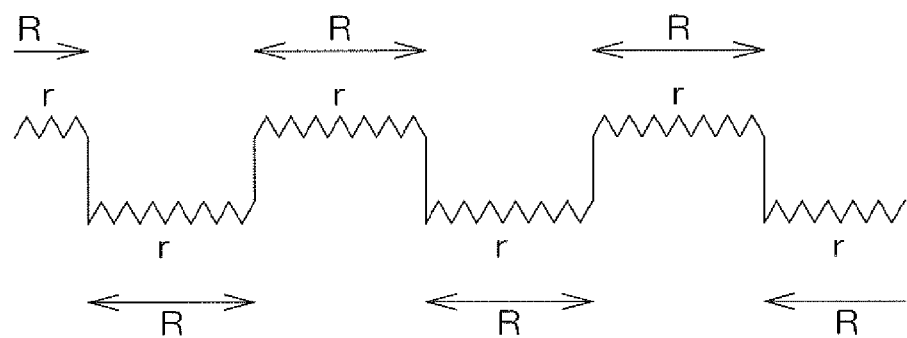
FIG. 31C is a circuit diagram of the chip resistor 260 of FIG. 31A.

FIG. 31A is a pictorial cross-sectional view showing a structure of a main part of a chip resistor 260 according to still another embodiment of the second invention. FIG. 31B is a pictorial plan view of FIG. 31A. FIG. 31C is a circuit diagram of the chip resistor 260 of FIG. 31A.

A feature of the chip resistor 260 is that the resistor network 214 has a two-layer structure consisting of the first resistive circuit 261 and the second resistive circuit 262. In detail, for example, the chip resistor 260 has a silicon substrate 211, and an insulating layer (SiO$_2$) 219 is formed on the upper surface thereof, and a first resistive element film 263 is disposed on the insulating layer 219. The first resistive element film 263 is made of TiN or TiON or TiSiON. The first resistive element film 263 has a layout arrangement in which unit resistive element films, each of which is a planarly-viewed longitudinal strip-shaped film having a predetermined width (e.g., about 1.5 μm) and a predetermined length (e.g., about 8 to 15 μm), are arrayed at constant intervals in the length direction. An insulating layer (SiO$_2$) 264 is formed in such a manner as to cover the first resistive element film 263. A second resistive element film 265 is disposed on the insulating layer 264 in such a manner as to be alternated with the first resistive element film 263. The second resistive element film 265 is made of TiN or TiON or TiSiON.

The second resistive element film 265 has a layout in which unit resistive element films, each of which is a planarly-viewed longitudinal strip-shaped film having the same width and the same length as the first resistive element film 263, are arrayed at constant intervals in the length direction. In the chip resistor 260 shown in FIG. 31A to FIG. 31C, the second resistive element film 265 is laid to be placed above a position at which the first resistive element film 263 is not present. When viewed in the length direction of the resistive element film, the first resistive element film 263 and the second resistive element film 265 are arrayed alternately. Preferably, the first resistive element film 263 and the second resistive element film 265 are disposed to intersect each other or to be parallel to each other.

Lengthwise both ends of the first resistive element film 263 and lengthwise both ends of the second resistive element film 265 have end regions facing each other in the up-down direction, and the end region of the first resistive element film 263 and that of the second resistive element film 265 are electrically connected together by means of vias 266 formed in the insulating layer 264. The inside of the via 266 is filled with, for example, aluminum. The upper part of the second resistive element film 265 is covered with, for example, a SiN film 222 serving as a protection film, and a polyimide layer 223 that is a protective layer is additionally laid thereon.

Because of this arrangement, a partial resistive circuit of the chip resistor 260 shown in FIG. 31A and FIG. 31B is represented in the form of a circuit diagram shown in FIG. 31C, for example, if each of the first resistive element film 263 and the second resistive element film 265 forms a unit resistive element R having a resistance value of r. The resistor network 214 of the chip resistor 260 is made to have a two-layer structure consisting of the first resistive circuit 261 and the second resistive circuit 262 as described above, and, as a result, the resistance value of the chip resistor 260 can be raised to about two times without increasing the arrangement area of the resistor network 214.

More specifically, the first resistive element film 263 disposed at the lower layer and the second resistive element film 265 disposed at the upper layer are connected together in series one by one, and, as a result, the resistance value of the resistor network 214 can be approximately doubled. In the chip resistor 260 shown in FIG. 31A to FIG. 31C, a description has been given of the fact that the resistor network 214 has a two-layer structure consisting of the first resistive circuit 261 and the second resistive circuit 262. However, the resistor network 214 may have a multi-layer structure of three or more layers without being limited to the two-layer structure of the resistive circuit. As a result, the resistance value of the resistor network 214 can be raised more greatly than in the case of a single-layer resistive circuit.

Other arrangements in the chip resistor 260, such as the inclusion of fuse films, are the same as the arrangements of the chip resistor 210 according to the foregoing embodiment described with reference to FIGS. 19, 22, 23, and so on.

Figure 32:
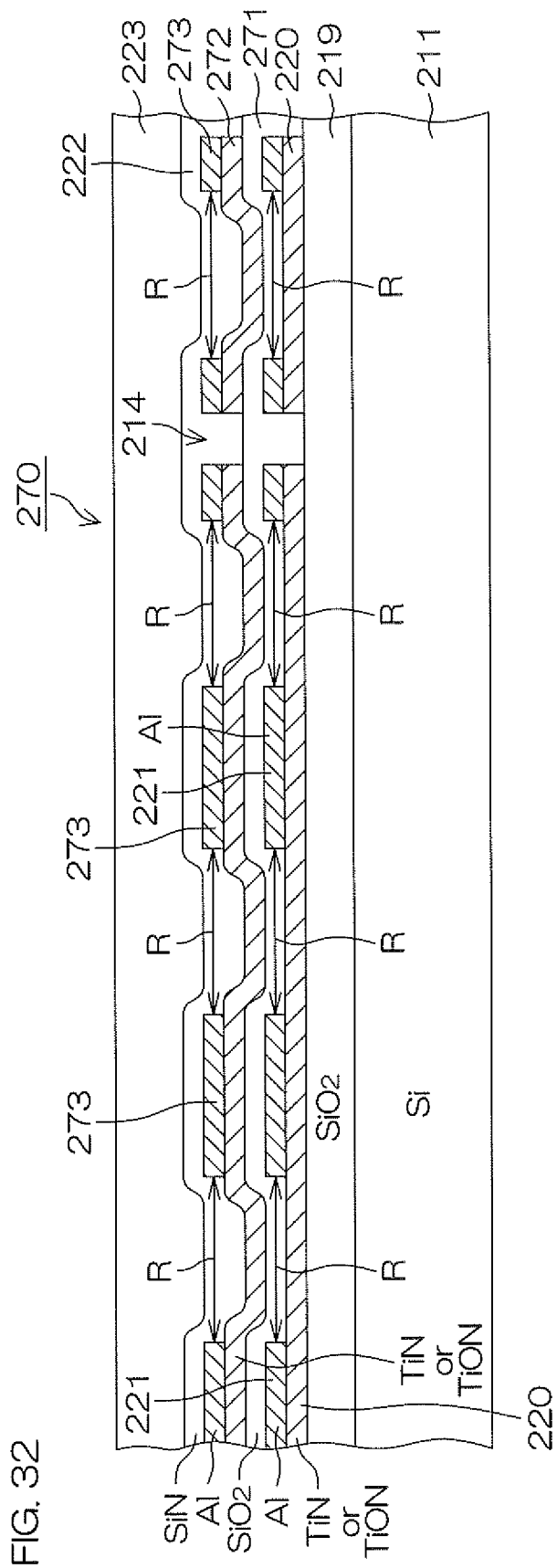
FIG. 32 is a pictorial longitudinal sectional view showing a structure of a main part of a chip resistor 270 according to still another embodiment of the second invention.
Figure 33:
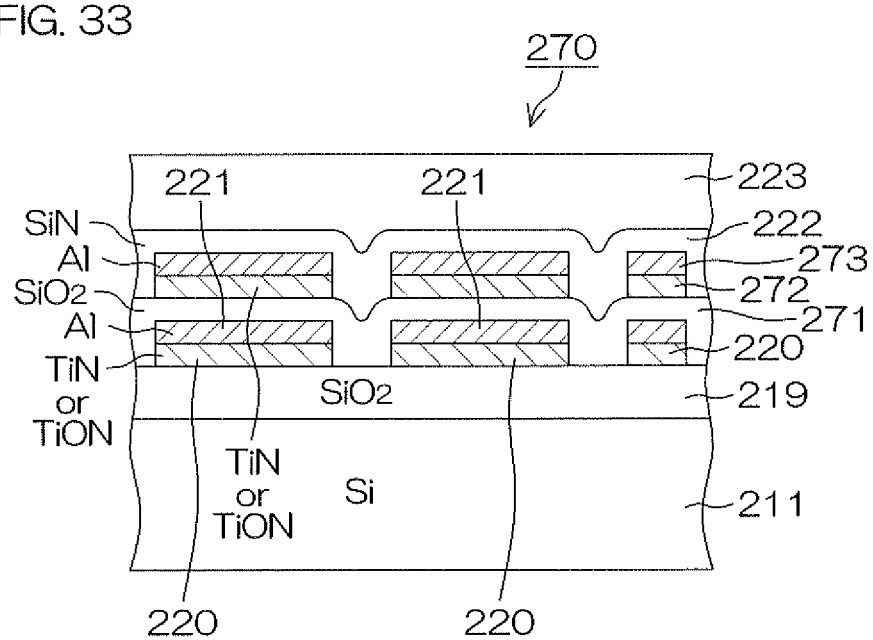
FIG. 33 is a pictorial longitudinal sectional view showing a structure of a main part of the chip resistor 270 according to still another embodiment of the second invention.

FIG. 32 and FIG. 33 are pictorial longitudinal sectional views showing a structure of a main part of a chip resistor 270 according to still another embodiment of the second invention. FIG. 32 and FIG. 33 are longitudinal sectional views drawn in comparison with FIG. 20B and FIG. 20C, respectively, and show constructional differences with the chip resistor 210 shown in FIG. 19.

With reference to FIG. 32 and FIG. 33, a feature of the chip resistor 270 is that the resistive element film included in the resistor network 214 is not a single-layer structure but a two-layer structure. In detail, an insulating layer (SiO$_2$) 219 is formed, for example, on the upper surface of the silicon substrate 211 serving as a base layer, and the first resistive element film 220 is disposed on the insulating layer 219. The first resistive element film 220 is made of TiN or TiON or TiSiON. The first resistive element film 220 is provided in the form of a plurality of resistive element films that linearly extend in parallel (hereinafter, referred to as a "resistive element film line"), and there is a case in which the first resistive element film line 220 is cut at a predetermined position in the line direction. An aluminum film serving as a first conductor film piece 221 is laid on the first resistive element film line 220. Each first conductor film piece 221 is laid on the first resistive element film line 220 at constant intervals R in the line direction.

An insulating layer 271 made of SiO$_2$ serving as an interlayer insulating film is formed in such a manner as to cover the first resistive element film line 220 and the first conductor film piece 221. A second resistive element film 272 is disposed on the insulating layer 271. The second resistive element film 272 is made of TiN or TiON or TiSiON. The layout of the second resistive element film 272 is made to be exactly the same as the layout of the first resistive element film 220, and a layout arrangement is made in which both are overlapped with each other when viewed planarly. The second resistive element film 272 is also provided in the form of a plurality of resistive element films that linearly extend in parallel (hereinafter, referred to as a "resistive element film line"), and there is a case in which the second resistive element film line 272 is cut at a predetermined position in the line direction in the same way as the first resistive element film line 220. An aluminum film serving as a second conductor film piece 273 is laid on the second resistive element film line 272. Each second conductor film piece 273 is laid on the second resistive element film line 272 at constant intervals R in the line direction.

A SiN film 222 serving as a protection film is deposited on the second resistive element film line 272 and on the second conductor film piece 273, and a polyimide layer 223 that is a protective layer is additionally laid thereon. The chip resistor 270 has this structure, and hence a plurality of types of resistive circuits included in the resistor network 214 include a two-layer structure consisting of a first layer, which consists of the first resistive element film line 220 and the first conductor film piece 221, and a second layer, which consists of the second resistive element film line 272 and the second conductor film piece 273. The resistive circuit of the first layer and the resistive circuit of the second layer have exactly the same layout pattern. Therefore, an arrangement is formed in which the plurality of types of resistive circuits are stacked in the up-down direction so as to be paired with each other. In the plurality of types of resistive circuits, the resistive circuit of the first layer and the resistive circuit of the second layer are connected in series in each resistive circuit, without allowing the resistive elements of the first and second layers to be connected in series in each unit resistive element R.

As a result, the plurality of types of resistive circuits included in the resistor network 214 are resistive circuits each of which has a resistance value twice as large as that of the first embodiment (the chip resistor 210) described with reference to FIG. 19 to FIG. 24. As a result, the chip resistor 270 can be made to have a resistance value twice as large as that of the chip resistor 210 of the first embodiment. The chip resistor 270 can be made into a chip resistor that is high in resistivity and that is capable of digitally adjusting the resistance value to a desired resistance value.

In order to raise the resistance value to an even higher resistance value in the chip resistor 270 described with reference to FIG. 32 and FIG. 33, it is possible to employ an arrangement in which the first conductor film piece 221 of the first layer or the second conductor film piece 273 of the second layer is not provided. In other words, for example, when the first conductor film piece 221 is not provided in the first resistive element film line 220 of the first layer, it is possible to make the resistive element film line 220 to have a high resistance value while lengthening a first resistive element film line. Therefore, the resistance value can be raised higher than in an arrangement in which unit resistive elements R are connected in series.

Likewise, with regard to the second resistive element film line 272, the resistance value of the resistive circuit of the second layer can be raised by employing an arrangement in which the second conductor film piece 273 is not provided. As a whole, the increase of resistivity of the chip resistor 270 can be accomplished. The chip resistor 270 according to the aforementioned embodiment is not limited to the resistive circuit of a two-layer structure consisting of a first layer and a second layer. It is also possible to provide a resistive circuit having a multilayer structure of three or more layers and to further heighten the resistivity of the chip resistor 270.

Figure 34:
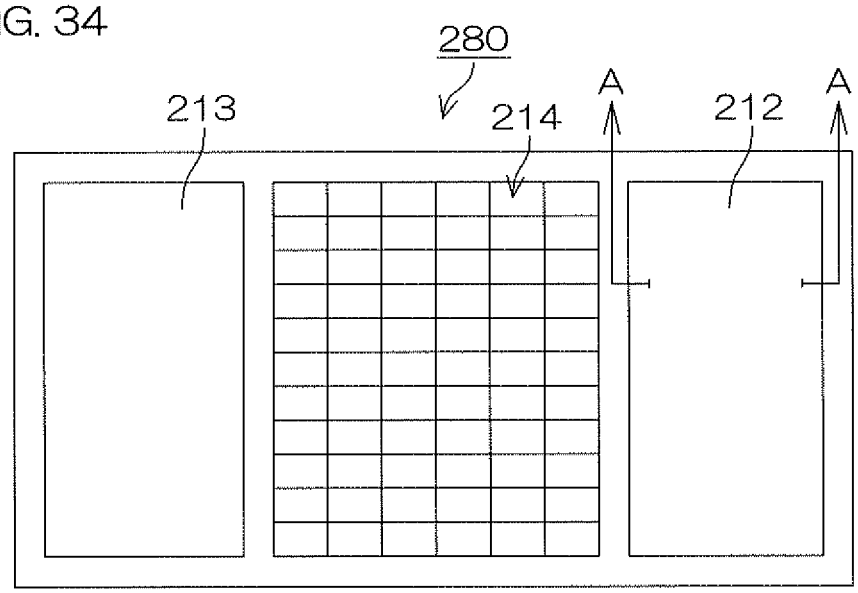
FIG. 34 is a plan view of a chip resistor 280 according to still another embodiment of the second invention.
Figure 35:
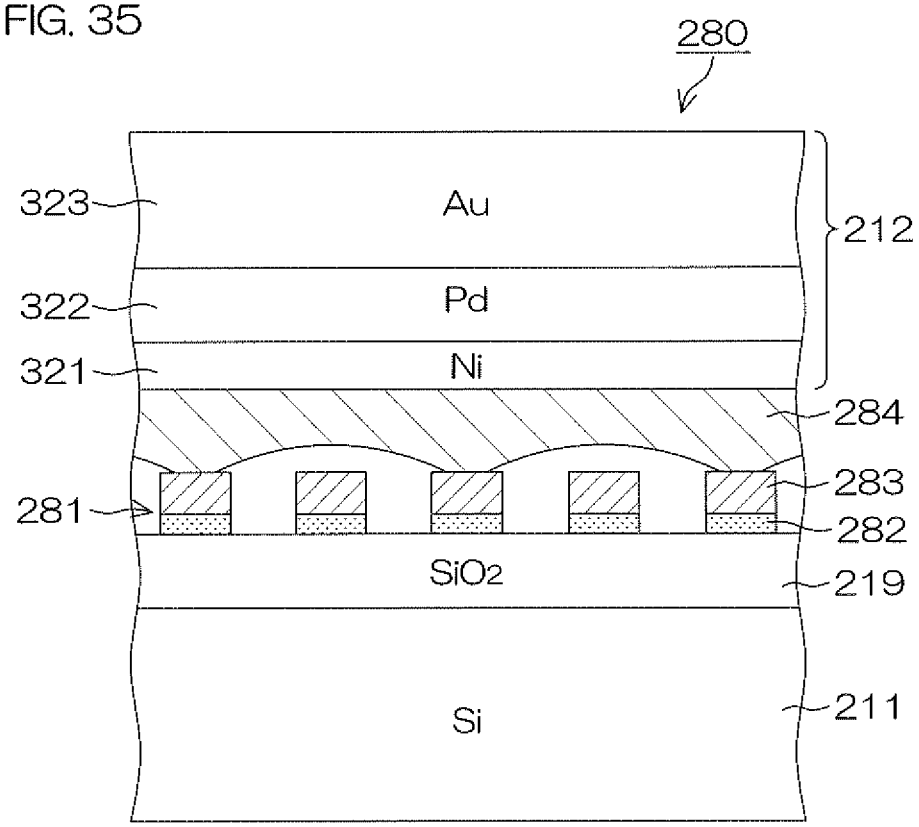
FIG. 35 is a cross-sectional view pictorially showing a cross-sectional structure along line A-A of FIG. 34.

FIG. 34 is a plan view of a chip resistor 280 according to still another embodiment of the present invention, and FIG. 35 is a cross-sectional view pictorially showing a cross-sectional structure along line A-A of FIG. 34. A feature of the chip resistor 280 is that a resistive circuit 281 is formed under the first and second connection electrodes 212 and 213 in order to raise the resistance value. In the chip resistor 280, the first connection electrode 212 and the second connection electrode 213 that serve as a pair of external connection electrodes are indispensable. With regard to the arrangement area to dispose these external connection electrodes 212 and 213, about ½ of the total area is used for the external electrode arrangement when the chip resistor 280 is viewed planarly.

Therefore, the present embodiment has a structure in which a resistive circuit 281 is disposed under the first and second connection electrodes 212 and 213, in addition to the original arrangement region of the resistor network 214 between the first connection electrode 212 and the second connection electrode 213. With reference to FIG. 35, the resistive circuit 281 disposed under the first connection electrode 212 includes a resistive element film 282 disposed on an insulating layer ($SiO_2$) 219 formed on the silicon substrate 211 in the same way as the resistive circuit included in the resistor network 214. Likewise, in the present embodiment, the resistive element film 282 is made of TiN or TiON or TiSiON. The resistive element film 282 extends in the direction perpendicular to the drawing sheet, and a conductor film piece 283 is laid thereon intermittently. The conductor film piece 283 is an aluminum film.

Furthermore, an aluminum film 284 for connection is disposed thereon in order to electrically connect the resistive circuit 281 to the first connection electrode 212. In the drawing, the aluminum film 284 is connected only to the specific conductor film piece 283 disposed intermittently on the resistive element film 282 formed to extend in the direction perpendicular to the drawing sheet, and therefore the resistance value of the resistive circuit 281 can be set at a desired value.

The first connection electrode 212 is laid on the aluminum film 284. The first connection electrode 212 includes a diffusion preventing layer 321 made of Ni, a palladium (Pd) layer 322 laid on the Ni layer 321 in order to excellently bond gold with nickel, and a pad layer 323 made of gold (Au) that is laid on the Pd layer 322. The chip resistor 280 has the resistive circuit 281 disposed under the first and second connection electrodes 212 and 213, i.e., under the external connection electrodes. The chip resistor 280 has an arrangement in which a resistive circuit is provided on the entire surface of the device-forming region of the upper surface of the substrate 211. Therefore, many resistive circuits can be disposed, and an increase in resistivity can be achieved.

An increase in resistivity can be achieved by providing a resistive circuit under at least one of the external connection electrodes 212 and 213. The second invention can also make the chip resistor whose resistivity has been increased as described above into an even more resistive chip resistor achieved by an appropriate combination of arrangements for an increase in resistivity.

Figure 36:
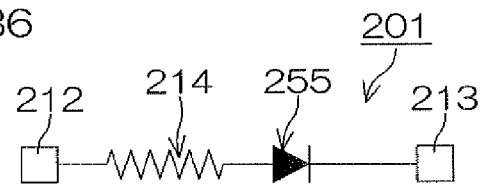
FIG. 36 is a circuit diagram of a discrete component 21 according to one embodiment of the second invention.

FIG. 36 is a view showing a circuit configuration of a discrete component 201 in which another circuit is incorporated in the aforementioned chip resistor.

The discrete component 201 is made, for example, by connecting a diode 255 and the resistive circuit 214 together in series. This discrete component 201 serves as a chip-type discrete component including the diode 255. The present invention is applicable to a discrete component having the resistive circuit 214 without being limited to the chip type taken as an example.

REFERENCE SIGNS LIST 10, 30, 90, 100 Chip resistor; 11 Substrate; 12 First connection electrode (External connection electrode); 13 Second connection electrode (External connection electrode); 14 Resistor network; 20, 103 Resistive element film (Resistive element film line); 21 Conductor film (Wiring film); 101 Trench; 102 Insulating film; R, R" Unit resistive element; F Fuse film; C Connection conductor film

The invention claimed is:

1. A chip resistor comprising:
   a substrate having a circuit forming surface;
   a first connection electrode and a second connection electrode that are formed on the substrate; and
   a resistor network that is formed on the substrate and that has ends one of which is connected to the first connection electrode and an opposite one of which is connected to the second connection electrode;
   wherein a trench is dug down to a predetermined depth from the circuit forming surface of the substrate and is formed at the circuit forming surface, and
   wherein the resistor network includes a resistive circuit that has a resistive element film disposed along an inner wall surface of the trench in such a manner as to traverse the trench, and
   wherein the substrate is free of doped impurities that form a transistor.

2. The chip resistor according to claim 1, wherein the resistor network includes a plurality of resistive circuits, and further includes a fuse film
   that is fusible at a position to electrically connect an arbitrary resistive circuit and the resistor network so that the arbitrary resistive circuit is electrically connected to the resistor network, or
   that is fusible at a position to be electrically disconnected from the resistor network while being connected to the arbitrary resistive circuit such that the arbitrary resistive circuit is separated from the resistor network.

3. The chip resistor according to claim 2, wherein the resistive element film includes a line-shaped resistive element film line that has a constant width and that extends linearly.

4. The chip resistor according to claim 3, wherein the trench extends in a predetermined direction when the circuit forming surface is viewed planarly, and the resistive element film includes a plurality of resistive element film lines arrayed in parallel, that are disposed along the inner wall surface of the trench in such a manner so as to traverse the trench and that extend in a direction perpendicular to a length direction in which the trench extends.

5. The chip resistor according to claim 3, wherein the resistive element film extends from the inner wall surface of the trench to the circuit forming surface outside the trench and the chip resistor further comprises a wiring film that is formed contiguously with a part of the resistive element film formed at the circuit forming surface.

6. The chip resistor according to claim 2, wherein the resistive element film extends from the inner wall surface of the trench to the circuit forming surface outside the trench and the chip resistor further comprises a wiring film that is formed contiguously with a part of the resistive element film formed at the circuit forming surface.

7. The chip resistor according to claim 2, wherein the resistive element film is made of TiN, TiON or TiSiON.

8. The chip resistor according to claim 1, wherein the resistive element film includes a line-shaped resistive element film line that has a constant width and that extends linearly.

9. The chip resistor according to claim 8, wherein the trench extends in a predetermined direction when the circuit forming surface is viewed planarly, and the resistive element film includes a plurality of resistive element film lines arrayed in parallel, that are disposed along the inner wall surface of the trench in such a manner so as to traverse the trench and that extend in a direction perpendicular to a length direction in which the trench extends.

10. The chip resistor according to claim 9, wherein the resistive element film is made of TiN, TiON or TiSiON.

11. The chip resistor according to claim 8, wherein the resistive element film extends from the inner wall surface of the trench to the circuit forming surface outside the trench and the chip resistor further comprises a wiring film that is formed contiguously with a part of the resistive element film formed at the circuit forming surface.

12. The chip resistor according to claim 8, wherein the resistive element film is made of TiN, TiON or TiSiON.

13. The chip resistor according to claim 1, wherein the resistive element film extends from the inner wall surface of the trench to the circuit forming surface outside the trench and the chip resistor further comprises a wiring film that is formed contiguously with a part of the resistive element film formed at the circuit forming surface.

14. The chip resistor according to claim 13, wherein the resistive element film is made of TiN, TiON or TiSiON.

15. The chip resistor according to claim 1, wherein the resistive element film is made of TiN, TiON or TiSiON.

16. The chip resistor according to claim 1, wherein the resistive element film is line-shaped and made of TiN, TION or TiSiON.

* * * * *